(12) United States Patent
Ozawa et al.

(10) Patent No.: US 7,535,957 B2
(45) Date of Patent: May 19, 2009

(54) TRANSMITTER CIRCUIT, RECEIVER CIRCUIT, CLOCK DATA RECOVERY PHASE LOCKED LOOP CIRCUIT, DATA TRANSFER METHOD AND DATA TRANSFER SYSTEM

(75) Inventors: Seiichi Ozawa, Tokyo (JP); Jun-ichi Okamura, Tokyo (JP); Yohei Ishizone, Tokyo (JP); Satoshi Miura, Tokyo (JP)

(73) Assignee: Thine Electronics, Inc., Tokyo (JP)

( * ) Notice: Subject to any disclaimer, the term of this patent is extended or adjusted under 35 U.S.C. 154(b) by 599 days.

(21) Appl. No.: 11/104,586

(22) Filed: Apr. 13, 2005

(65) Prior Publication Data

US 2005/0286643 A1 Dec. 29, 2005

(30) Foreign Application Priority Data

| Apr. 16, 2004 | (JP) | ............................. 2004-122244 |
| Oct. 18, 2004 | (JP) | ............................. 2004-303086 |
| Mar. 1, 2005 | (JP) | ............................. 2005-056719 |

(51) Int. Cl.
*H03K 7/08* (2006.01)

(52) U.S. Cl. ...................... 375/238; 375/239; 348/530; 348/536; 348/569

(58) Field of Classification Search ................ 348/530, 348/536, 569; 345/211, 213; 315/370; 375/239, 375/238

See application file for complete search history.

(56) References Cited

U.S. PATENT DOCUMENTS

| 4,675,734 A | * | 6/1987 | Widom | ........................ 348/530 |
|---|---|---|---|---|
| 5,521,468 A | * | 5/1996 | Gioiosa | ........................ 315/370 |
| 5,825,824 A | | 10/1998 | Lee et al. | |
| 5,828,326 A | | 10/1998 | Kikuchi | |
| 5,963,194 A | | 10/1999 | Umeda et al. | |
| 6,014,129 A | | 1/2000 | Umeda et al. | |
| 6,069,927 A | | 5/2000 | Kikuchi | |
| 6,300,982 B1 | * | 10/2001 | Koh | ........................... 348/569 |
| 6,452,591 B1 | * | 9/2002 | Ho et al. | ..................... 345/213 |
| 6,559,892 B1 | * | 5/2003 | Kikuchi | ..................... 348/536 |
| 6,864,734 B2 | | 3/2005 | Okamura | |
| 2003/0043141 A1 | * | 3/2003 | Bae et al. | ..................... 345/211 |

FOREIGN PATENT DOCUMENTS

| JP | 08-022364 | 1/1996 |
| JP | 9-168147 | 6/1997 |
| JP | 11-511926 | 10/1999 |
| WO | WO 97/42731 A1 | 11/1997 |
| WO | WO 02/065690 A1 | 8/2002 |

\* cited by examiner

*Primary Examiner*—Sudhanshu C Pathak
(74) *Attorney, Agent, or Firm*—Harrity & Harrity, LLP

(57) ABSTRACT

[Problems] To realize a reliable and stable transfer of digital data that does not require a reference clock and a handshake operation.

[Means for Solving the Problem] The present invention provides a digital data transfer method for alternately and periodically transferring first information and second information respectively in a first period and in a second period, wherein: an amount of information of the first information per unit time in the first period is greater than an amount of information of the second information per unit time in the second period; and the second information in the first period is transferred as pulse-width-modulated serial data.

30 Claims, 70 Drawing Sheets

Fig.15
(A) 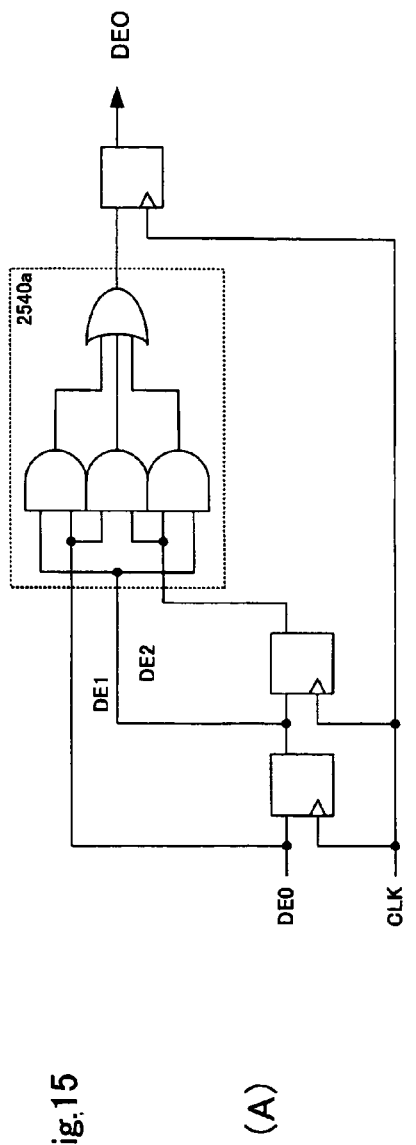
(B) 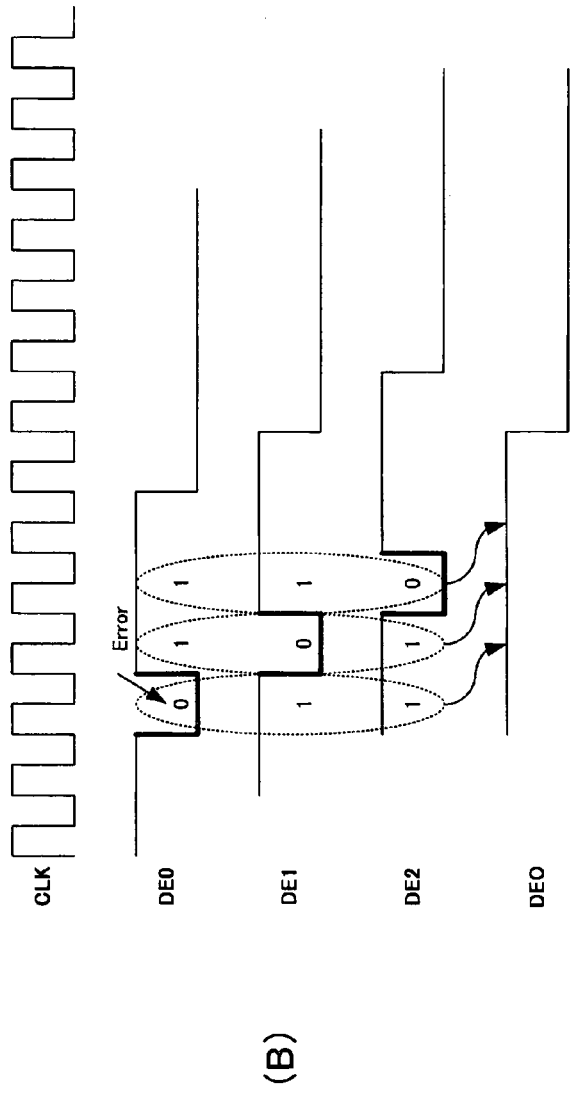

Fig. 26
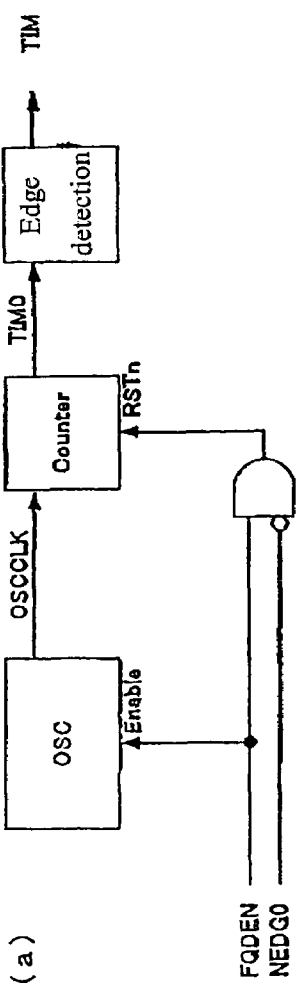
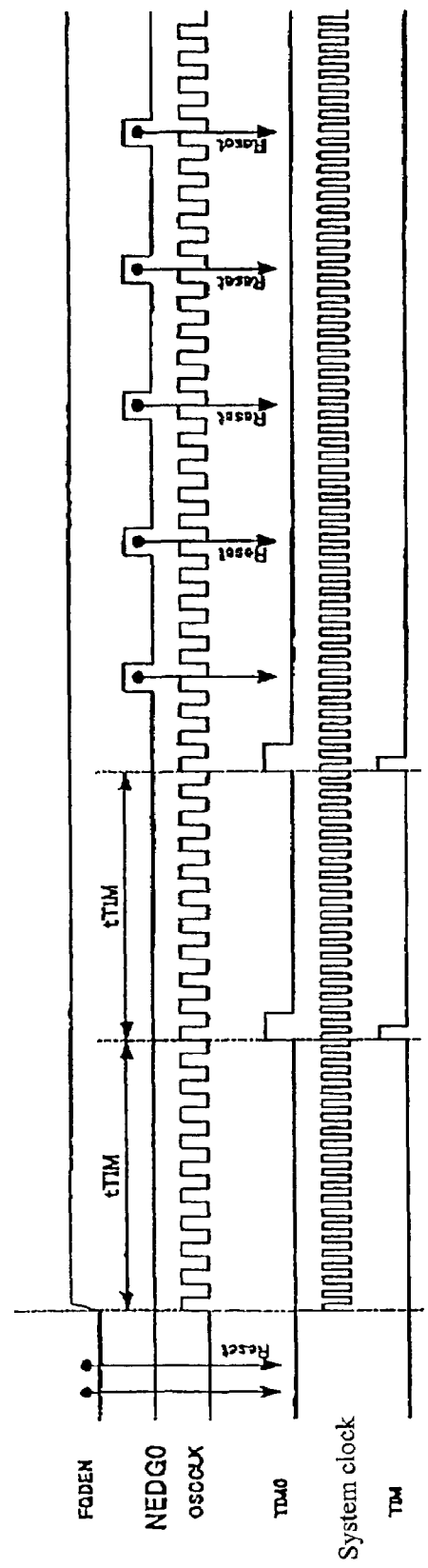

TRANSMITTER CIRCUIT, RECEIVER CIRCUIT, CLOCK DATA RECOVERY PHASE LOCKED LOOP CIRCUIT, DATA TRANSFER METHOD AND DATA TRANSFER SYSTEM

CORRESPONDING RELATED APPLICATIONS

This application is related to the following Japanese applications:
JP 2004-303086, filed Oct. 18, 2004
JP 2004-122244, filed Apr. 16, 2004
JP 2005-056719, filed Mar. 1, 2005
The present application claims the benefit of and priority to these three applications, all of which are incorporated by reference herein in their entirety.

TECHNICAL FIELD

The present invention relates to a transmitter circuit and a receiver circuit for transferring parallel digital data while serializing the digital data, an encoder circuit for use in a transmitter circuit, and a data transfer method and a data transfer system using the same.

The present invention also relates to a receiver circuit used in a serial data transfer system in which parallel digital data is transferred while being serialized, and more particularly to a clock data recovery phase locked loop circuit (also referred to as a CDRPLL circuit or a clock extraction circuit) in a receiver unit used in a serial data transfer system.

BACKGROUND ART

In recent years, for the transfer of digital data between devices, there has been an increasing demand for serial transfer at higher speeds. Serial transfer of digital data has advantages over parallel transfer of digital data, such as the ability to reduce wires between devices as much as possible, thus allowing for a reduction in size of the wiring cables and connectors, and the ability to reduce crosstalk, or the like, due to interference between wires.

Typically, in serial transfer of digital data, the transmitter unit side converts input parallel digital data to serial digital data and transmits the converted data to the receiver unit. The receiver unit recovers parallel digital data from the received serial digital data.

Referring to FIG. 65, FIG. 65 shows a system configuration of a serial data transfer system in which parallel digital data is serialized and transferred. With any of (1) electrical/DC coupling, (2) electrical/AC coupling and (3) optical coupling, parallel data input to a transmitter unit is encoded by an encoder in a predetermined scheme, converted to serial data by a serializer, amplified, and then transferred. The serial data received by the receiver unit is amplified, converted to parallel data by a CDRPLL circuit, and then decoded by a decoder. DC coupling is advantageous in that it is easy and it is possible to transfer low frequency components including DC components, whereas AC coupling is advantageous in that the transmitter side and the receiver side can be isolated DC-wise from each other. Optical communications systems are advantageous in that they allow for high-speed, long-distance transfer.

In any of these cases, the transmitter unit side and the receiver unit side each perform a recovery operation while individually achieving synchronism. If the degree of synchronism falls out of a certain range, it is no longer possible to recover accurate digital data. Therefore, if synchronism is lost, it is necessary to readjust synchronism. Patent Document 1 describes a clock data recovery circuit as follows. If synchronism is lost, the clock data recovery circuit sends a request signal to transmit a reference clock in a common mode to the transmitter side. As the requested reference clock is received, the clock data recovery circuit in the receiver side switches the mode of operation from a phase comparison mode to a frequency comparison mode and readjusts synchronism.

In an active matrix liquid crystal display or a plasma display, digital data is serially transferred (see, for example, Patent Document 1). The conventional serial transfer operation will now be described with reference to FIG. 66 and FIG. 67.

Image data used in an active matrix liquid crystal display includes RGB color data Rx, Gx and Bx, and synchronization data including DE (DATA ENABLE), Hsync (horizontal synchronization data) and Vsync (vertical synchronization data), as shown in FIG. 66. The source of the image data outputs color data during active periods and synchronization data during blanking periods. Note that Hsync and Vsync stay unchanged at "high" during active periods, i.e., while DE="Hi".

FIG. 67 shows an outline of a method for encoding m-bit image data into n-bit data in a digital data serial transfer technique disclosed in Patent Document 2. In this conventional encoding method, m-bit image data is encoded differently in a case where synchronization data is not transmitted (FIG. 67(A)) and in a case where synchronization data is transmitted (FIG. 67(B)).

With the conventional encoding method, in a case where synchronization data is not transmitted (FIG. 67(A)), m-bit image data of each pixel is converted (encoded) into n-bit serial image data in which the same logical bit does not repeat consecutively over k times, and the obtained data is transmitted while being time-division-multiplexed. In a case where synchronization data is transmitted (FIG. 67(B)), m-bit image data of each pixel is time-division-multiplexed and converted to serial image data by adding an (n-m)-bit serial code including an identification bit string in which the same logical bit repeats consecutively k times, and the obtained data is transmitted while being time-division-multiplexed. Herein, m, n and k satisfy the relationship m<n and k<(n-m). In this way, input parallel image data and synchronization data can be transmitted/received over a single channel without interrupting the transmission/reception operation.

[Patent Document 1] U.S. Pat. No. 6,069,927
[Patent Document 2] Japanese Laid-Open Patent Publication No. H9-168147

DISCLOSURE OF THE INVENTION

[Problems to be Solved by the Invention]

However, with the method of Patent Document 1, the receiver unit side requires a common mode driver and the transmitter side requires a common mode voltage detection circuit, thus resulting in problems such as the quality of the channel being lowered by the parasitic capacitance, noise, etc., occurring due to these additional circuits. If this method is applied to optical communications, since it requires full-duplex communications, it is necessary to use two optical fibers or to transfer data in WDM (wavelength division multiplexing) transfer, thus increasing the cost in either case.

Moreover, with conventional systems as described above, it is necessary to perform a handshake operation using a training signal and an acknowledge signal between the transmitter unit and the receiver unit. Furthermore, with the conventional systems, clock frequencies that can be recovered by the CDR on the receiver unit side are generally limited within a predetermined narrow frequency range. This is because the clock extraction circuit of the receiver unit uses a clock signal received from an internal quartz oscillator or an external oscillator as a reference clock, and the clock extraction circuit can only extract the clock in a frequency range near the reference clock. Therefore, if the transfer rate for serial data from the transmitter unit side changes, the receiver side cannot extract the clock, thus failing to recover data.

With the encoding method described in Patent Document 2, it is not possible to sufficiently reduce the occurrence of errors in the recovery (extraction) of the clock when converting serial data to parallel data, as will be described below.

If there are a plurality of rising edges within one symbol of serial data, the clock may not be recovered to the original state when data is deserialized on the receiver unit side. Herein, the term "one symbol" refers to a block of serial data delimited by rising edges or falling edges having the same period as that of input data or a period that is an integer multiple of that of input data.

The clock recovery operation will now be described. FIG. 1 is a timing chart showing how the clock is recovered on the receiver unit side from serial data A in which one symbol includes data A1, A2, A3, ... (FIG. 1(A)), and serial data B in which one symbol includes data B1 (FIG. 1(B)). In the serial data A shown in FIG. 1(A), there are a plurality of rising edges and falling edges within one symbol. In the serial data B shown in FIG. 1(B), there is only one rising edge and only one falling edge within one symbol.

Where the point in time based on which synchronism is achieved for recovering the clock from the serial data A is set to be a point A1, i.e., the rising edge of the data, the circuit may fail to achieve synchronism for clock recovery at the point A1 due to waveform degradation of the data, jitter, etc. If it fails to achieve synchronism for clock recovery at the point A1, synchronism for clock recovery may be achieved at other unintended points such as a point A2 or A3, being rising edges, in which case the clock cannot be recovered normally. This may occur because there are a plurality of rising edges within one symbol as in the serial data A.

This will now be described in greater detail with reference to FIG. 2(A) and FIG. 2(B). FIG. 2(A) shows serial data C including digital data C1 to C6. FIG. 2(B) shows serial data D including digital data D1 and D2 and having a different data structure from that of the serial data C. It is assumed herein that the time scale is the same for both serial data.

With the digital data C1 to C6 of the serial data C and digital data D1 and D2 of the serial data D, a comparison between the pulse width of C3 and that of D1 shows that the pulse width of D1 is greater than that of C3. Thus, the number of rising edges and falling edges of the serial data C is greater than the number of rising edges of the serial data D.

Near a transition (near the rising edge or the falling edge) of the digital data C1 to C6 in the serial data C shown in FIG. 2(A), there is an increased possibility of sampling errors due to waveform degradation of the digital data, jitter, etc. On the other hand, the digital data D1 and D2 in the serial data D shown in FIG. 2(B) each have a relatively long data length, and the data retains the same bit value over a relatively long time, thereby significantly reducing the possibility of sampling errors. In other words, in order to reduce serial data sampling errors, it is preferred to use a data structure in which there are fewer rising edges in the digital data.

The present inventors presumed that with conventional serial transfer techniques as described above, if there are a plurality of rising edges within one symbol of serial data, a rising edge may be erroneously recognized as a symbol boundary, thus causing mis-synchronization, which has been an obstacle to the realization of a sufficient reduction in errors occurring in the clock recovery operation when converting serial data to parallel data.

[Means for Solving the Problems]

Where the clock is recovered from the serial data B in which there is only one rising edge within one symbol as shown in FIG. 1(B), if the point in time based on which synchronism is achieved for recovering the clock is set to be a point B1, the possibility of errors occurring in the clock recovery operation is reduced even if there is waveform degradation of the digital data, jitters, etc., since there is only one rising edge within one symbol.

In view of the above, it is an object of the present invention to provide a serial data transfer system capable of transferring serial data easily and at a high speed without requiring a reference clock on the receiver unit side and without requiring a handshake operation. It is also an object of the present invention to provide a serial data transfer system in which even if the serial data transfer rate changes on the transmitter unit side, the receiver unit side can follow the changes.

It is also an object of the present invention to provide a data transfer method in which synchronization data is pulse-width-modulated so that there is only one rising edge in serial data, thereby realizing reliable digital data transfer with reduced errors in the clock recovery operation, and to provide a transmitter circuit and a receiver circuit therefor, and a data transfer system.

It is also an object of the present invention to provide a clock data recovery phase locked loop circuit, applicable to any of the configurations shown in FIG. 65, not requiring a reference clock, which is required in the prior art in order to bring the frequency of a voltage-controlled oscillator circuit of a receiver unit within the capture range, and not requiring full-duplex communications.

The present invention provides a digital data transfer method for alternately and periodically transferring first information and second information respectively in a first period and in a second period, wherein an amount of information of the first information per unit time in the first period is greater than an amount of information of the second information per unit time in the second period; and the first information in the first period is transferred as serial data whose one symbol is n times a minimum pulse width, and the second information in the second period is transferred as pulse-width-modulated serial data.

The present invention also provides a transfer system for serially transferring, in an alternate and periodic manner, first information and second information respectively in a first period and in a second period, the system including: a second encoder for encoding the second information so that one symbol of serial data obtained by successively serializing the second information will be a pulse-width-modulated signal whose period is n times a minimum pulse width of serial data obtained by serializing the first information; a first encoder for encoding the first information so that one symbol of serial data obtained by successively serializing the first information will have a difference from the pulse-width-modulated signal; a serializer circuit for converting the encoded first information to the one symbol of serial data, converting the encoded second information to serial data being the one symbol of the pulse-width-modulated signal, and alternately and periodically serializing one-symbol serial data of the first information and one-symbol serial data of the second information; a channel for transferring the serialized data; a clock extraction circuit for extracting, from the serial data of the first information or the serial data of the second information transferred over the channel, a reference clock in these serial data; an information identifying circuit for identifying the serial data of the first information and the serial data of the second information from each other based on the difference between the serial data of the first information and the serial data of the second information; a first decoder for decoding the separated serial data of the first information into the first information in a manner corresponding to that of the first encoder; and a second decoder for decoding the separated serial data of the second information into the second information in a manner corresponding to that of the second encoder, wherein an amount of information of the first information per unit time transferred in the first period is greater than an amount of information of the second information per unit time transferred in the second period.

The present invention also provides a transfer system for serially transferring, in an alternate and periodic manner, first information and second information respectively in a first period and in a second period, the system including: a second encoder for encoding the second information so that one symbol of serial data obtained by successively serializing the second information will be a pulse-width-modulated signal whose period is n times a minimum pulse width of serial data obtained by serializing the first information; a first encoder for encoding the first information so that one symbol of serial data obtained by successively serializing the first information will have a difference from the pulse-width-modulated signal; a serializer circuit for converting the encoded first information to the one symbol of serial digital data, converting the encoded second information to serial data being the one symbol of the pulse-width-modulated signal, and alternately and periodically serializing one-symbol serial data of the first information and one-symbol serial data of the second information; a channel for transferring the serialized data; and a clock extraction circuit for extracting, from the serial data of the first information or the serial data of the second information transferred over the channel, a reference clock in these serial data, the clock extraction circuit including: a phase comparison loop including a voltage control circuit, a phase comparison circuit for comparing a phase of the serial data and that of an output of a voltage-controlled oscillator circuit, and a loop filter for producing a control voltage of the voltage control circuit; a sampling circuit for sampling the serial data with a multiphase clock produced by the voltage-controlled oscillator circuit; a frequency control circuit for comparing a frequency of the one symbol of serial data with an oscillation frequency of the voltage-controlled oscillator circuit to match the oscillation frequency of the voltage-controlled oscillator circuit with the frequency of the one symbol of serial data, the frequency control circuit including an edge count determination circuit for determining the number of rising edges in a serial signal within a period of the one symbol produced by the voltage-controlled oscillator circuit to be zero, one, or a different number and a timer for outputting a timer signal at a predetermined time interval, the timer being reset when the number of rising edges is zero or when the frequency control circuit is disabled, wherein the frequency control circuit decreases the oscillation frequency of the voltage-controlled oscillator circuit if the number of rising edges is zero and increases the frequency of the voltage-controlled oscillator circuit if the timer signal is output from the timer; a charge pump for receiving an output of the frequency control circuit and outputting a current pulse to the loop filter; a clock extraction circuit including a mode switching circuit for enabling the frequency control circuit while disabling the phase comparison circuit when a frequency comparison mode request signal is input from the phase comparison circuit, and for, when it is detected that a situation where the number of rising edges or falling edges is one has occurred a predetermined number of consecutive times or more, determining that the output frequency of the voltage-controlled oscillator circuit is in a capture range of the phase comparison loop, thereby disabling the frequency control circuit while enabling the phase comparison circuit; an information identifying circuit for identifying the serial data of the first information and the serial data of the second information from each other based on the difference between the serial data of the first information and the serial data of the second information; a first decoder for decoding the separated serial data of the first information into the first information in a manner corresponding to that of the first encoder; and a second decoder for decoding the separated serial data of the second information into the second information in a manner corresponding to that of the second encoder.

The present invention also provides a transmitter circuit for alternately and periodically transferring first information and second information respectively in a first period and in a second period, including: a second encoder for encoding the second information so that one symbol of serial data obtained by successively serializing the second information will be a pulse-width-modulated signal whose period is n times a minimum pulse width of serial data obtained by serializing the first information; a first encoder for encoding the first information so that one symbol of serial data obtained by successively serializing the first information will have a difference from the pulse-width-modulated signal; and a serializer circuit for converting the encoded first information to the one symbol of serial data and converting the encoded second information to serial data being the one symbol of the pulse-width-modulated signal.

In one embodiment of the present invention, the first encoder performs the encoding operation so that there are two or more rising edges within the one symbol of serial data; and the second encoder performs the encoding operation so that there is only one rising edge within the one symbol of serial data at a specified position from a beginning of the one symbol.

In one embodiment of the present invention, the first encoder includes: a combined logic circuit having a plurality of input-output correlations, and a determination circuit for evaluating at least the input first information and outputting a determination signal based on the evaluation, wherein the combined logic circuit performs an encoding operation with one of the correlations selected according to the determination signal, and adds an encode bit for identifying the selected correlation to the output.

In one embodiment of the present invention, the correlations include a first correlation and a second correlation. The first correlation is such that the input and the output are equal to each other, and the second correlation is such that the output is obtained by inverting every other 2-bit portion of the input.

In one embodiment of the present invention, the determination circuit outputs a determination signal to the combined logic circuit such that the second correlation is selected if the number of rising edges will be zero when the first information is subjected to a simple serial conversion.

In one embodiment of the present invention, if the number of rising edges will be one when the first information is subjected to a simple serial conversion and a start bit and a stop bit having different bit values are added respectively at the beginning and end of a conversion result, the determination circuit outputs a determination signal to the combined logic circuit such that the second correlation is selected.

In one embodiment of the present invention, the determination circuit outputs a determination signal to the combined logic circuit such that one of the plurality of correlations is selected for which the number of consecutive occurrences of the same bit value in the one symbol of encoded serial data is smaller than ½ the number of bits of the one symbol of serial data plus one.

In one embodiment of the present invention, the determination circuit outputs a determination signal to the combined logic circuit such that one of the plurality of correlations is selected for which a difference between a total number of occurrences of one data value in encoded data and a total number of occurrences of an opposite data value in the encoded data is minimized.

In one embodiment of the present invention, the determination circuit outputs a determination signal to the combined logic circuit such that one of the plurality of correlations is selected for which a total number of occurrences of opposite data values in the encoded data is minimized.

In one embodiment of the present invention, the determination circuit evaluates at least one of a main information transfer frequency, an amount of EMI, an SN ratio or an error rate of the one symbol of serial digital data and the pulse-width-modulated signal, and outputs a determination signal according to the evaluation.

In one embodiment of the present invention, a falling edge is used instead of the rising edge.

In one embodiment of the present invention, the second encoder encodes the second information so that when it is successively serialized, the same bit value occurs continuously in the period starting from the rising edge, as the start point, until the falling edge.

The present invention also provides a receiver circuit for receiving a serially-transferred signal, including: a clock extraction circuit for extracting, from serial data of the first information or serial data of the second information, a reference clock in these serial data; an information identifying circuit for identifying the serial data of the first information and the serial data of the second information from each other based on the difference between the serial data of the first information and the serial data of the second information; a first decoder for decoding the identified serial data of the first information into the first information in a manner corresponding to that of the first encoder; and a second decoder for decoding the separated serial data of the second information into the second information in a manner corresponding to that of the second encoder, wherein the receiver circuit receives a signal obtained by serially transferring, in an alternate and periodic manner, the serial data of the second information and the serial data of the first information, wherein the serial data of the second information is obtained by a serialization operation such that one symbol thereof is a pulse-width-modulated signal whose period is n times a minimum pulse width of one symbol of the serial data of the first information, and the serial data of the first information is obtained by a serialization operation such that one symbol thereof has a difference from the pulse-width-modulated signal.

In one embodiment of the present invention, the serial data of the first information includes an encode bit for identifying an encoding mode, and the first decoder performs a decoding operation according to the encode bit.

In one embodiment of the present invention, the information identifying circuit identifies the serial data of the first information and the serial data of the second information from each other based on the number of rising edges within one symbol of the serial data.

The present invention also provides a digital data transmitter circuit for converting first digital data and second digital data into one symbol of serial digital data and transmitting the one symbol of serial digital data to a receiver circuit, the digital data transmitter circuit including: an encoder for encoding the second digital data into digital data in which a value of an upper bit is always equal to or greater than a value of a lower bit so that there is only one rising edge within the one symbol; a switch circuit for selecting the first digital data or the encoded second digital data based on a selection signal; and a serializer circuit for converting an output signal of the switch circuit and the selection signal into a serial signal.

A digital data receiver circuit of the present invention includes: a deserializer circuit for deserializing first serial digital data into first digital data and a selection signal, and deserializing second serial digital data where there is only one rising edge within one symbol into second digital data and the selection signal; a decoder circuit for decoding the second digital data and outputting the decoded second digital data to a second switch circuit; a first switch circuit for selecting and outputting the first digital data based on the selection signal; and the second switch circuit for selecting and outputting the decoded second digital data based on the selection signal.

The present invention also provides a digital data transmitter circuit for converting first digital data and second digital data into one symbol of serial digital data and transmitting the one symbol of serial digital data to a receiver circuit, the digital data transmitter circuit including: a first encoder for DC-balancing the first digital data so that there are two or more rising edges within one symbol; a second encoder for encoding the second digital data into digital data in which a value of an upper bit is always equal to or greater than a value of a lower bit so that there is only one rising edge within one symbol; a switch circuit for selecting the DC-balanced first digital data or the encoded second digital data based on a selection signal; and a serializer circuit for serializing an output signal of the switch circuit.

A receiver circuit of the present invention includes: a deserializer circuit for deserializing first serial digital data in which there are two or more rising edges within one symbol into first digital data and deserializing second serial digital data in which there is only one rising edge within one symbol into second digital data; a first decoder circuit for decoding the first digital data and outputting the decoded first digital data to a first switch circuit; a decoder circuit for decoding the second digital data and outputting the decoded second digital data to a second switch circuit; a determination circuit for determining the number of rising edges of the first digital data and the second digital data and outputting different selection signals when the number of rising edges is one and when the number of rising edges is two or more; a first switch circuit for selecting and outputting the decoded first digital data based on the selection signal; and the second switch circuit for selecting and outputting the decoded second digital data based on the selection signal.

The present invention also provides a digital data transfer method for converting first digital data and second digital data, which are input as parallel data in a transmitter-side unit, into one symbol of serial digital data and transmitting the one symbol of serial digital data to a receiver-side unit, wherein in a first period, the first digital data and a selection signal are converted to first serial digital data and transmitted to the receiver-side unit; and in a second period, the second digital data is encoded so that a value of an upper bit is always equal to or greater than a value of a lower bit, as a result of which there is only one rising edge within one symbol, and the encoded data is converted into second serial digital data and transmitted to the receiver-side unit.

The present invention also provides a digital data transfer method for converting first digital data and second digital data, which are input as parallel data in a transmitter-side unit, into one symbol of serial digital data and transmitting the one symbol of serial digital data to a receiver-side unit, wherein in a first period, the first digital data is DC-balanced, and the DC-balanced first digital data is converted to first serial digital data and transmitted to the receiver-side unit; and in a second period, the second digital data is encoded so that a value of an upper bit is always equal to or greater than a value of a lower bit, as a result of which there is only one rising edge within one symbol, and the encoded data is converted into second serial digital data and transmitted to the receiver-side unit.

A data transfer system of the present invention is a digital data transfer system for converting first digital data and second digital data, which are input as parallel data in a transmitter-side unit, into one symbol of serial digital data and transmitting the one symbol of serial digital data to a receiver-side unit, the digital data transfer system including the transmitter-side unit and the receiver-side unit, the transmitter-side unit including: an encoder for encoding the second digital data into digital data in which a value of an upper bit is always equal to or greater than a value of a lower bit so that there is only one rising edge within the one symbol; a first switch circuit for selecting the first digital data or the encoded second digital data based on a selection signal; and a serializer circuit for serializing the first digital data and the selection signal of the output signal from the first switch circuit to produce first serial digital data while serializing the encoded second digital data and the selection signal of the output signal from the first switch circuit to produce second serial digital data, and the receiver-side unit including a digital data receiver circuit including: a deserializer circuit for deserializing the first serial digital data into the first digital data and the selection signal while deserializing the second serial digital data into the encoded second digital data and the selection signal; a decoder circuit for decoding the encoded second digital data and outputting the decoded data to a third switch circuit; a second switch circuit for selecting and outputting the first digital data based on the selection signal; and the third switch circuit for selecting the decoded second digital data based on the selection signal.

The present invention also provides a digital data transfer system for converting first digital data and second digital data, which are input as parallel data in a transmitter-side unit, into one symbol of serial digital data and transmitting the one symbol of serial digital data to a receiver-side unit, the digital data transfer system including the transmitter-side unit and the receiver-side unit, the transmitter-side unit including: a first encoder for DC-balancing the first digital data so that there are two or more rising edges within one symbol; a second encoder for encoding the second digital data into digital data in which a value of an upper bit is always equal to or greater than a value of a lower bit so that there is only one rising edge within one symbol; a first switch circuit for selecting the DC-balanced first digital data or the encoded second digital data based on a first selection signal; and a serializer circuit for serializing the DC-balanced first digital data of the output signal from the first switch circuit to produce first serial digital data while serializing the encoded second digital data of the output signal from the first switch circuit to produce second serial digital data, and the receiver-side unit including: a deserializer circuit for deserializing the first serial digital data into the DC-balanced first digital data while deserializing the second serial digital data into the encoded second digital data; a first decoder circuit for decoding the DC-balanced first digital data and outputting the decoded data to a second switch circuit; a decoder circuit for decoding the encoded second digital data and outputting the decoded data to a third switch circuit; a determination circuit for determining the number of rising edges of the DC-balanced first digital data and the decoded second digital data and outputting different second selection signals when the number of rising edges is one and when the number of rising edges is two or more; a second switch circuit for selecting and outputting the decoded first digital data based on the second selection signal; and the third switch circuit for selecting and outputting the decoded second digital data based on the second selection signal.

In one embodiment of the present invention, the present invention includes: a phase comparison loop including a voltage control circuit, a phase comparison circuit for comparing a phase of serial data and that of an output of a voltage-controlled oscillator circuit, and a loop filter for producing a control voltage of the voltage control circuit; a sampling circuit for sampling the serial data with a multiphase clock produced by the voltage-controlled oscillator circuit; a frequency control circuit for comparing a frequency of the serial data with an oscillation frequency of the voltage-controlled oscillator circuit to match the oscillation frequency of the voltage-controlled oscillator circuit with the frequency of the serial data, the frequency control circuit including an edge count determination circuit for determining the number of rising edges in a serial signal within a period of the one symbol produced by the voltage-controlled oscillator circuit to be zero, one or a different number and a timer for outputting a timer signal at a predetermined time interval, the timer being reset when the number of rising edges is zero or when the frequency control circuit is disabled, wherein the frequency control circuit decreases the oscillation frequency of the voltage-controlled oscillator circuit if the number of rising edges is zero and increases the frequency of the voltage-controlled oscillator circuit if the timer signal is output from the timer; a charge pump for receiving an output of the frequency control circuit and outputting a current pulse to the loop filter; and a mode switching circuit for enabling the frequency control circuit while disabling the phase comparison circuit when a frequency comparison mode request signal is input from the phase comparison circuit, and for, when it is detected that a situation where the number of rising edges is one has occurred a predetermined number of consecutive times or more, determining that the output frequency of the voltage-controlled oscillator circuit is in a capture range of the phase comparison loop, thereby disabling the frequency control circuit while enabling the phase comparison circuit.

In one embodiment of the present invention, the edge count determination circuit determines that the number of edges is zero based on a logical product between an output indicating that a result of counting the number of rising edges in the sampled signal is zero and an output indicating that there is no rising edge based on a result of direct determination from the serial data.

In one embodiment of the present invention, the frequency control circuit places a higher priority on decreasing the oscillation frequency of the voltage-controlled oscillator circuit than on increasing the oscillation frequency of the voltage-controlled oscillator circuit.

In one embodiment of the present invention, the charge pump is such that a total amount of charge to be charged when an up signal is received from the frequency control circuit is greater than a total amount of charge to be discharged when a down signal is received from the frequency control circuit.

In one preferred embodiment of the present invention, the charge pump is such that the number of charging pulses to be charged when an up signal is received from the frequency control circuit is greater than the number of discharge pulses to be discharged when a down signal is received from the frequency control circuit.

In one preferred embodiment of the present invention, the charge pump is such that a current of a charge pulse to be charged when an up signal is received from the frequency control circuit is greater than a current of a discharge pulse to be discharged when a down signal is received from the frequency control circuit.

The present invention also provides a clock extraction circuit for extracting a clock from a serially-transferred signal, wherein the serially-transferred signal is a signal obtained by serially transferring, in an alternate and periodic manner, one symbol of serial digital data obtained by encoding first information and a pulse-width-modulated signal, wherein the pulse-width-modulated signal is obtained by encoding second information so that the encoded data has a difference from the one symbol of serial digital data and by performing a pulse width modulation with a period that is n times a pulse width of digital data forming the one symbol of serial digital data so that there is only one rising edge or falling edge within the one symbol, with the rising edge or the falling edge being located at a specified position from a frame edge of the one symbol, wherein the clock is extracted based on a period of the rising edge or the falling edge within the one symbol.

A clock extraction circuit of the present invention includes: a voltage-controlled oscillator; a phase comparator for outputting a phase difference signal according to a phase difference between an input data string and an output signal from the voltage-controlled oscillator; a frequency comparator for outputting a frequency difference signal according to a frequency difference between the input data string and an output signal from the voltage-controlled oscillator; and a mode switching circuit for selecting the phase difference signal or the frequency difference signal, wherein the oscillation frequency of the voltage-controlled oscillator is controlled based on the phase difference signal or the frequency difference signal selected by the mode switching circuit.

In one embodiment of the present invention, the frequency difference comparator includes: an edge count determination circuit for determining that the number of input data edges is zero or one in one symbol period of the output signal from the voltage-controlled oscillator and outputting an edge count determination signal according to the determination result; a timer for outputting a timer signal at a predetermined time interval, the timer being reset when the number of edges is zero and the phase difference signal is selected; and a frequency control circuit for controlling an oscillation frequency of the voltage-controlled oscillator based on the edge count determination signal and the timer signal, wherein: the predetermined time interval of the timer is longer than a time interval at which the subordinate information is transferred; the frequency control circuit decreases the oscillation frequency of the voltage-controlled oscillator if the number of edges is zero, and increases the oscillation frequency of the voltage-controlled oscillator if the timer signal is output; and the mode switching circuit selects the phase difference signal if a determination result that the number of edges is one is obtained a predetermined number of consecutive times.

In one embodiment of the present invention, the clock extraction circuit of the present invention includes a sampler circuit for sampling input data and outputting sampled data, wherein: the edge count determination circuit includes an edge detection circuit for detecting a presence/absence of an edge in the input data string and outputting edge presence/absence information; and the edge count determination circuit determines the number of edges based on the sampled data and the edge presence/absence information.

A clock extraction circuit of the present invention includes a frequency comparison/fine adjustment circuit, wherein the frequency comparison/fine adjustment circuit calculates an amount of frequency shift between a frequency of an oscillation signal of the oscillator and a frequency based on a period of the rising edge within the one frame, according to an amount of change from one symbol to another of a position of the rising edge within one symbol, and outputting a control signal according to the amount of frequency shift to the voltage-controlled oscillator.

In one embodiment of the present invention, the frequency comparison/fine adjustment circuit includes an estimation circuit for estimating a start bit and a stop bit in the one symbol, and derives an amount of frequency shift between the frequency of the oscillation signal of the voltage-controlled oscillator and the frequency based on the period of the rising edge within one symbol, according to an amount of change from one symbol to another in the start bit and the stop bit, and outputting a control signal according to the amount of frequency shift to the voltage-controlled oscillator.

EFFECTS OF THE INVENTION

According to the present invention, the number of rising edges per one symbol of serial data is fixed to one during blanking periods, making it possible to reduce errors occurring due to waveform degradation when extracting the clock from the serial data, thus realizing stable data transfer.

With the digital data transfer system of the present invention, serial digital data can be transferred at a high speed from the transmitter unit to the receiver unit by means of a simple configuration using a pair of wires (including the use of an optical fiber). A superior advantage of the present invention is that it does not require a handshake operation using a training signal and an acknowledge signal between the transmitter unit and the receiver unit, which is performed in the prior art. Where an optical fiber is used in the prior art, it is difficult to perform a full-duplex communications operation, which is required in a handshake operation using a training signal and an acknowledge signal. Therefore, the present invention, which does not require a handshake operation, provides a significant advantage where an optical fiber is used as a wire.

With the digital data transfer system of the present invention, it is possible to transmit low-frequency data (e.g., sound data) during blanking periods (normally, Hsync, Vsync).

With the digital data transfer system of the present invention, the clock is embedded in serial digital data. As a result, it is not necessary to provide a clock input from a quartz oscillator or an external oscillator to the clock extraction circuit of the receiver unit, which means that even if the size of an image represented by serial digital data changes, the system can automatically follow the changes, and the system is in compliance with plug and play.

According to the present invention, the receiver unit does not require a reference clock and it is not necessary to transfer data in the reverse direction from the receiver side to the transmitter side, and so it is not necessary to provide a common mode driver on the receiver side and a common mode voltage detection circuit on the transmitter side. It is therefore possible to provide a clock data recovery phase locked loop circuit that eliminates increase in the transfer system cost and decrease in the channel quality.

BRIEF DESCRIPTION OF THE DRAWINGS

FIG. 15 is a circuit diagram and an operation diagram of a DE filter according to one embodiment of the present invention.

FIG. 26 is a hardware block diagram showing a circuit configuration of a timer, and a timing chart showing different signals.

DESCRIPTION OF REFERENCE NUMERALS

| | |
|---|---|
| 401 | Transmitter unit |
| 402 | Serializer circuit |
| 403 | Phase synchronization circuit |
| 404 | Encoder circuit |
| 405 | Switch circuit |
| 406 | Output buffer |
| 411 | Input color data |
| 412 | Input synchronization data |
| 414 | Input clock |
| 415 | Serial data |
| 421 | Receiver unit |
| 422 | Deserializer circuit |
| 423 | Clock extraction circuit |
| 424 | Decoder circuit |
| 425 | Switch circuit |
| 426 | Switch circuit |
| 427 | Input buffer |
| 431 | Output color data |
| 432 | Output synchronization data |
| 434 | Output clock |
| 2501 | Transmitter unit |
| 2502 | Serializer circuit |
| 2503 | Phase synchronization circuit |
| 2504 | Encoder circuit |
| 2505 | Switch circuit |
| 2506 | Output buffer |
| 2511 | Input color data |
| 2512 | Input synchronization data |
| 2514 | Input clock |
| 2515 | Serial data |
| 2521 | Receiver unit |
| 2522 | Deserializer circuit |
| 2523 | Clock extraction circuit |
| 2524 | Decoder circuit |
| 2525 | Switch circuit |
| 2526 | Switch circuit |
| 2527 | Input buffer |
| 2531 | Output color data |
| 2532 | Output synchronization data |
| 2534 | Output clock |
| 10 | Phase comparison circuit |
| 20 | Loop filter |
| 30 | Voltage-controlled oscillator |
| 40 | Sampler |
| 50 | Frequency comparison circuit |

-continued

| | |
|---|---|
| 51 | Edge count determination circuit |
| 52 | Frequency difference detection circuit |
| 53 | Timer |
| 60 | Charge pump |
| 70 | Control circuit |
| 200 | Receiver circuit (clock data recovery phase locked loop circuit) |
| 300 | Serial data |
| PLLCLK | PLL clock |
| SUBCLK | Subclock |
| DetCLK | Edge detection clock |
| NEDG0 | Number of rising edges 0 |
| NEDG1 | Number of rising edges 1 |
| FQDEN | Frequency comparison enable signal |
| PHDEN | Phase comparison enable signal |
| FQDRQ | Frequency comparison request signal |
| TIM | Signal indicating an amount of time equal to or greater than one line scan |
| CLK | System clock timer |

BEST MODE FOR CARRYING OUT THE INVENTION

Figure 1:
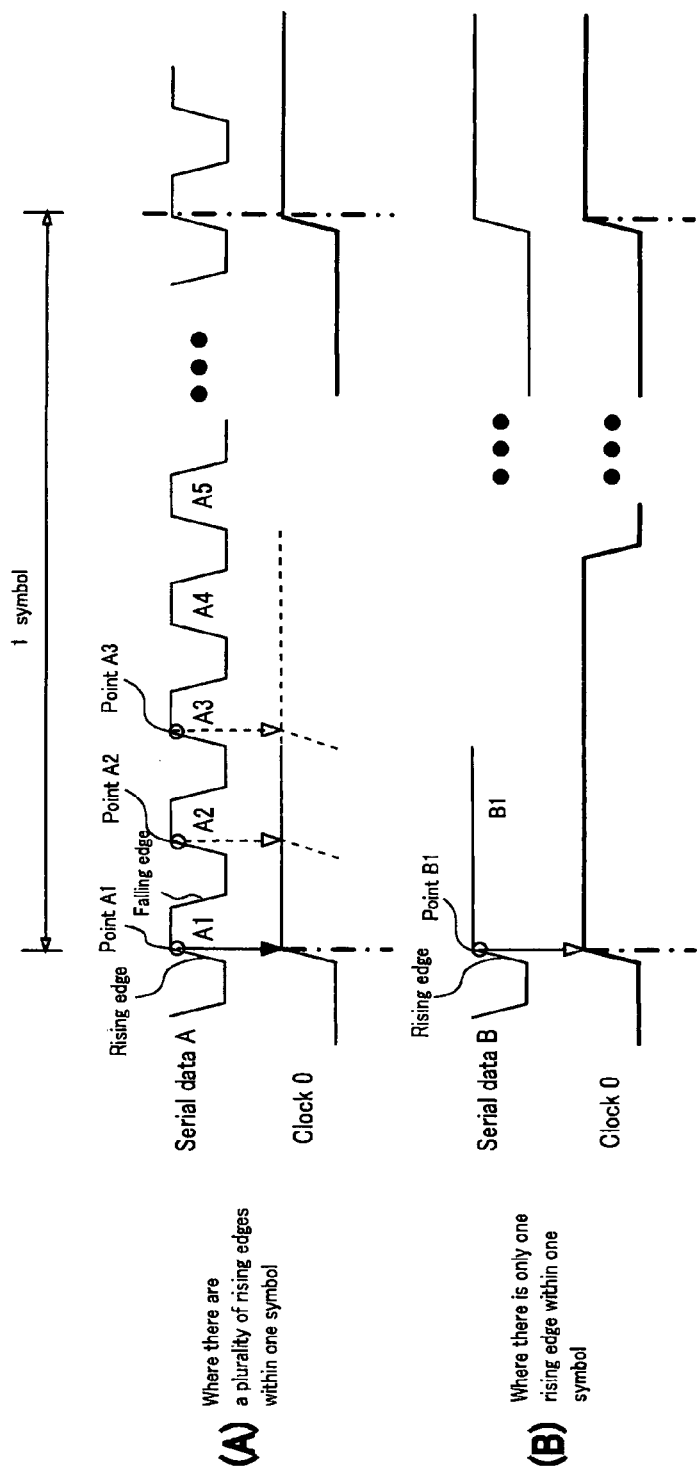
FIG. 1 is a diagram showing serial data where there are a plurality of rising edges within one symbol, and a diagram showing serial data where there is only one rising edge within one symbol.
Figure 2:
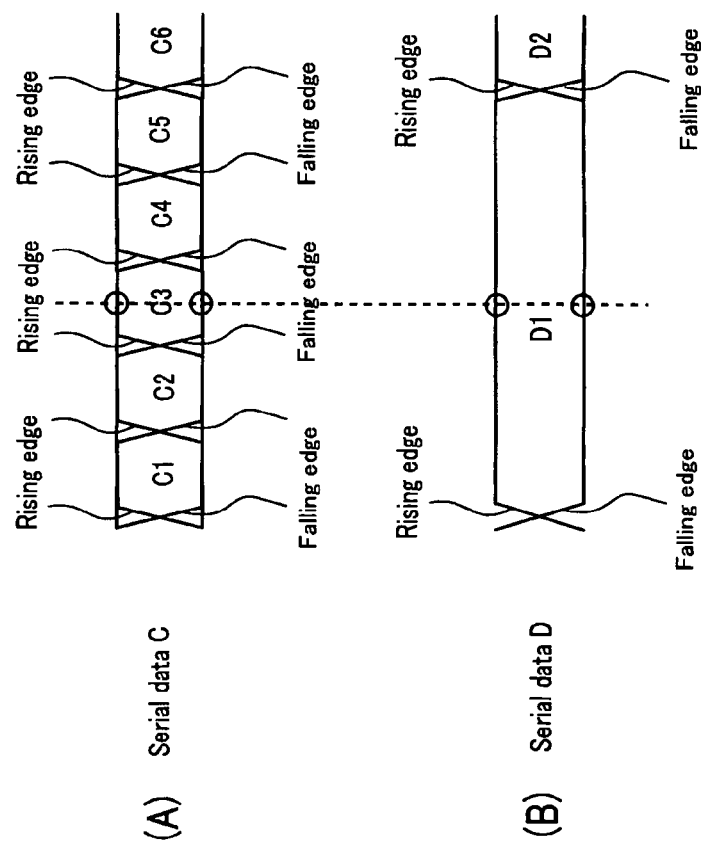
FIG. 2 is diagrams showing digital data of different data lengths.
Figure 3:
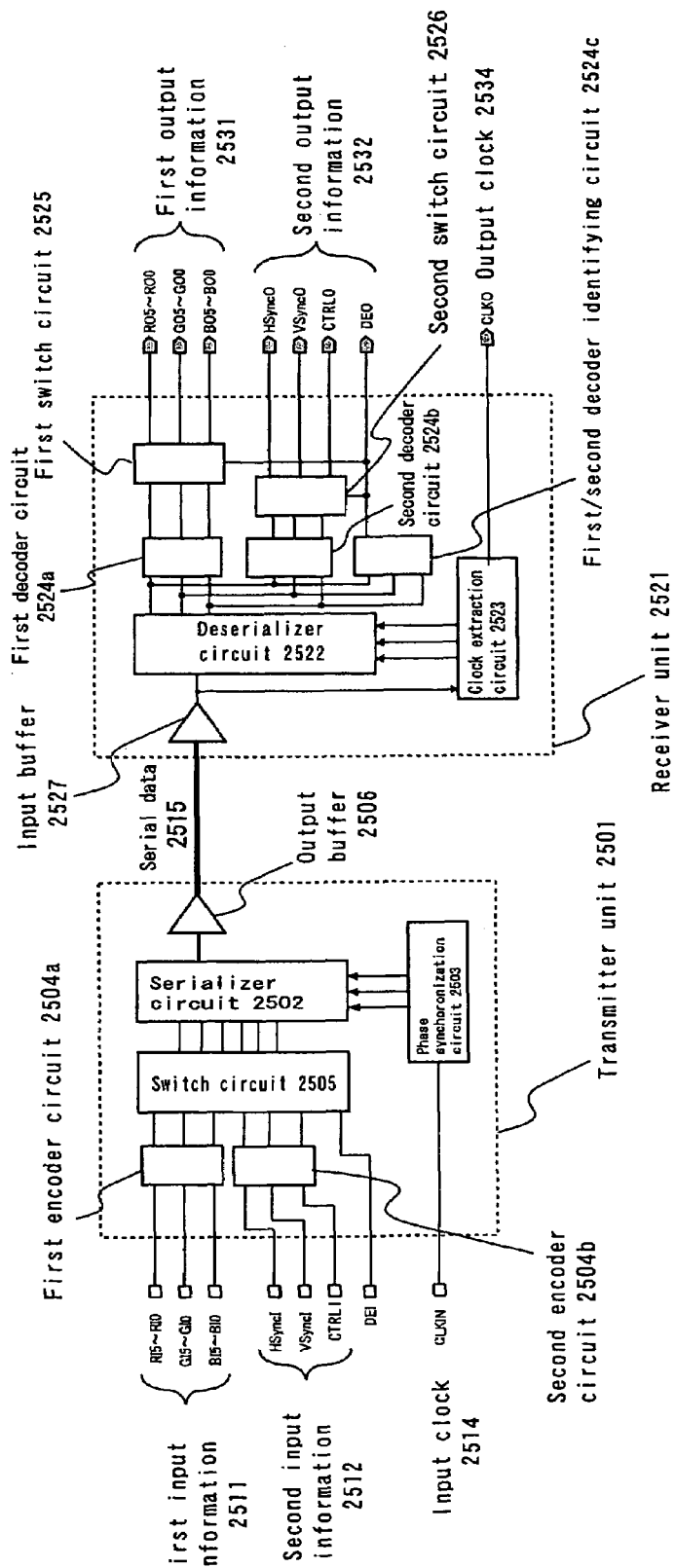
FIG. 3 is a diagram showing a digital data transmitter circuit and a receiver circuit according to one embodiment of the present invention, and the concept of a digital data transfer method and a digital data transfer system according to one embodiment of the present invention.

A best mode for carrying out the invention (hereinafter referred to as an "embodiment") will now be described with reference to the drawings. FIG. 3 shows a data transmitter circuit and a receiver circuit of the present embodiment, and a data transfer method and a data transfer system using the same. The transmitter circuit may be packaged in a transmitter LSI and the receiver circuit may be packaged in a receiver LSI.

A transmitter unit (transmitter circuit) 2501 transmits serial data 2515 to a receiver unit 2521, wherein the serial data 2515 is obtained by serializing together first input information 2511 (input color data (RI5 to RI0, GI5 to GI0, BI5 to BI0) in the present embodiment), second input information 2512 (input synchronization data (HsyncI (input horizontal synchronization data), VsyncI (input vertical synchronization data) and CTRLI (input control))), and a switching signal DEI (input selection signal (input data enable)) for switching between the first input information and the second input information. Information of an input clock 2514 is embedded in the serial data 2515.

The receiver unit (receiver circuit) 2521 receives the serial data 2515 transmitted from the transmitter unit 2501, deserializes the serial data 2515 to recover and output first output information 2531 (output color data (RO5 to RO0, GO5 to GO0, BO5 to BO0)), second output information 2532 (HsyncO (output horizontal synchronization data), VsyncO (output vertical synchronization data), CTRLO (output control) and DEO (output selection signal (output data enable))), and an output clock 2534.

The transmitter unit 2501 includes a serializer circuit 2502 (Serializer), a phase synchronization circuit 2503 (PLL circuit: Phase Locked Loop circuit), a first encoder circuit 2504a (Encoder 1), a second encoder circuit 2504b (Encoder 2), a switch circuit 2505 and an output buffer 2506 (Output Buffer).

The receiver unit 2521 includes a deserializer circuit 2522 (De-serializer), a clock extraction circuit (CDRPLL circuit: Clock Data Recovery Phase Locked Loop circuit) 2523, a first decoder circuit 2524a (Decoder 1), a second decoder circuit 2524b (Decoder 2), a first switch circuit 2525, a second switch circuit 2526 and an input buffer 2527 (Input Buffer). Note that the output buffer 2506 and the input buffer 2527 are optional. While the present embodiment is directed to an example where each of R, G and B data of the input color data, being the first input information 2511, is 6-bit data, the present invention is not limited to any particular number of RGB data bits and is applicable to 8-bit RGB data, 10-bit RGB data, or the like. In the receiver unit 2521, the first decoder circuit 2524a, the second decoder circuit 2524b, the first switch circuit 2525 and the second switch circuit 2526 cooperate with each other to perform the function of separating and producing the first output information 2531 and the second output information 2532. Therefore, these circuits may be referred to collectively as an information separation circuit. Note that the first input information 2511 corresponds to the second output information 2531, and the second input information 2512 to the second output information 2532.

In the transmitter unit 2501, the first input information 2511 and input synchronization data, being the second input information 2512, are input to, and encoded by, the first encoder circuit 2504a and the second encoder circuit 2504b, respectively. The switch circuit 2505 uses DEI as an input selection signal. If DEI is high, the switch circuit 2505 selects the first information 2511 encoded by the first encoder circuit 2504a, whereas if DEI is low, the switch circuit 2505 selects the second information 2512 encoded by the second encoder circuit 2504b, and the selected information is output to the serializer circuit 2502. The input clock 2514 is converted to a multiphase clock by the phase synchronization circuit 2503, and the serializer circuit 2502 uses the multiphase clock to serialize the output from the switch circuit 2505 to produce the serial data 2515, and outputs the produced serial data 2515 via the output buffer 2506.

The second encoder circuit 2504b of the transmitter unit 2501 encodes the second information (HSYNCI, VSYNCI and CTRLI). In this process, assuming that a signal that comes earlier in time within one symbol is MSB when data is successively serialized (simple serialization), the second encoder circuit 2504b encodes the information so that the value of MSB is less than or equal to that of LSB, and outputs the encoded data to the switch circuit 2505. In the second information period (blanking period (DEI="low") in the present embodiment), the output data from the second encoder circuit 2504b is selected by the switch circuit 2505 and serialized by the serializer circuit 2502 successively from MSB to LSB, and the serialized data is output. Therefore, where DEI is low, data serialized by the serializer circuit 2502 is such that a signal that comes earlier in time within one symbol has a higher level, so that a rising edge occurs only at symbol boundaries.

The first encoder circuit 2504a of the transmitter unit 2501 encodes the first input information 2511 in one of a plurality of modes (each mode corresponding to a different input-output correlation), and outputs the encoded data to the switch circuit 2505. In the first information period (active period (DEI="high") in the present embodiment), the output data from the first encoder circuit 2504a is selected by the switch circuit 2505 and serialized by the serializer circuit 2502 successively from MSB to LSB, and the serialized data is output. The encoding method used in the first encoder 2504a will be described later.

In the receiver unit 2521, the clock extraction circuit 2523 first recovers the output clock (CLKO) 2534 and the multiphase clock from the serial data 2515. Then, the deserializer circuit 2522 converts the serial data 2515 to a parallel signal by using the multiphase clock. The parallel signal is input to the first decoder circuit 2524a, the second decoder circuit 2524b and a first/second decoder identifying circuit 2524c, and is decoded. When DEI is high, the first switch circuit 2525 is active and outputs the output parallel data from the first decoder circuit 2524a as the first output information 2531 (output color data (RO5 to RO0, GO5 to GO0, BO5 to BO0)). When DEI is low, the first switch circuit 2525 outputs a low level. When DEI is low, the second switch circuit 2526 is active and outputs the output parallel data from the second decoder circuit 2524b as the second output information 2532 (output synchronization data). When DEI is high, the second switch circuit 2526 preferably retains its output. This is because synchronization data does not change while DE is high.

Figure 4:
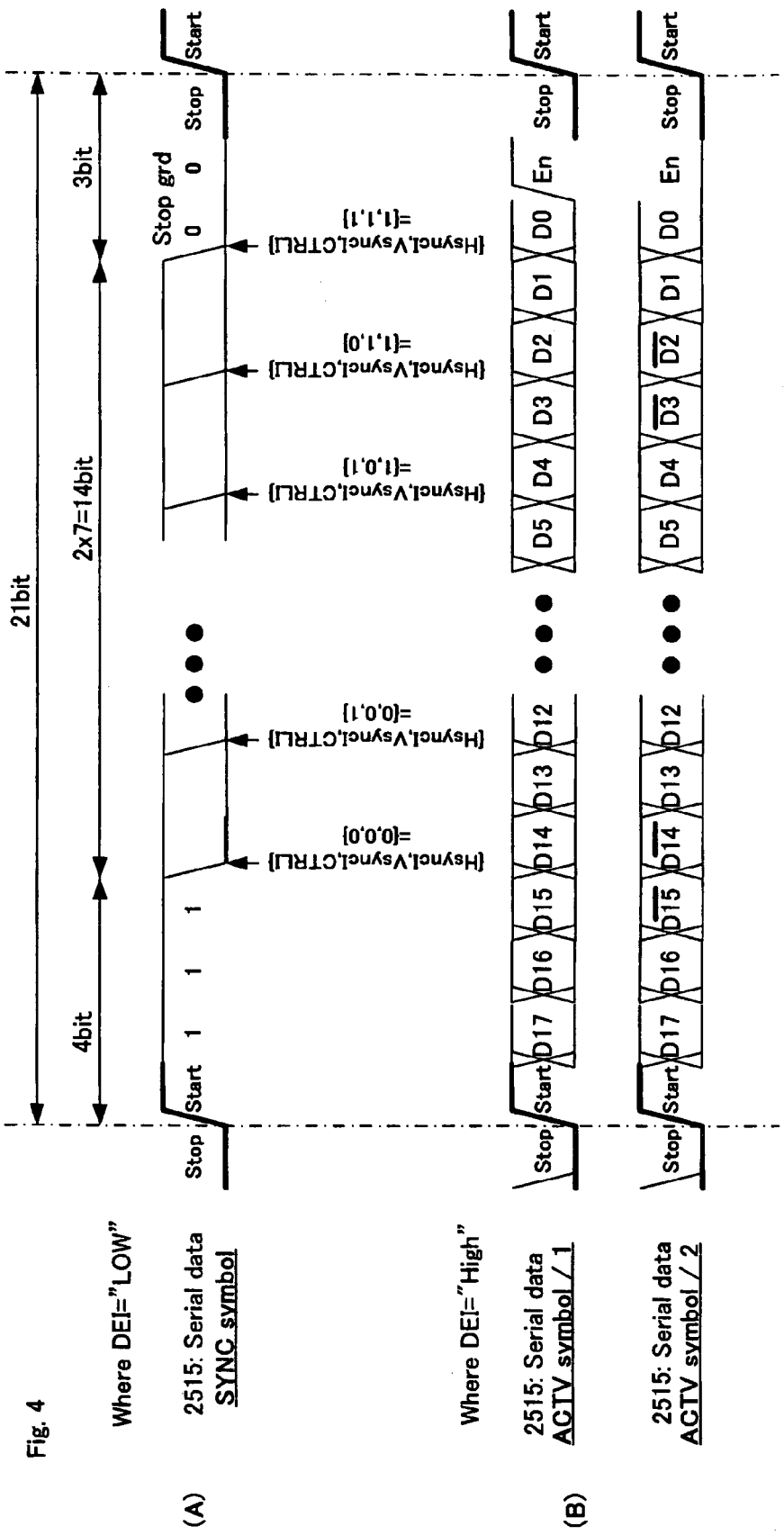
FIG. 4 is diagrams showing an outline of serial data according to one embodiment of the present invention.

Referring now to FIG. 4, an encoding method for encoding parallel data in a digital data transfer system of the present embodiment will be described. FIG. 4(A) and FIG. 4(B) each show an example of a signal waveform of the serial data 2515 obtained by the transmitter unit 2501 encoding and serializing input color data (RI5 to RI0, GI5 to GI0, BI5 to BI0) each having six bits and being first information input as parallel data, and input synchronization data (HsyncI, VsyncI, CTRLI) being second information.

As shown in FIG. 4(A), while DEI="low", i.e., in a blanking period, one symbol including 21 bits of the serial data 2515 includes information of HsyncI, VsyncI and CTRLI embedded therein between the start bit (Start) being MSB and the stop bit (Stop) being LSB. The 3-bit information of HsyncI, VsyncI and CTRLI is successively serialized and then encoded by the encoder circuit 2504 so that it will be pulse-width-modulated (PWM) data. That is, when the start bit is "high", the 3-bit information of HsyncI, VsyncI and CTRLI is modulated to the time width of a "high" bit pulse. In the example shown in FIG. 4(A), pulse width modulation is performed from 0 to 7 (0- to 14-bit width) with a 2-bit-width unit. While FIG. 4(A) shows an example where the pulse-width-modulated signal of a 14-bit width is embedded starting from the fourth bit from the start bit (MSB) of one symbol, it may be embedded starting from any bit as long as the embedded portion starts from a bit having the same level as that of the start bit and the 14-bit portion ends by the end of one symbol. For example, where PWM data is embedded starting from the fourth bit from the start bit (MSB) of one symbol, there are three non-PWM bits (including the stop bit) in the last portion of one symbol. The last three bits are at the "low" level as is the stop bit. Thus, the serialized data 2515 has a data structure in which there is only one rising edge within one symbol, as shown in FIG. 4(A). While the above description is directed to an example where the start bit is "high", the stop bit is "low" and the PWM modulated data has a "high" pulse width, the levels of the start bit, the stop bit and the PWM modulated bits are not limited thereto as long as the data structure is such that there is only one rising edge within one symbol. For example, serial data in which the start bit is "low", the stop bit is "high" and the PWM modulated bits are "low" can also be data in which there is only one rising edge within one symbol, and such serial data can also be used in the system of the present invention. While the PWM data is formed by a 2-bit unit in the example shown in FIG. 4(A), the PWM data may alternatively be formed by a unit other than a 2-bit unit, e.g., by a 1-bit-width unit. Note that when DEI="low", the second input information is pulse-width-modulated with a period that is 21 times the pulse width of the digital data of the first input information.

Other types of information can be embedded in the two patterns other than the PWM signal in which information of HsyncI, VsyncI and CTRLI is embedded. For example, sound information can be embedded in the two patterns.

Next, while DEI="high", i.e., in an active period, one symbol of the serial data 2515 is formed by data obtained by serializing the start bit (Start), the serial digital data D <17:0> being the encoded first input information (RI5 to RI0, GI5 to GI0, BI5 to BI0), a 1-bit encode bit En (referred to also as "encoding mode identification information") and the stop bit (Stop) in this order, as shown in FIG. 4(B). When DEI="high", the first encoder circuit 2504a encodes and serializes the first input information in one of the active mode 1 (ACTV symbol/1) and the active mode 2 (ACTV symbol/2), as shown in FIG. 4(B), in order to obtain serial data where there are two or more rising edges within one symbol. In the present example, one of the encoding modes, i.e., the active mode 1 and the active mode 2, is selected so that the number of rising edges, i.e., the number of transitions, within one symbol is two or more.

In the present example, the serial data 2515 has an encode bit for identifying which one of the two encoding modes is used for encoding the data, as shown in FIG. 4(B). In the present example, as an example of the encode bit, data "1" is added as the encode bit (En) before the stop bit (stop) when the data is encoded in the active mode 1, and data "0" is added as the encode bit (En) before the stop bit (stop) when the data is encoded in the active mode 2 so that data encoded in the active mode 1 and data encoded in the active mode 2 can be identified from each other.

In the present invention, the number of rising edges within one symbol is one when DEI="low". Therefore, when DEI="high", serial data is produced by selecting one of the encoding modes, i.e., the active mode 1 and the active mode 2, so that the number of rising edges within one symbol will not be one.

In the present embodiment, serial data encoded in the active mode 2 is obtained by inverting every other 2-bit portion of serial data encoded in the active 1, as shown in FIG. 4. Thus, with respect to serial data D <17:0> encoded in the active mode 1, serial data encoded in the active mode 2 has a data structure of D <D17, D16, D15 inverted, D14 inverted, D13, D12, . . . , D5, D4, D3 inverted, D2 inverted, D1, D0>. Note that the present invention is not limited to the encoding method using the active mode 1 and the active mode 2, but may be applicable to any encoding method such that the number of rising edges, i.e., the number of transitions, within one symbol is two or more.

(Transmitter Unit)

Figure 5:
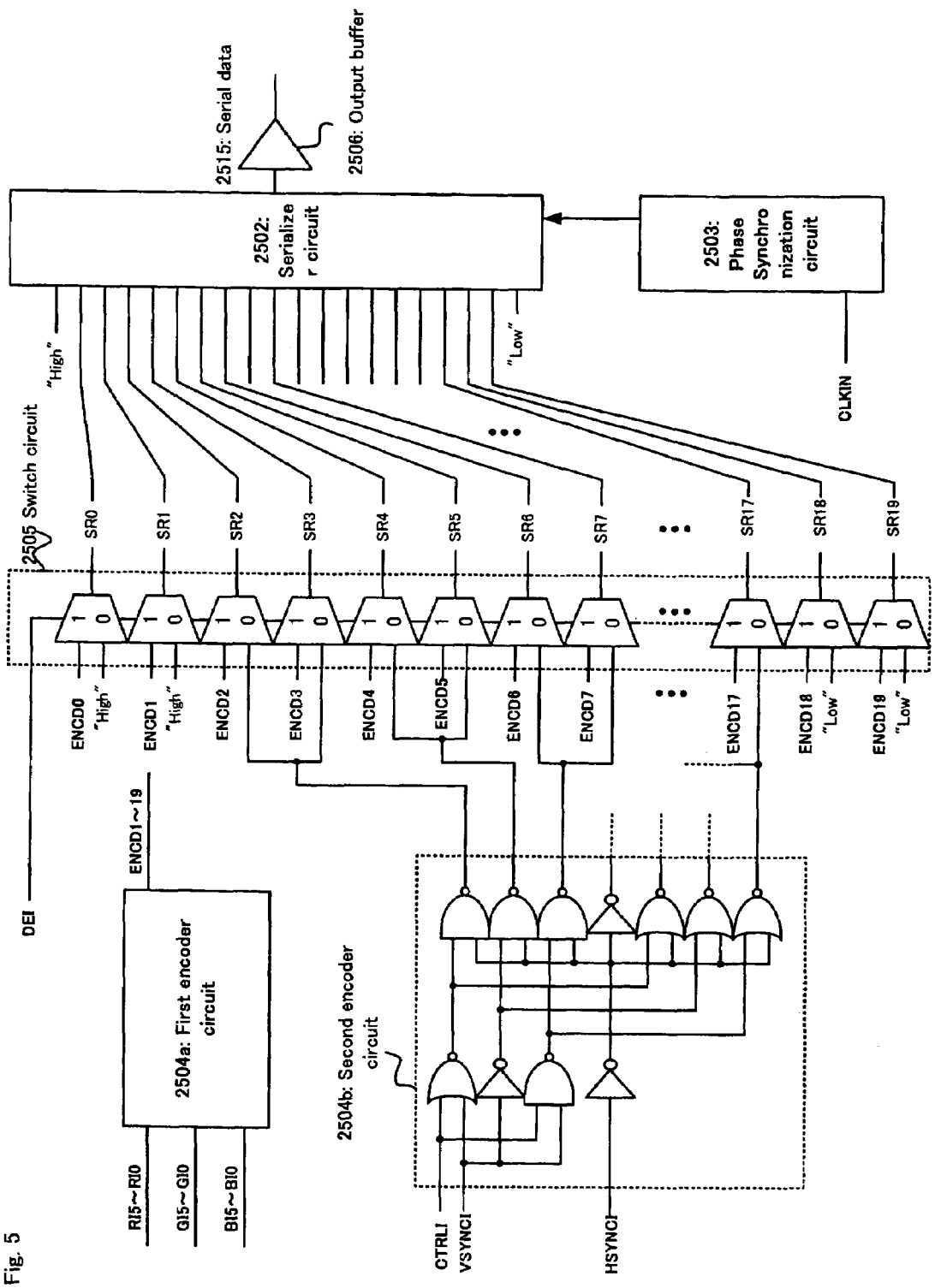
FIG. 5 is a diagram showing a circuit configuration of a transmitter unit according to one embodiment of the present invention.

Referring now to FIG. 5, the configuration of the transmitter unit 2501 in the digital data transfer system of the present invention, and the connection between the various components thereof, will be described. As shown in FIG. 5, outputs from the first encoder circuit 2504a and the second encoder circuit 2504b are input to the switch circuit 2505. The switch circuit 2505 includes 20 multiplexers. Note that in the present embodiment, an 18-bit output (ENCD1 to ENCD18) from the first encoder circuit 2404a and a 7-bit output from the second encoder circuit 2504b are input to the switch circuit 2505, as shown in FIG. 5.

Figure 6:
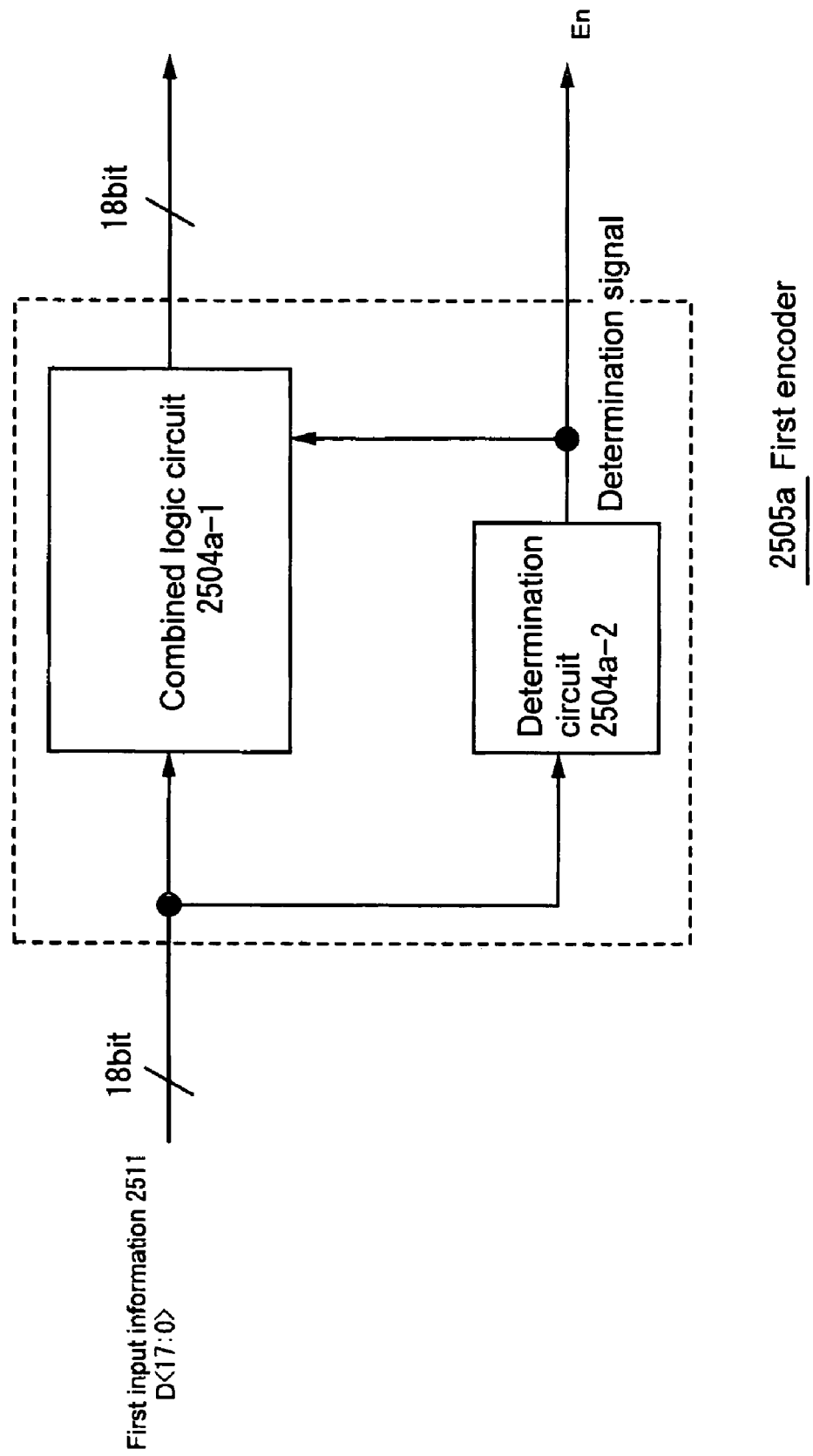
FIG. 6 is a circuit block diagram showing a first encoder circuit 2504*a* according to one embodiment of the present invention.

Referring now to FIG. 6, FIG. 6 is a circuit block diagram showing the first encoder circuit 2504a of the present embodiment. The first encoder circuit 2504a includes a combined logic circuit 2504a-1 and a determination circuit 2504a-2. The first input information 2511 (D <17:0>) is input to the combined logic circuit 2504a-1 and the determination circuit 2504a-2. The determination circuit 2504a-2 determines, based on the first input information 2511, whether to encode the first input information 2511 in the active mode 1 or in the active mode 2, and outputs a determination signal based on the determination. In the present embodiment, the determination signal output from the determination circuit 2504a-2 is a "high" level signal when the combined logic circuit 2504a-1 is to perform an encoding operation in the active mode 1 and is a "low" level signal when it is to perform an encoding operation in the active mode 2. The determination signal is used also as the encode bit En. The combined logic circuit 2504a-1 encodes the first input information 2511 in the active mode 1 or in the active mode 2 according to the determination signal, and outputs the encoded data. The determination circuit 2504a-2 may make the evaluation based not only on the first input information 2511 but also on at least one of the transfer frequency of the first information, the amount of EMI, the SN ratio or the error rate of the one-symbol serial digital data of the first information and the pulse-width-modulated signal of the second information. In such a case, the determination circuit 2504a-2 obtains these items of information in addition to the first input information. With such a configuration, the first encoder circuit 2505a can perform the encoding operation in such a mode as to improve the transfer frequency of the first information, the amount of EMI, the SN ratio or the error rate of the one-symbol serial digital data of the first information and the pulse-width-modulated signal of the second information, thus improving the overall transfer characteristics.

Note that while the first encoder circuit 2504a encodes data in one of two modes, i.e., the active mode 1 and the active mode 2, in the present embodiment, the present invention is not limited to this, and the combined logic circuit 2504a may encode data in one mode selected from among more than two encoding modes (e.g., n modes). In such a case, the determination circuit 2504a-2 produces a ($\log_2 n$)-bit determination signal and outputs it to the combined logic circuit 2504a-1. Herein, different encoding modes mean they differ from one another in their input-output correlation. Therefore, a different encoding mode provides a different input-output correlation.

Figure 7:
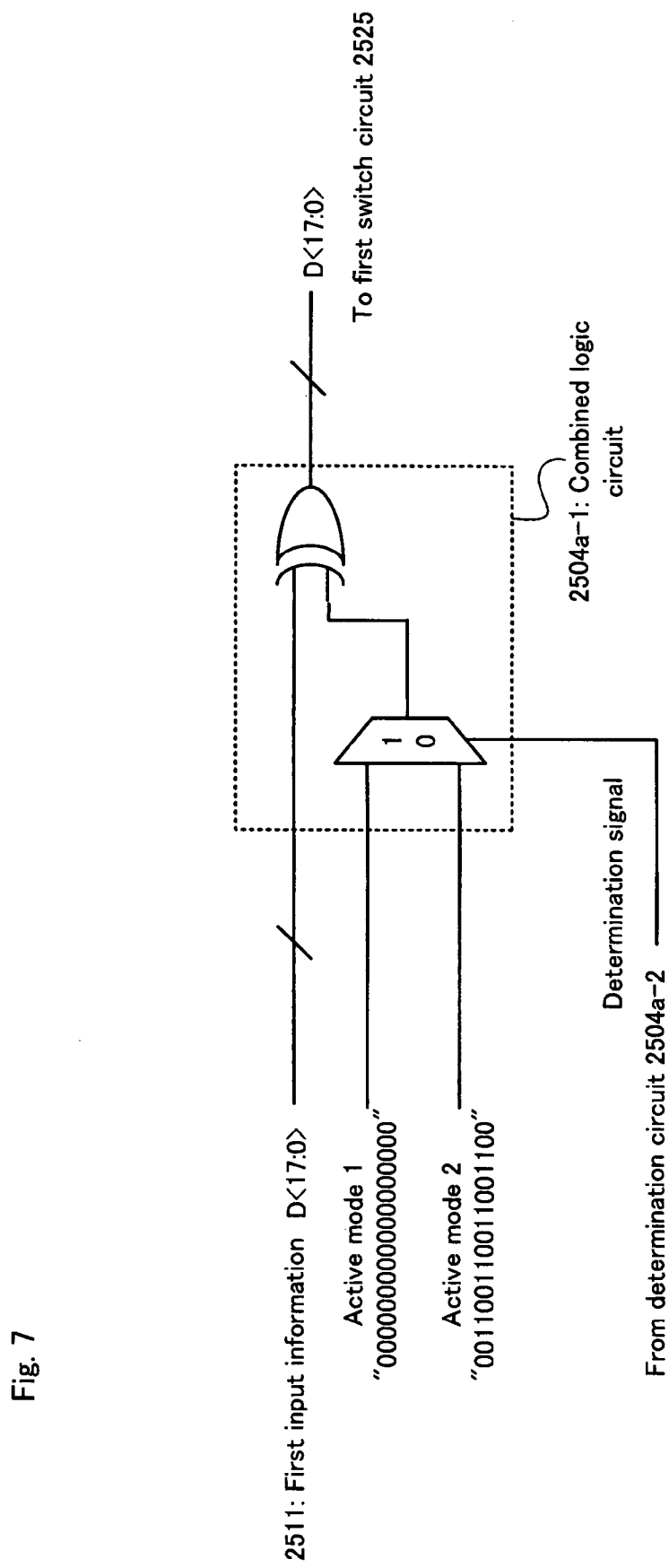
FIG. 7 is a diagram showing a circuit configuration of a combined logic circuit 2504*a*-1 according to one embodiment of the present invention.

Referring now to FIG. 7, a circuit configuration of the combined logic circuit 2504a-1 of the first encoder circuit 2504a will be described. The combined logic circuit 2504a-1 includes a number of exclusive logical sum circuits (XOR circuits) corresponding to the number of bits of the first input information 2511, and the same number of switch circuits. Each switch circuit receives data corresponding to the active mode 1 and data corresponding to the active mode 2. Each switch circuit selects data corresponding to the active mode 1 or data corresponding to the active mode 2 based on the determination signal from the determination circuit 2504a-2, and outputs the selected data to the corresponding XOR circuit. Each XOR circuit receives an output from the first input information 2511 and an output from the corresponding switch circuit, and performs a logic operation on the received outputs. The output from each XOR circuit is input to the first switch circuit 2525.

Figure 8:
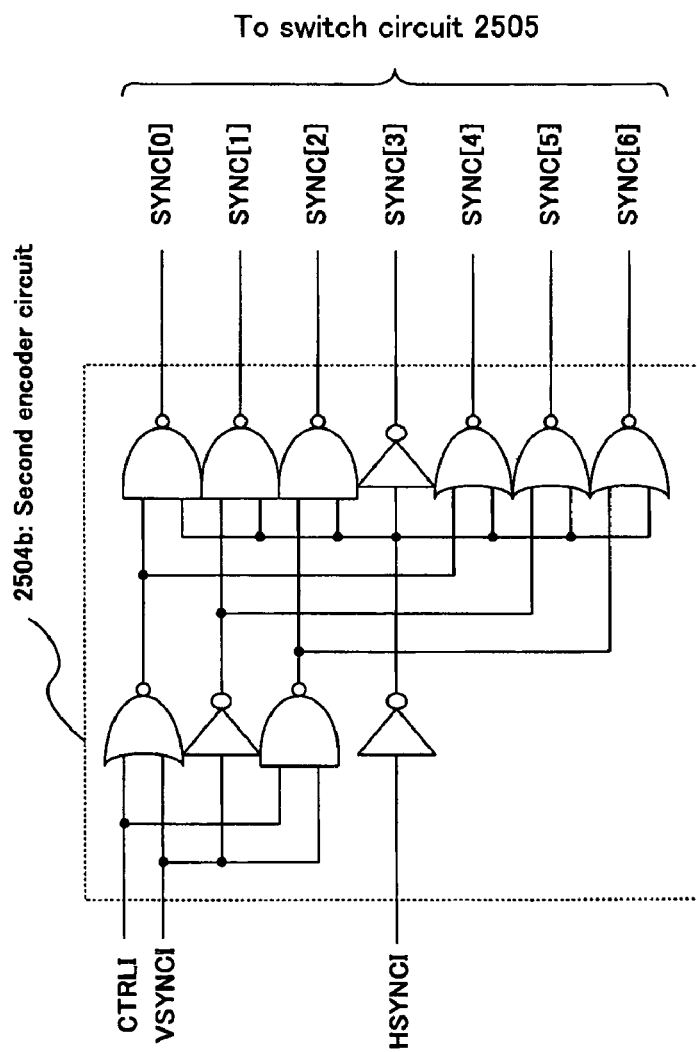
FIG. 8 is a circuit diagram and an operation table of a first encoder circuit according to one embodiment of the present invention.

Referring now to FIG. 8(A) and FIG. 8(B), the operation of the second encoder circuit 2504b will be described. FIG. 8(A) shows a circuit configuration of the second encoder circuit 2504b of the present embodiment and the 7-bit output thereof (SYNC[0] to SYNC[6]). FIG. 8(B) shows a data table of Hsync, Vsync and CTRLI, which are input to the second encoder circuit 2504b of the present embodiment, and output data (SYNC[0] to SYNC[6]), which are output from the second encoder circuit 2504b.

As shown in the data table of FIG. 8(B), the output data (SYNC[0] to SYNC[6]) from the second encoder circuit 2504b is such that the number of transitions therein is restricted when receiving the input data Hsync, Vsync and CTRLI. In other words, 3-bit data {Hsync, Vsync, CTRLI} in which the most significant bit (MSB) is HsyncI and the least significant bit (LSB) is CTRLI is encoded into 7-bit data {SYNC[0] (most significant bit) to SYNC[6] (least significant bit)} so that as the value of the 3-bit data increases by one, the number of consecutive "high" data values to be output starting from the most significant bit of the 7-bit data increases. That is, the encoding operation is performed to output the 7-bit data {SYNC[0] (most significant bit) to SYNC[6] (least significant bit)} such that a value of an upper bit is always higher than a value of a lower bit. Such an output scheme is generally called "thermo-code", such encoding is called "thermo-code" type encoding, and such an encoder is called a "thermo-code" type encoder.

The second encoder circuit 2504b in the data transfer method and the data transfer system of the present invention employs a thermo-code type output scheme. Note that the circuit configuration of the second encoder circuit 2504b is not limited to that shown in FIG. 8(A), but may be any other circuit configuration as long as a thermo-code type output scheme is employed. Thus, only one rising edge is produced within one symbol.

Referring again to FIG. 5, the output data (ENCD1 to ENCD19) from the first encoder circuit 2404a, the output data (SYNC[0] to SYNC[6]) from the second encoder circuit 2404b, and DEI (input data enable) are input to the switch circuit 2505. The switch circuit 2505 operates based on the received DEI. The switch circuit 2505 selects the output data (ENCD1 to ENCD19) from the first encoder circuit 2404a if DEI="high" and selects the output data (SYNC[0] to SYNC[6]) from the second encoder circuit 2404b if DEI="low", and the switch circuit 2505 outputs the data (SR0 to SR19) to the serial circuit 2502.

Based on the input clock 2514, the phase synchronization circuit 2503 forms a plurality of clocks of different phases, and outputs them to the serializer circuit 2502.

The serializer circuit 2502 serializes the input data (SR0 to SR19) based on the plurality of clocks of different phases from the phase synchronization circuit 2503 to form the serial data 2515, and outputs the serial data 2515 to the receiver unit 2521 through the output buffer 2506. In the formation of the serial data 2515, a "high" level signal and a "low" level signal are input to the serializer circuit 2502 in order to form a "high" start bit at the beginning of one symbol and a "low" stop bit at the end thereof.

Figure 9:
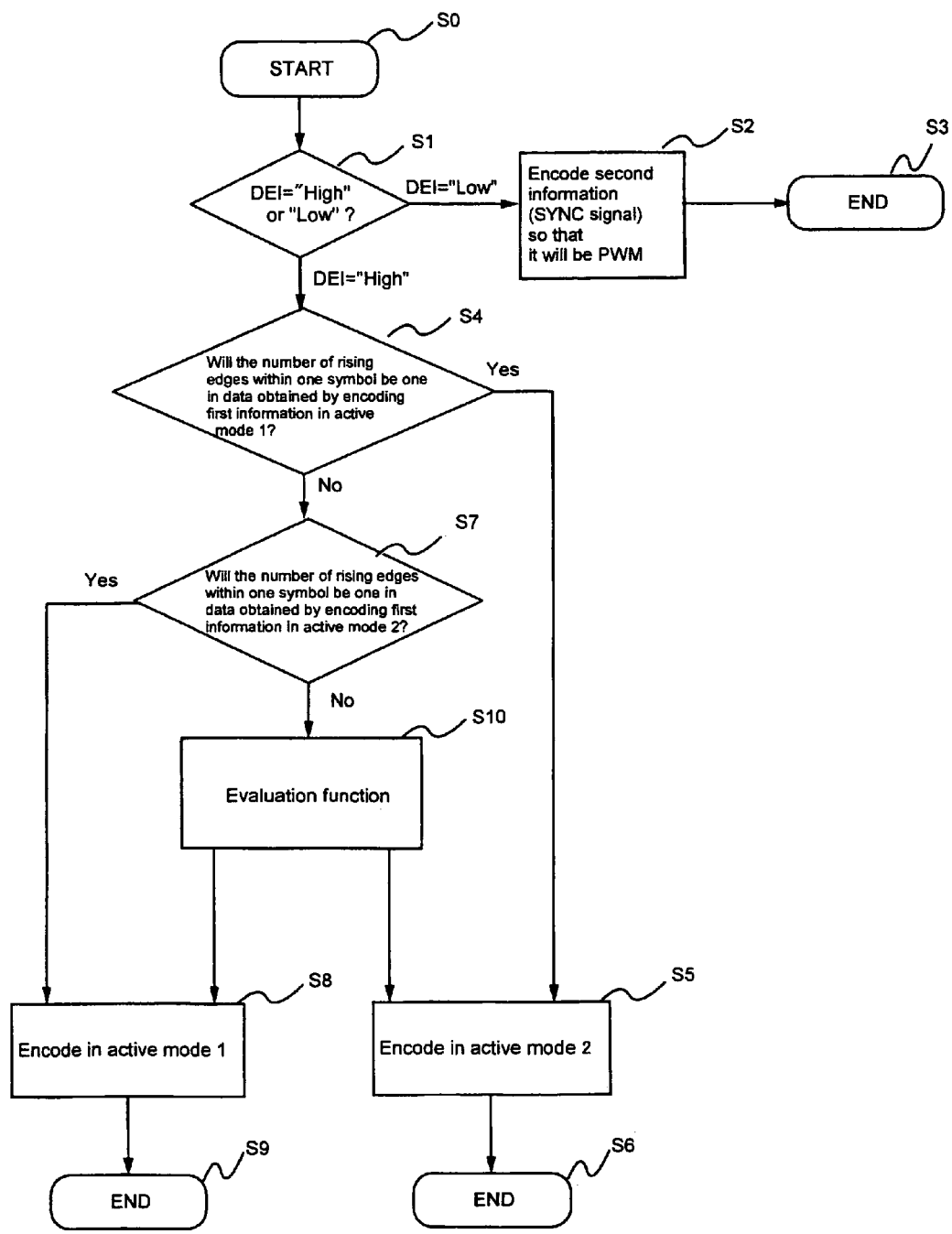
FIG. 9 is a flow chart showing an encoding method according to one example of the present invention.

How an encoding mode is chosen according to input information in the data transfer system of the present embodiment will now be described in detail with reference to FIG. 9. FIG. 9 is a flow chart showing a method of choosing an encoding mode according to the present embodiment.

First, it is determined whether DEI of the input information (parallel data) is "high" or "low" (step S1). If it is determined that DEI="low" in step S1, the second information (HsyncI, VsyncI and CTRLI) is encoded so that it will be a pulse-width-modulated (PWM) signal when serialized successively. With such encoding, the serialized data will have a data structure in which there is only one rising edge within one symbol (step S2). Thus, encoding of the data of the second information is completed (step S3).

If it is determined that DEI="high" in step S1, it is determined whether or not the number of rising edges within one symbol will be one in the serialized data to be obtained by encoding the input color data (RI5 to RI0, GI5 to GI0, BI5 to BI0) in the active mode 1 and then adding a start bit and a stop bit having different bit values at the beginning and at the end of the encoded data (step S4). If it is determined that the number of rising edges within one symbol will be one, the first information (RI5 to RI0, GI5 to GI0, BI5 to BI0) is encoded in the active mode 2 (step S5), and the process exits the data encoding process (step S6). If the number of rising edges within one symbol will be two or more, the process proceeds to step 7. In step 7, it is determined whether or not the number of rising edges within one symbol will be one in the serialized data to be obtained by encoding the first information (RI5 to RI0, GI5 to GI0, BI5 to BI0) in the active mode 2 and then adding a start bit and a stop bit having different bit values at the beginning and at the end of the encoded data (step S7). If it is determined that the number of rising edges within one symbol will be one, the first information (RI5 to RI0, GI5 to GI0, BI5 to BI0) is encoded in the active mode 1 (step S8), and the process exits the data encoding process (step S9). If the number of rising edges within one symbol will be two or more, the process proceeds to step S10.

In the above description, the determination is made by evaluating whether or not the number of rising edges will be one when the input color data being the first information is subjected to a simple serial conversion and then a start bit and a stop bit having different bit values are added at the beginning and at the end of the converted data. Alternatively, serial data obtained by subjecting the input color data being the first information to a simple serial conversion can be evaluated without taking the start bit and the stop bit into consideration. In this case, it is determined whether or not the number of rising edges is zero.

In step S10, an evaluation is made using a predetermined evaluation function as to whether input data is to be encoded in the active mode 1 or in the active mode 2, and it is determined based on the evaluation whether input data is to be encoded in the active mode 1 (step S8) or in the active mode 2 (step S5). Through the selected encoding process, the encoding of the data of the first information is completed (step S9 or step S6). Note that whether input data is encoded in the active mode 1 or in the active mode 2 as determined in step S10, the obtained data will not be the same as the serial data obtained when DEI="low" (where the number of rising edges is one).

Through the encoding operation as described above, serial data encoded when DEI="low" and that encoded when DEI="high" are clearly distinguished from each other with respect to whether the number of rising edges within one symbol is one (DEI="low") or two (DEI="high").

As described above, the first information 2511 and the second information 2512, which are input as parallel data, are encoded and then serialized, and transferred as the serial data 2515 from the transmitter unit 2501 to the receiver unit 2521. When transferring serial data thus obtained through serialization, the period in which one symbol of serial data of the first information 2511 is transferred will be referred to as a "first period", and the period in which one symbol of serial data of the second information 2512 is transferred will be referred to as a "second period". Therefore, the amount of information of the first information per unit time in the first period is greater than that of the second information in the second period.

As described above, in the present embodiment shown in FIG. 3, the switch circuit 2505 is provided preceding the serializer circuit 2502 so that the switch circuit 2505 first selects either the first information 2511 encoded by the first encoder circuit 2504a or the second information 2512 encoded by the second encoder circuit 2504b based on DEI, and then the serializer circuit 2502 successively serializes the selected data. Alternatively, the serializer circuit 2502 may be provided preceding the switch circuit 2505 so that the first information 2511 encoded by the first encoder circuit 2504a and the second information 2512 encoded by the second encoder circuit 2504b are individually serialized by the serializer circuit 2502, after which the switch circuit 2505 alternately and periodically serializes the serial data of the first information and the second serial data.

(Receiver Unit)

Figure 10:
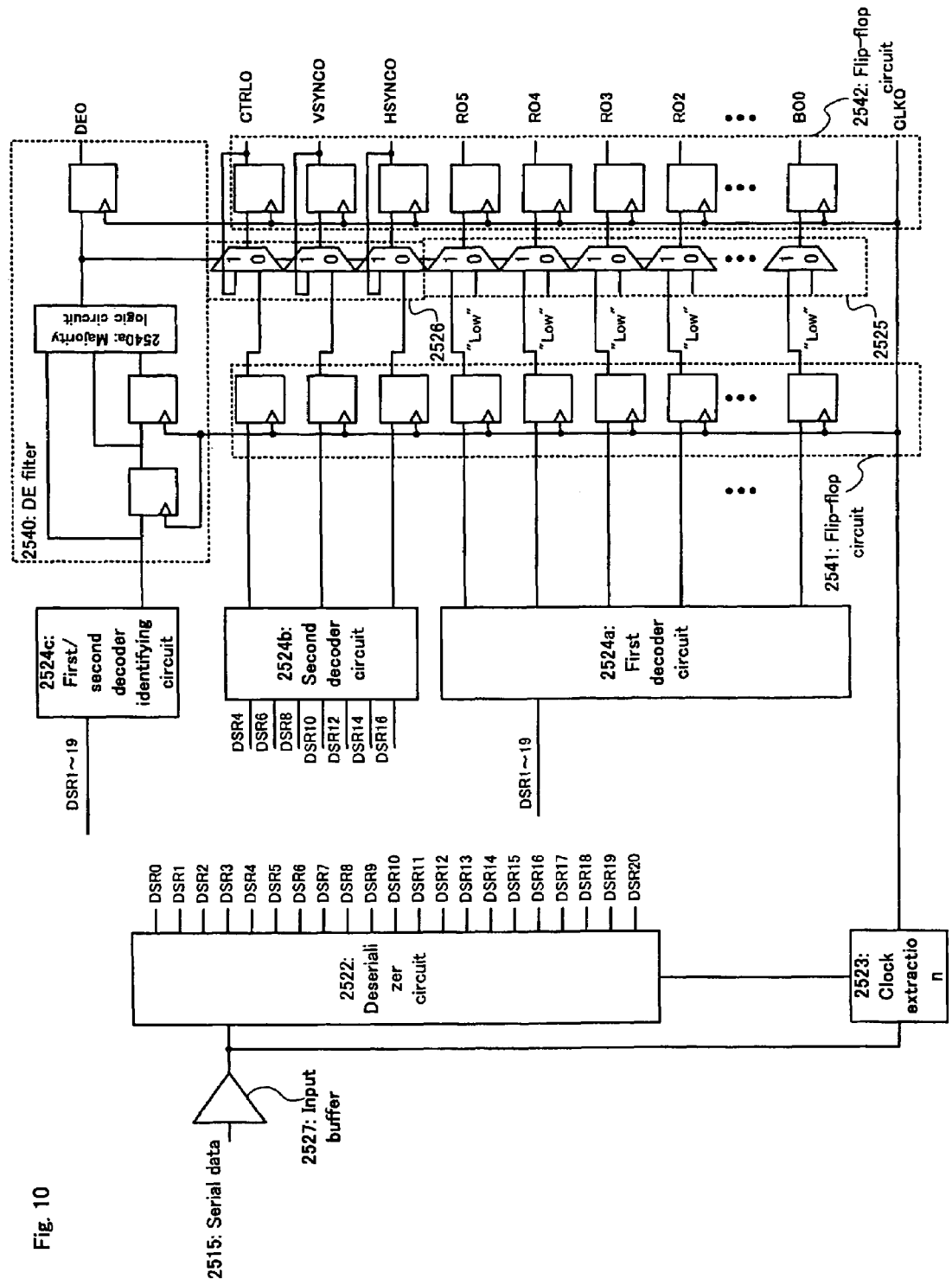
FIG. 10 is a diagram showing a circuit configuration of a receiver unit according to one embodiment of the present invention.

FIG. 10 shows a configuration of the receiver unit 2521 of the present embodiment. The serial data 2515 output from the transmitter unit 2501 is input to the deserializer circuit 2522 and the clock extraction circuit 2523 through the input buffer 2527. The clock extraction circuit 2523 extracts the clock from the serial data 2515 to recover the output clock 2534 and a plurality of clocks of different phases. The deserializer circuit 2522 deserializes the serial data 2515 based on the plurality of clocks of different phases recovered by the clock extraction circuit 2523, and outputs the output data (DSR0 to DSR20) to the first decoder circuit 2524a, the second decoder circuit 2524b and the first/second decoder identifying circuit 2524c. The first decoder circuit 2524a receives output data (DSR1 to DSR19) corresponding to the first input information 2511, and the second decoder circuit 2524b receives output data (DSR4, DSR6, DSR8, DSR10, DSR12, DSR14, DSR16 in the present embodiment). The first/second decoder identifying circuit 2524c receives output data (DSR1 to DSR19). The decoder circuits 2524a and 2524b decode received data and output data corresponding to the first input information 2511 and data corresponding to the second input information to the switch circuits 2525 and 2526, respectively.

Note that the receiver unit 2521 may include a DE filter 2540 and a flip-flop circuit 2541, as shown in FIG. 10. In such a case, the output data from the first/second decoder identifying circuit 2524c is processed through the DE filter 2540, and the output therefrom is input to the first switch circuit 2525 and the second switch circuit 2526. The operation of the DE filter 2540 will be described later in detail.

Figure 11:
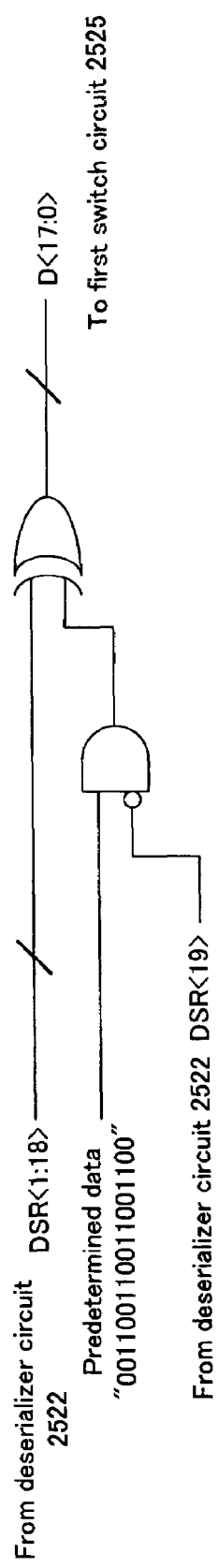
FIG. 11 is a circuit diagram showing a first decoder circuit 2524*a* according to one embodiment of the present invention.

The first decoder circuit 2524a of the present embodiment will now be described with reference to FIG. 11. FIG. 11 is a circuit configuration diagram showing the first decoder circuit 2524a of the present embodiment. If DSR <19> corresponding to the encode bit (En) is "low"=0, an exclusive logical sum (XOR) between predetermined data associated with the encoding method in the active mode 2 (mask "001100 . . . ") and DSR <1:18> is output as D <17:0> to the first switch circuit 2525. If DSR <19> is "high"=1, DSR <1:18> is output as it is as D <17:0> to the first switch circuit 2525 according to the encoding scheme in the active mode 1.

Figure 12:
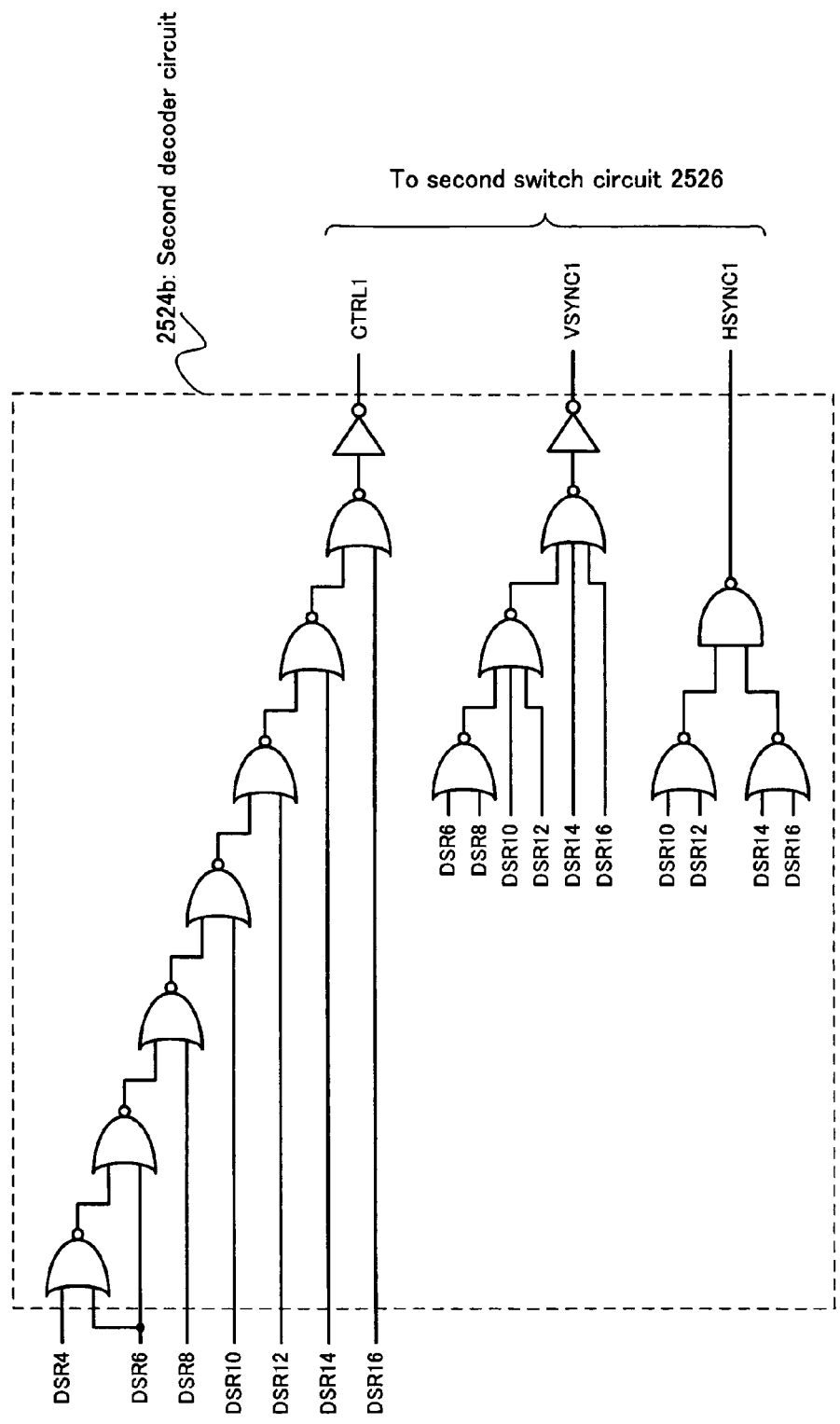
FIG. 12 is a circuit diagram showing a second decoder circuit 2524*b* according to one embodiment of the present invention.

Now, a circuit configuration of the second decoder circuit 2524b of the present embodiment will be described with reference to FIG. 12. The second decoder circuit 2524b includes 12 NOR circuits, one NAND circuit and two inverter circuits. Note that the circuit configuration of the second decoder circuit 2524*b* is not limited to that shown in FIG. 12 as long as it is a circuit configuration for decoding a "thermo-coded" synchronization signal.

Figure 13:
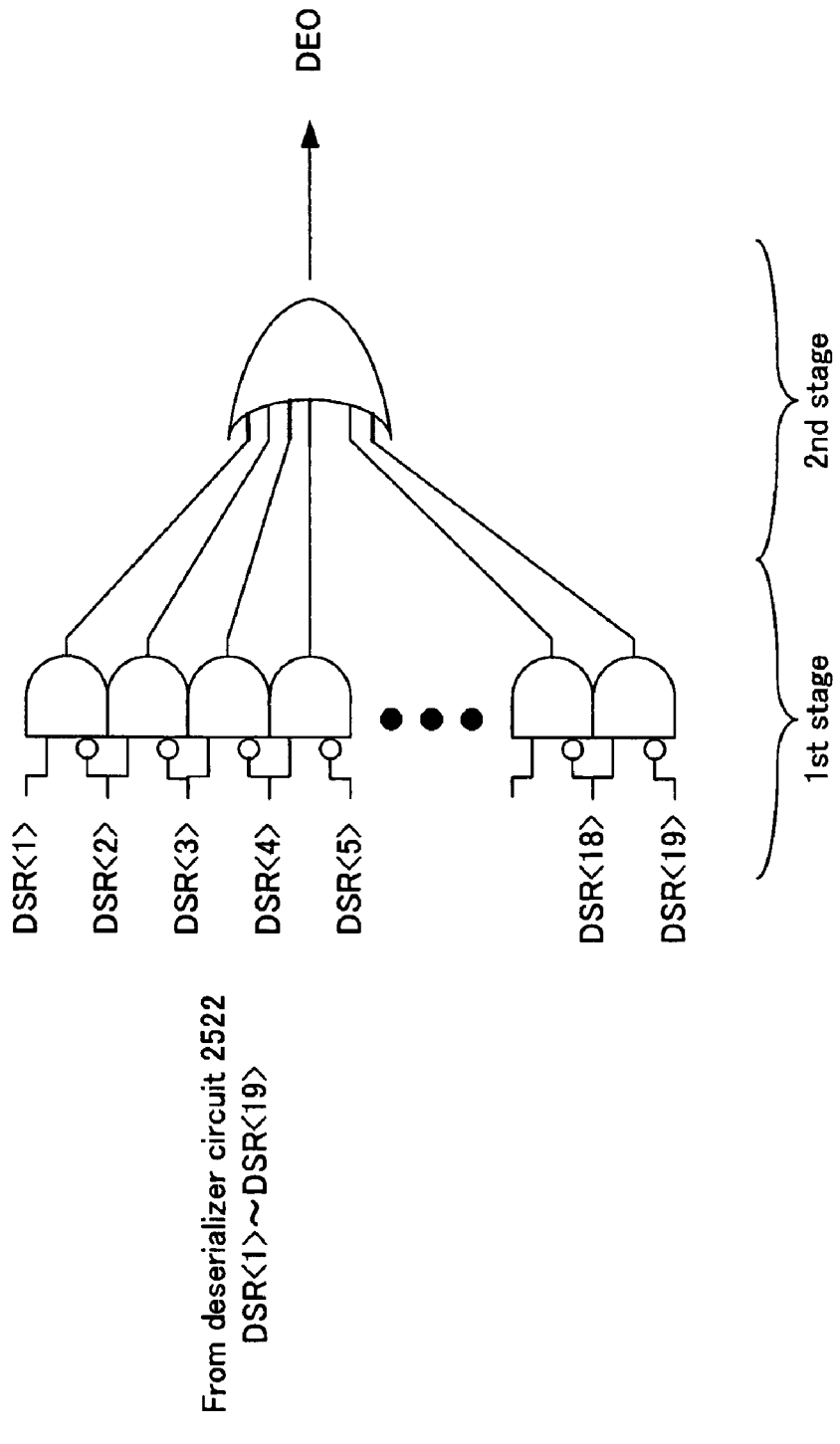
FIG. 13 is a circuit diagram showing a first/second decoder identifying circuit 2524*c* according to one embodiment of the present invention.

Referring now to FIG. 13, the circuit configuration of the first/second decoder identifying circuit 2524*c* will be described. The first/second decoder identifying circuit 2524*c* includes 18 AND circuits (1st stage) receiving the output data (DSR1 to DSR19) from the deserializer circuit 2522, and an OR circuit (2nd stage) receiving the outputs from the AND circuits. In the 1st stage, it is determined whether or not there is a rising edge between bits DSR <1> to DSR <19>. In the 2nd stage, if even one of the outputs from the 1st stage is high, it is determined that DEI="high" so as to output DEO being "high"(="1"). If none of the outputs from the 1st stage is high, it is determined that DEI="low" so as to output DEO being "low"(="0"). With synchronism being achieved, DSR <20> and DSR <0> are the stop bit (Stop) and the start bit (Start), respectively, making it certain that there is at least one rising edge therebetween. This means that the first/second decoder identifying circuit 2524*c* determines whether there is only one rising edge or there is more than one rising edge within one symbol.

Figure 14:
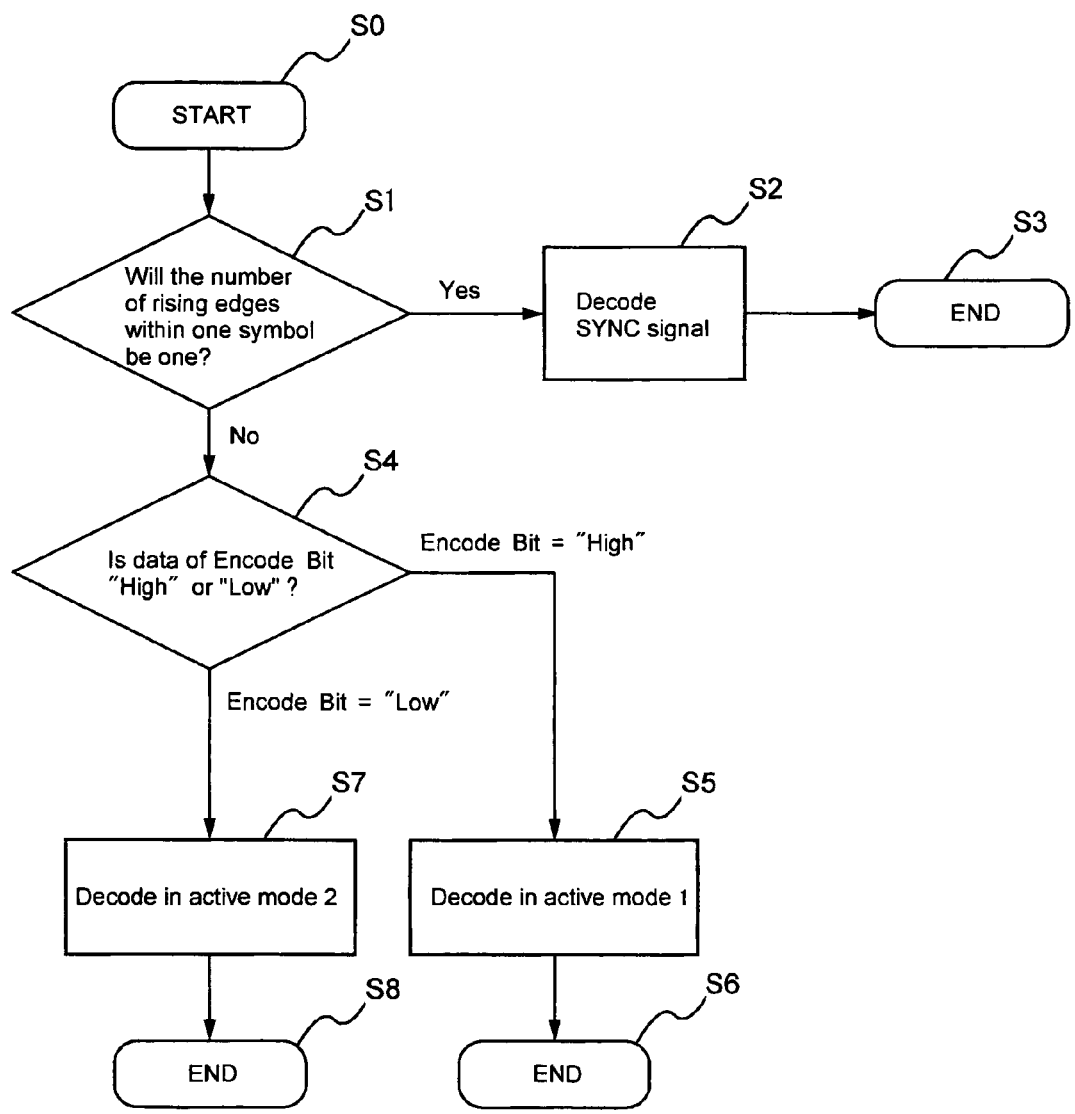
FIG. 14 is a flow chart showing a decoding method according to one embodiment of the present invention.

Referring now to FIG. 14, the decoding method used in the receiver unit 2521 of the present embodiment will be described using a flow chart. First, it is determined whether or not the number of rising edges within one symbol of data deserialized by the deserializer circuit 2522 is one (step S1). If the number of rising edges is one, the one symbol of data is the second information (synchronization signals (HsyncI, VsyncI, CTRLI)), as a result of which the second decoder circuit 2524*b* decodes the second information (step S2), and the process exits the data decoding process (step S3). If the number of rising edges is two or more, the one symbol of data is the first information (color data signals (RI5 to RI0, GI5 to GI0, BI5 to BI0)), in which case it is then determined whether or not the data of the encode bit (En) is "1" or "0" (step S4). If the data of the encode bit (En) is "1", the first decoder circuit 2524*a* decodes the one symbol of deserialized data in the active mode 1 corresponding to the active mode 1 encoding (step S5). If the data of the encode bit (En) is "0", the first decoder circuit 2524*a* decodes the one symbol of deserialized data in the active mode 2 corresponding to the active mode 2 encoding (step S7). The process then exits the decoding process (step S6 or S8).

Referring again to FIG. 10, the first switch circuit 2525 selects data input from the first decoder circuit 2524*a* based on a plurality of clocks of different phases from the clock extraction circuit 2523, and outputs the selected data to a flip-flop circuit 2542. The second switch circuit 2526 selects data input from the second decoder circuit 2524*b* based on a plurality of clocks of different phases from the clock extraction circuit 2523, and outputs the selected data to the flip-flop circuit 2542. The flip-flop circuit 2542 includes 19 flip-flops and outputs first output information (RO5 to RO0, GO5 to GO0, BO5 to BO0) and second output information (HsyncO, YsyncO, CTRLO).

Thus, the first information 2511, the second information 2512, DEI and the input clock 2514, which are input as parallel data to the transmitter unit 2501, are serialized and then transmitted. The serial data received by the receiver unit 2521 is deserialized and then decoded to recover the first output information 2531, the second output information 2532, DEO and the output clock 2534.

Now, the operation of the DE filter 2540 will be described with reference to FIG. 15. FIG. 15(A) shows a circuit configuration of the DE filter 2540, and FIG. 15(B) shows a timing chart of data (DE0, DE1, DE2, DEO) at the DE filter 2540. The DE filter 2540 of the present embodiment includes a majority logic circuit 2540*a* and three flip-flops, the majority logic circuit 2540*a* including one OR circuit and three AND circuits.

The DEI signal is not a signal having a 1-bit pulse width, but is a signal that spans over a few bits. Therefore, if there is a pulse of only a 1-bit width in the DEI signal, it is not true data but an error. The DE filter 2540 removes such an error. The DE filter 2540 includes a flip-flop circuit for delaying DEI, and the majority logic circuit 2540*a*. The majority logic circuit 2540*a* outputs "1" if the majority of its three inputs are "1" and outputs "0" if the majority of its three inputs are "0". In the waveform example shown in FIG. 15(B), errors indicated by bold lines are filtered out by the majority logic circuit 2540. With the circuit configuration shown in FIG. 15(A), even if DEO input to the DE filter 2540 contains an error having a 1-bit pulse width of serial data, it is possible to output DEO from which the error is removed. In the description above, two flip-flops are connected in series with each other to obtain three signals (DE0, DE1, DE2) shifted in time by one bit from one another so as to determine the majority among the three signals. However, the number of signals among which the majority is determined is not limited to three. For example, four flip-flops may be connected in series with one another to obtain five signals shifted in time from one another by one bit so as to determine the majority among the five signals.

(Clock Extraction Circuit)

Figure 16:
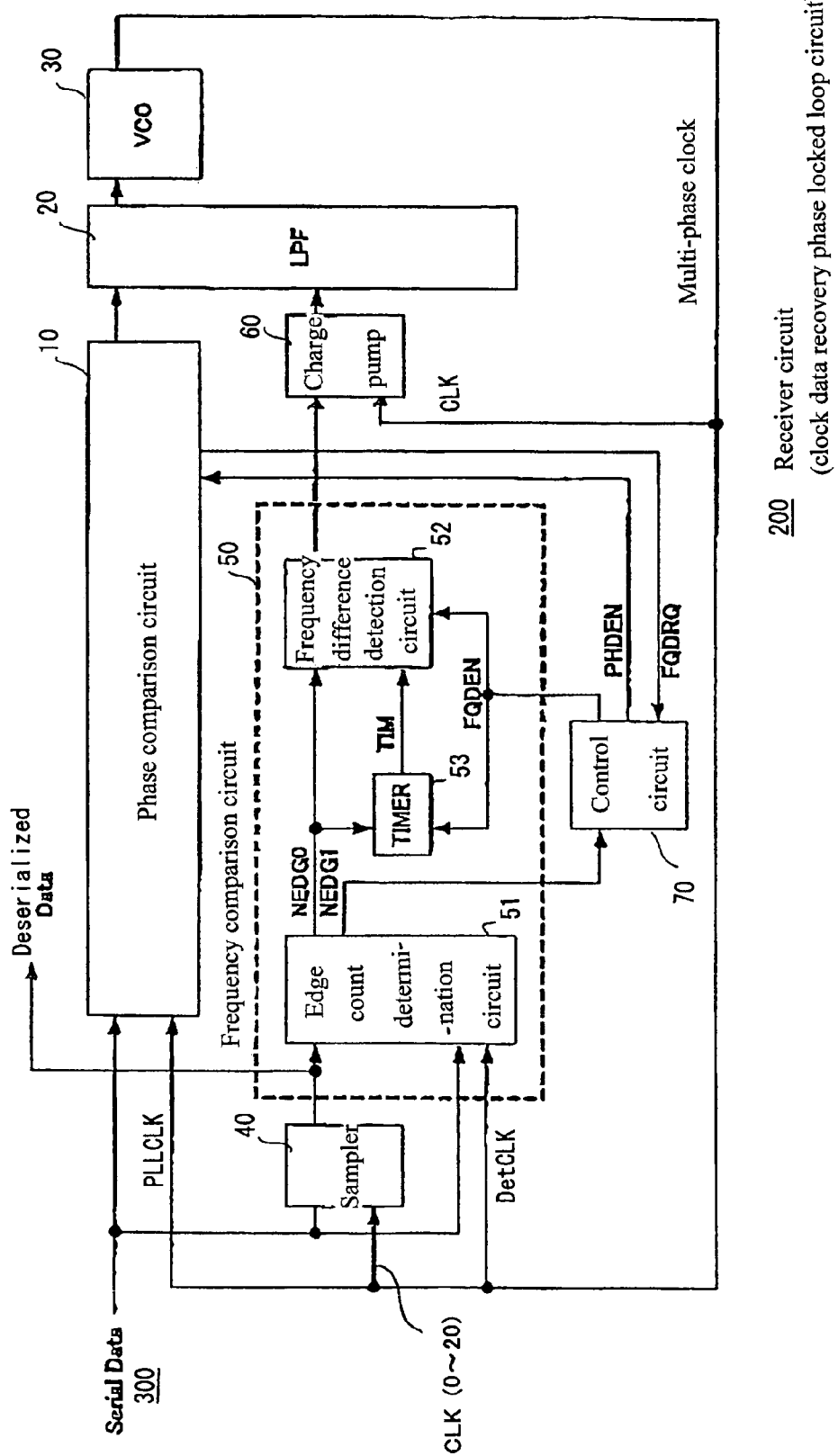
FIG. 16 is a hardware block diagram showing a circuit configuration of a clock extraction circuit being a receiver circuit of the present invention.
Figure 17:
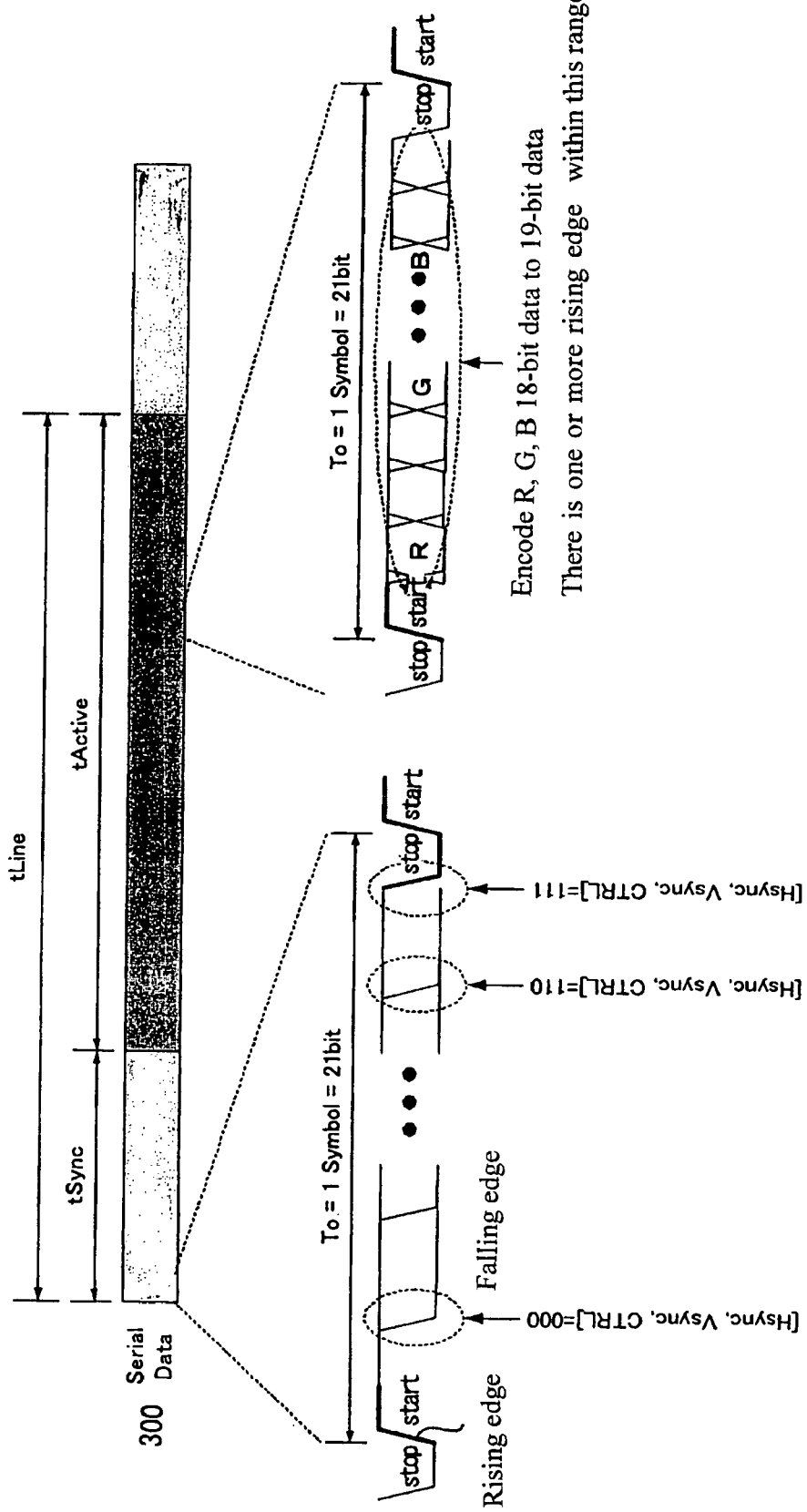
FIG. 17 is a diagram showing a structure of serial data for one line of image display.

An example of a receiver circuit of the present invention will now be described in detail with reference to the drawings using an image data transfer operation as an example. FIG. 16 is a hardware block diagram showing a circuit configuration of a clock data recovery phase locked loop circuit (clock extraction circuit) being a receiver circuit of the present invention. The clock extraction circuit corresponds to the clock extraction circuit 2523 shown in FIG. 3. FIG. 17 shows a structure of serial data obtained by the transmitter unit on the transmitter side by serializing parallel image data and transmitted from transmitter unit. First, the data structure of serial data, being an input signal to the clock data recovery phase locked loop circuit shown in FIG. 16, will be described. FIG. 17 shows a structure of serial data required for scanning one line of image display, and the predetermined one line period (tLine) includes a blanking period (tSync) and an active period (tActive). In either period, 21 bits delimited by the start/stop 1/0 are transferred as one symbol. Phase comparison, which is necessary for phase synchronization, is performed based on the start/stop.

In the blanking period (tSync) of input data, one symbol of serial data 300 is obtained by serializing together the start bit (Start), encoded horizontal synchronization data (HsyncI), encoded vertical synchronization data (VsyncI) and encoded control data (CTRLI) and the stop bit (Stop) in this order. Specifically, the serial data in the blanking period is in a pulse-width-modulated form such that the period of the rising edge is constant while the falling edge varies depending on Hsync, Vsync and CTRLI.

In the active period (tActive), one symbol of the serial data 300 is 21-bit data obtained by serializing the start bit (Start), 19 bits obtained by encoding 18 color data bits (six R bits, six G bits, six B bits) and the stop bit (Stop) in this order. Note that the data is serialized after the R, G, B data are encoded so that there are two or more rising edges within one symbol. While the color data of the serial data are R, G and B data each having six bits in the present example, the present invention is not limited to this.

Figure 18:
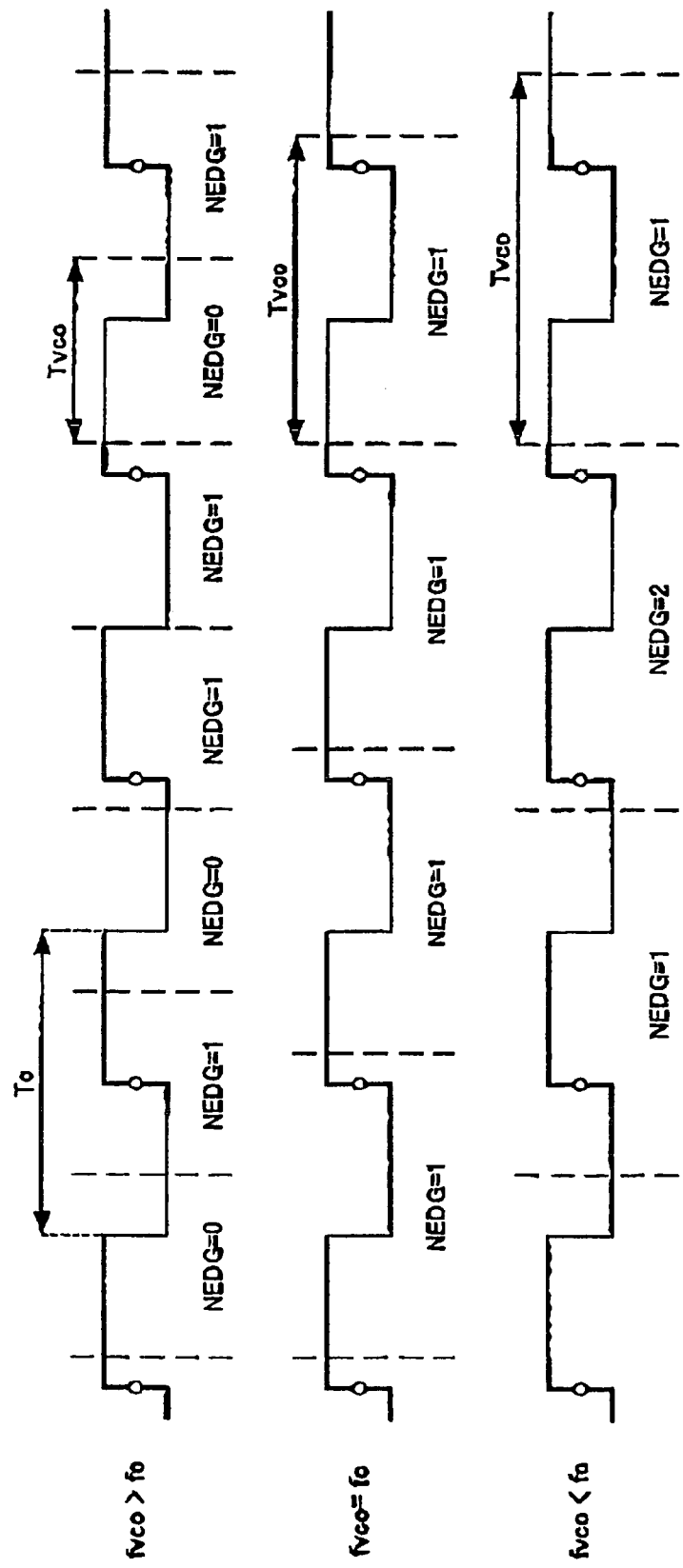
FIG. 18 is a diagram showing the relationship between the number of rises of serial data in a blanking period and the period Tvco of a voltage-controlled oscillator.

The clock recovery operation performed when converting the serial data sent from the transmitter unit side to parallel data on the receiver unit side will now be described. FIG. 18 is a diagram showing the relationship between the number of rises (rising edges) in the serial data within one symbol period (To) of the serial data 300 in the blanking period and the voltage-controlled oscillator period (Tvco) to be described later. Since the data structure is such that there is only one rising edge within one symbol of the serial data 300, if Tvco is shorter than To, i.e., if the frequency of the voltage-controlled oscillator (fvco) is higher than that of To (fo), the number of rising edges (NEDG) within Tvco is one or zero. If fvco=fo, NEDG=1, and if fvco<fo, NEDG=1 or NEDG=2. Therefore, the magnitude relationship between fvco and fo can be determined by evaluating NEDG.

Figure 19:
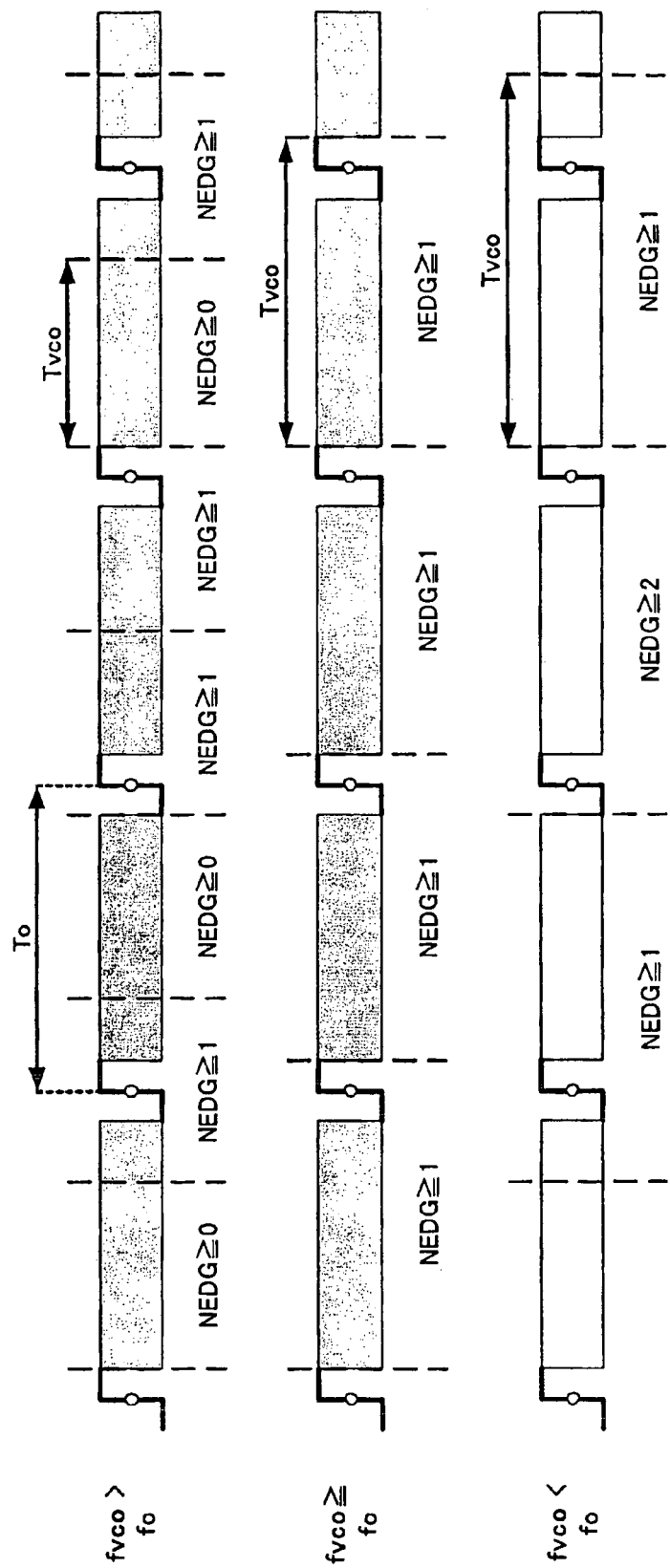
FIG. 19 is a diagram showing the relationship between the number of rises of serial data in an active period and the period of a voltage-controlled oscillator.

FIG. 19 is a diagram showing the relationship between the number of rises (rising edges) in the serial data within one symbol period (To) of the serial data 300 in the active period and the voltage-controlled oscillator period (Tvco) to be described later. The number of rising edges (NEDG) within one symbol of the serial data 300 is equal to or greater than one, or equal to or greater than zero if To>Tvco, i.e., if the frequency of the voltage-controlled oscillator (fvco) is higher than that of To (fo). If fvco=fo, NEDG=1 or more, and if fvco<fo, NEDG=1 or more or NEDG=2 or more. Therefore, in the active period, the magnitude relationship between fvco and fo cannot be determined based only on NEDG.

Based on the description above, the frequency difference can be determined as follows.

(1) fvco>fo if NEDG=0

(2) fvco≈fo if NEDG=1 holds true for a number of consecutive times (the difference between fvco and fo is nearly equal to fo/N, where N is the number of consecutive times; N=30 to 50 in the example)

(3) fvco<fo if neither (1) nor (2) occur after the blanking period has elapsed (this is because the period tTME to be described later is set to be sufficiently longer than tLine so as to ensure that a blanking period is passed during a tTME period)

Figure 20:
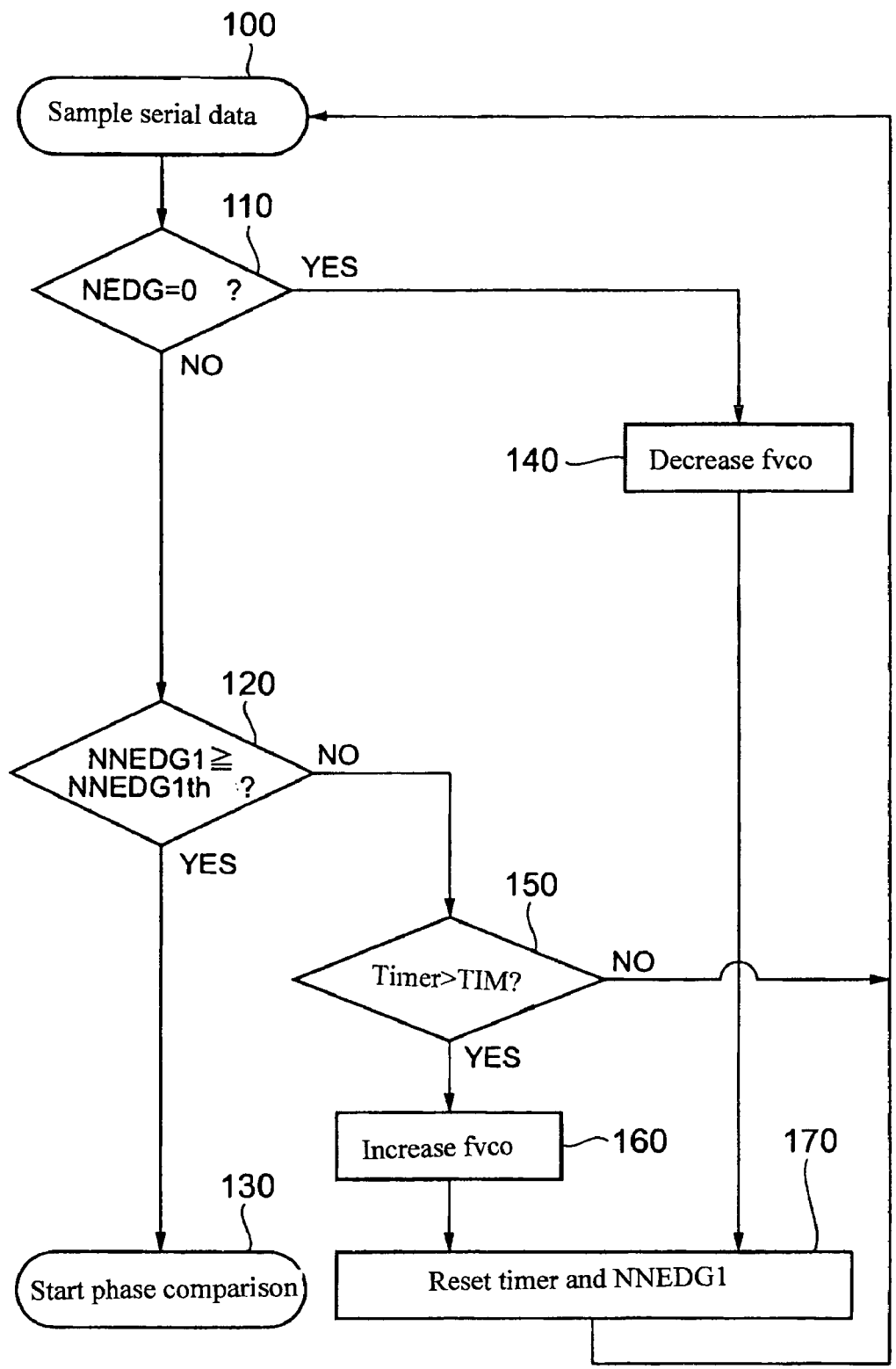
FIG. 20 is a flow chart showing a process of extracting a clock.

FIG. 20 is a flow chart showing a process of recovering the clock based on the relationship between NEDG and the magnitude relationship between fvco and fo illustrated in FIG. 18 and FIG. 19. The received serial data is sampled with sampling pulses produced by a voltage-controlled oscillator circuit to be described later (step 100). Then, based on the sampling results, the number of rising edges in the serial data within Tvco is counted, and it is determined whether or not NEDG=0 holds true (step 110). If NEDG=0 does not hold true, it is determined whether or not the number of consecutive times for which NEDG=1 holds true (NNEDG1) is equal to or greater than a predetermined value (NNEDG1th) (step 120). If NNEDG1 is equal to or greater than the predetermined value, it is determined that it has entered the capture range of the phase comparison loop, and the phase comparison is started (step 130). If NEDG=0 in step 110, it is determined that fvco is high. Then, the frequency of the voltage-controlled oscillator circuit is lowered and the timer and NNEDG1 are reset, after which the sampling process is resumed (step 140, step 170 and step 100). If the number of consecutive times for which NEDG=1 holds true does not exceed the predetermined value in step 120, it is determined whether or not the timer has exceeded a predetermined time (tTIM) (step 150). If the predetermined time is exceeded, which means that fvco is lower than fo, fvco is increased and the timer and NNEDG1 are reset, after which the sampling process is resumed (step 140, step 170 and step 100). If the predetermined time is not exceeded in step 150, the process returns to step 100.

Referring back to FIG. 16, an example of the clock recovery process flow will be described. In the phase comparison loop formed by a phase comparison circuit 10, a loop filter 20 and a voltage-controlled oscillator (VCO) 30 of a clock data recovery phase locked loop circuit 200 shown in FIG. 16, a control operation is performed so that a PLL clock (PLLCLK) obtained by dividing the frequency of a subclock generated by the voltage-controlled oscillator 30 coincides with symbol marks (the start bit and the stop bit) of the input serial data. For the phase comparison loop to operate, it is necessary for the PLL clock frequency fvco to be sufficiently close to the symbol frequency fo, i.e., within the capture range. When entering the phase comparison mode, the frequency comparison loop including a sampler 40, a frequency comparison circuit 50, a charge pump 60, the loop filter 20 and the voltage-controlled oscillator circuit 30 is used to count the number of rising edges in the serial data to obtain NEDG, and a control operation is performed so that the fundamental clock of the voltage-controlled oscillator (fvco) comes into the capture range of the phase comparison loop.

Figure 21:
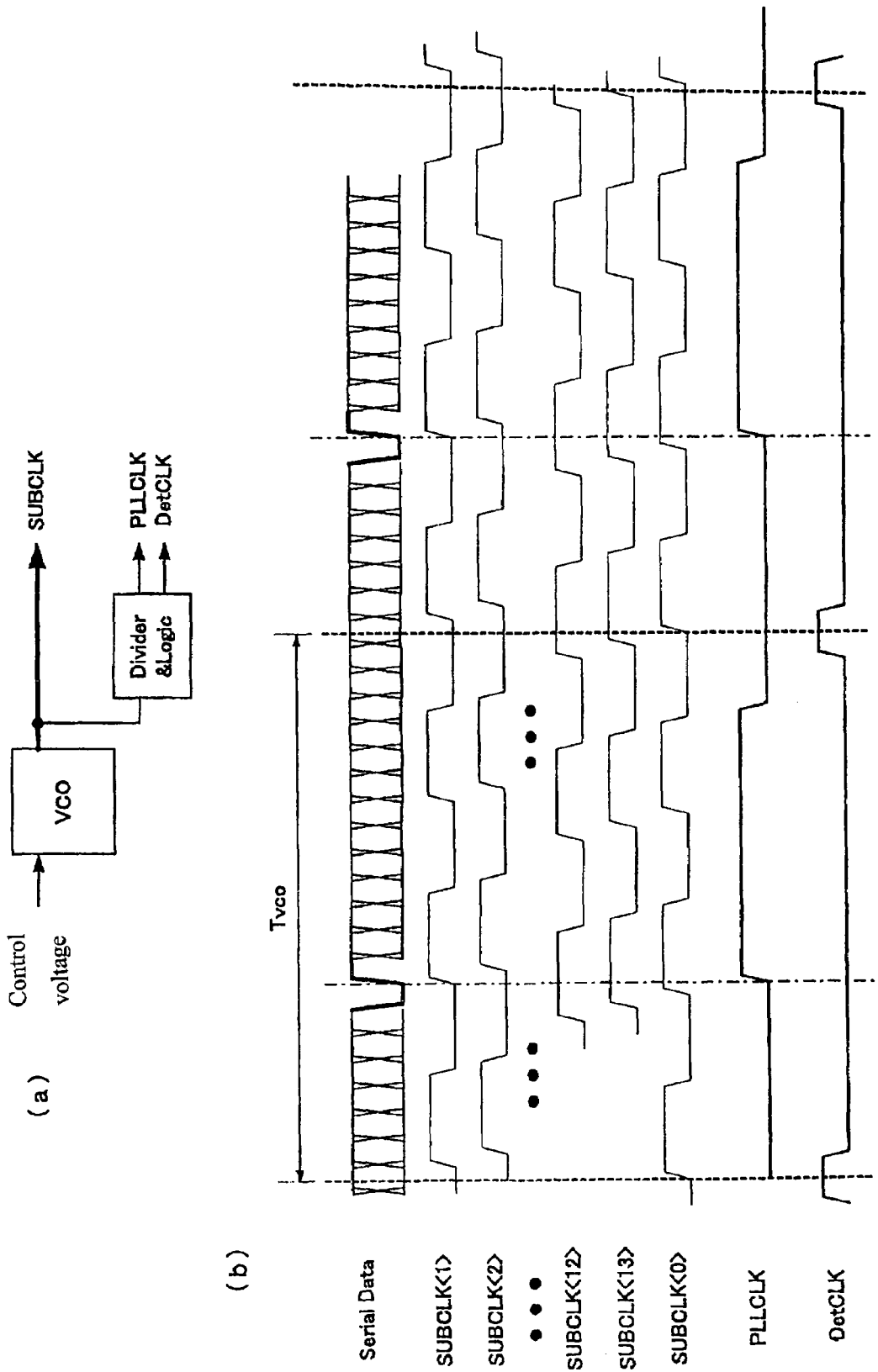
FIG. 21 is a hardware block diagram showing a circuit configuration of a voltage-controlled oscillator circuit, and a diagram showing the temporal relationship between different clocks.

The frequency comparison loop control mode will now be described. In order to sample transmitted serial data, the voltage-controlled oscillator circuit 30 generates a sampling subclock. FIG. 21 shows a circuit configuration hardware block diagram of the voltage-controlled oscillator circuit 30 being in a locked state, and a timing chart for different clocks. The voltage-controlled oscillator circuit 30 outputs a subclock (SUBCLK) of 2×21=42 phases for one symbol in order to perform ×2 oversampling. Since there are problems such as the circuit area, etc., when a multiphase clock of 42 phases is to be produced by the oscillator of the voltage-controlled oscillator circuit 30, a 14-phase subclock is produced by the oscillator and is oscillated at a frequency three times as high as that of one symbol in the present embodiment. The PLL clock (PLLCLK), which is controlled so as to coincide with the period of the symbol marks (the start bit and the stop bit) of the input serial data, is produced by trisecting one subclock by a divider logic circuit. An edge detection clock (DetCLK), which is used for determining whether or not there is an edge in Tvco using an edge detection circuit to be described later, is similarly produced through frequency division and logic operation. FIG. 21(b) shows the temporal relationship in a case where a phase comparison loop functions to lock the serial data with the 14-phase subclock of subclocks (0) to (13). For the sake of simplicity, it is assumed in the following description that Tvco is the period obtained by trisecting the output from the voltage-controlled oscillator circuit 30, and fvco is the inverse thereof.

Figure 22:
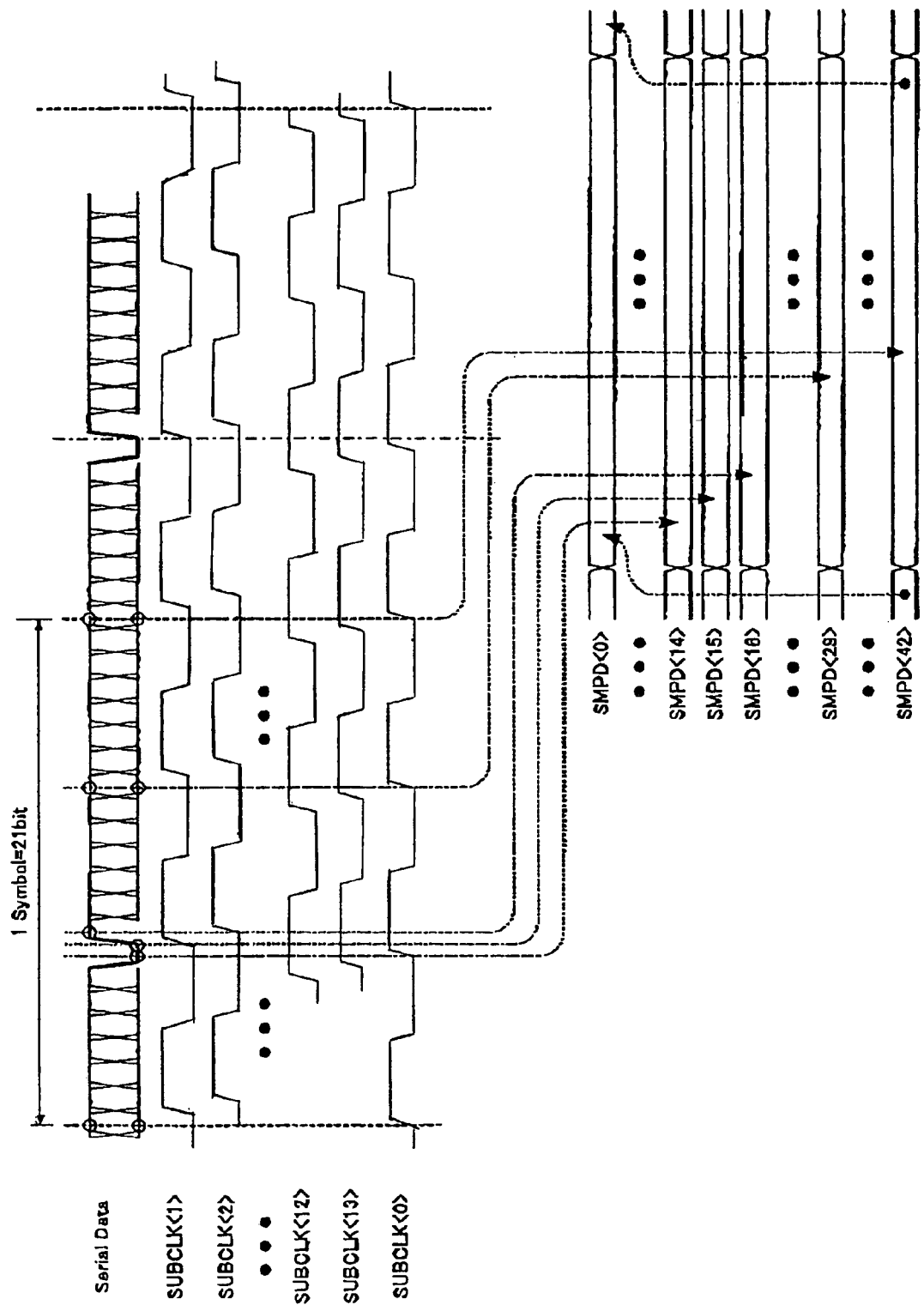
FIG. 22 is a timing chart showing serial data of input/output signal of a sampler and subclocks, and a timing chart showing sampling results.

The sampler (deserializer circuit) 40 of FIG. 16 samples the input serial data using the subclock as illustrated in FIG. 21. FIG. 22 shows the temporal relationship between the serial data and the sampling subclock, and the temporal relationship between the sampling results. It can be seen that data is sampled with a 14-phase subclock three times per one symbol period, thus realizing a 42-phase (=21 bits×2) sampling operation.

The frequency comparison circuit 50 compares the fundamental frequency (fvco) of the voltage-controlled oscillator 30 and the frequency (fo) of one symbol period of the blanking period (To) with each other based on the sampling results, and sends a control signal to the loop filter 20 via the charge pump 60 so that fo≈fvco, thus controlling fvco of the voltage-controlled oscillator circuit 30.

The frequency comparison circuit 50 includes an edge count determination circuit 51 for counting the number of sampled rising edges to determine whether the number of rising edges is one, zero or neither, a timer 53 for producing a timing pulse spanning an amount of time longer than one line period (tLine), and a frequency difference detection circuit 52 for detecting the difference between fvco and fo based on the determination and the timer output.

Figure 23:
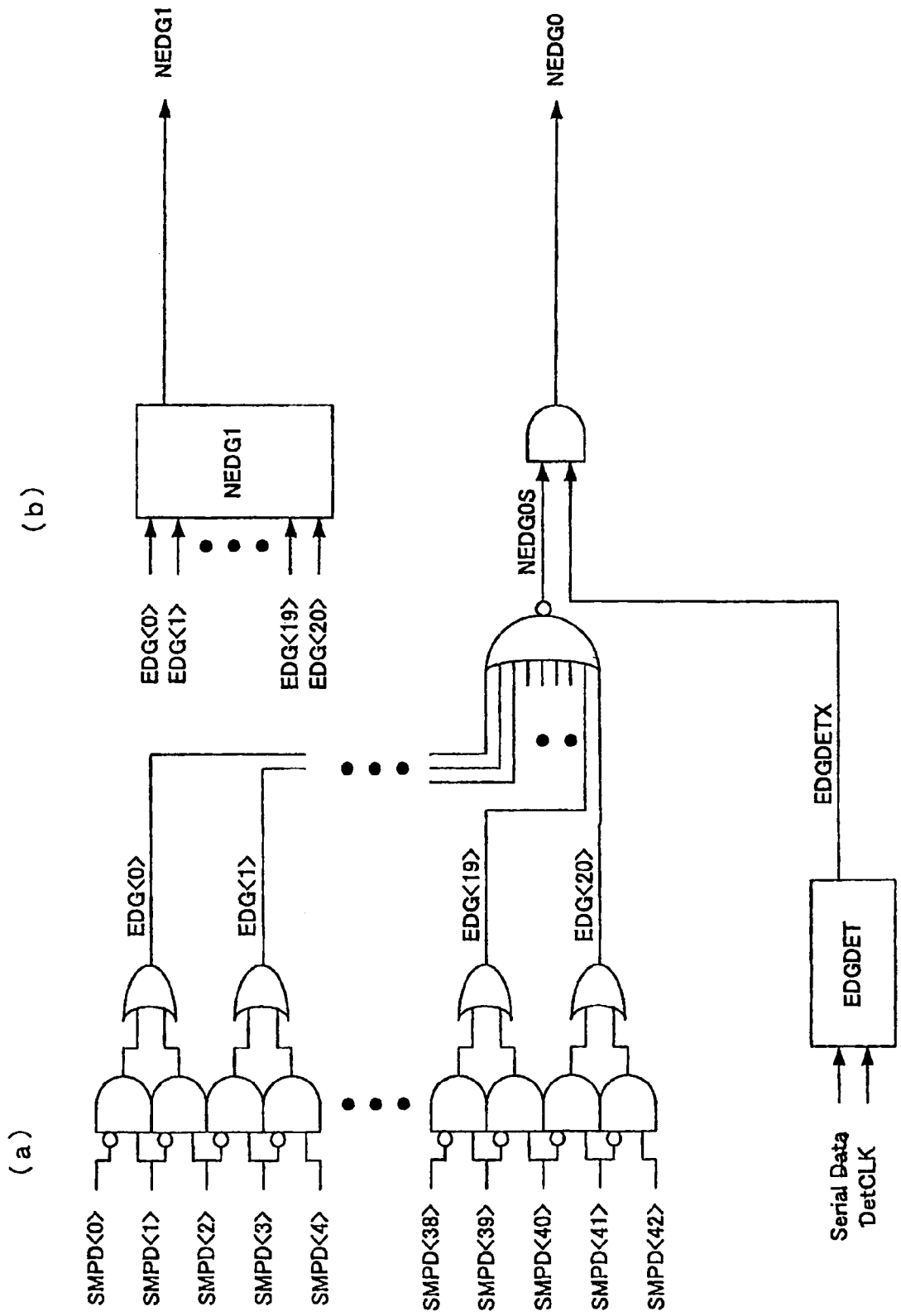
FIG. 23 is a hardware block diagram showing a circuit configuration of an edge count determination circuit.

FIG. 23 is a hardware block diagram showing a circuit configuration of the edge count determination circuit 51. The sampled signals SMPD(0) to SMPD(42) shown in FIG. 22 are input logical product circuits so that adjacent ones of the sampled signals are the non-inverted and inverted signals to one of the logical product circuits. For example, in a waveform example shown in FIG. 22, the sampled signals SMPD (14), SMPD(15) and SMPD(16) are "0", "0" and "1", respectively. When these are input to logical product circuits, the output EDG(15) will be "1" since the inputs of the 16th logical product circuit are both "1". Since this is the only output for which EDG(0 to 20) is "1" for one symbol period, the logical sum circuit of the determination circuit (NEDG1) shown in FIG. 23-b for detecting the number of rising edges being one outputs a high level.

Figure 70:
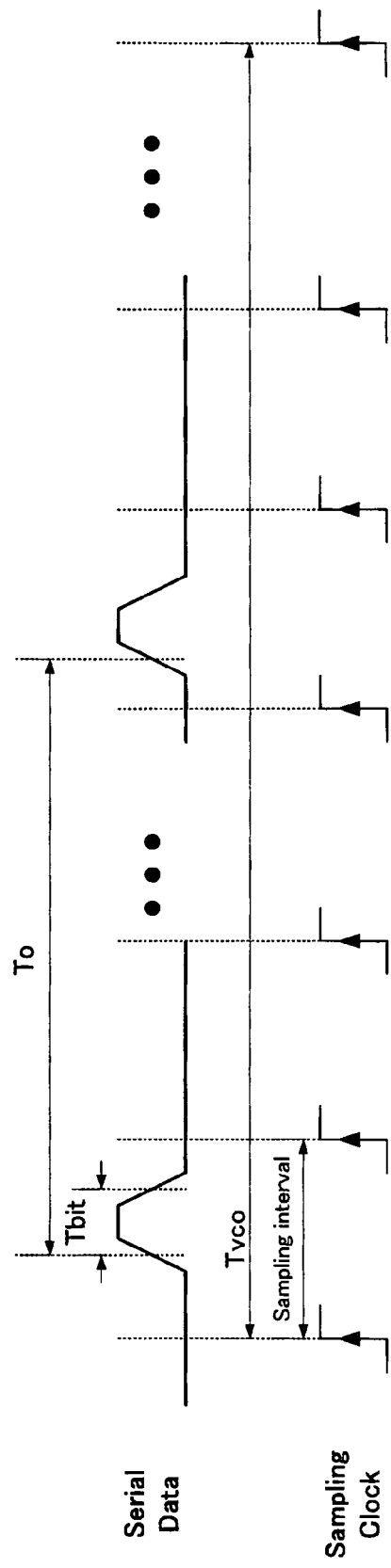
FIG. 70 is a timing chart showing the relationship between serial data and a sampling clock according to one example of the present invention.

If the sampling results are all "0" in FIG. 23(a), the signals EDG(0 to 20) are all "0", and the output from the negated logical sum circuit (NEDG0S) is "1". In such a case, judging only from the sampling results, if the fundamental frequency of the oscillator of the voltage-controlled oscillator circuit 30 is very slow, the interval between subclocks is longer than the 1-bit pulse width Tbit of serial data, as shown in FIG. 70, meaning that a rising edge may not be picked up in the sampling operation, thus failing to detect a rising edge. In order to avoid such an erroneous determination, the number of rising edges being zero is determined based on a logical product with the determination result (EDGDETX) obtained by an edge detection circuit (EDGDET) determining the presence/absence of a rising edge directly from the serial data.

Figure 24:
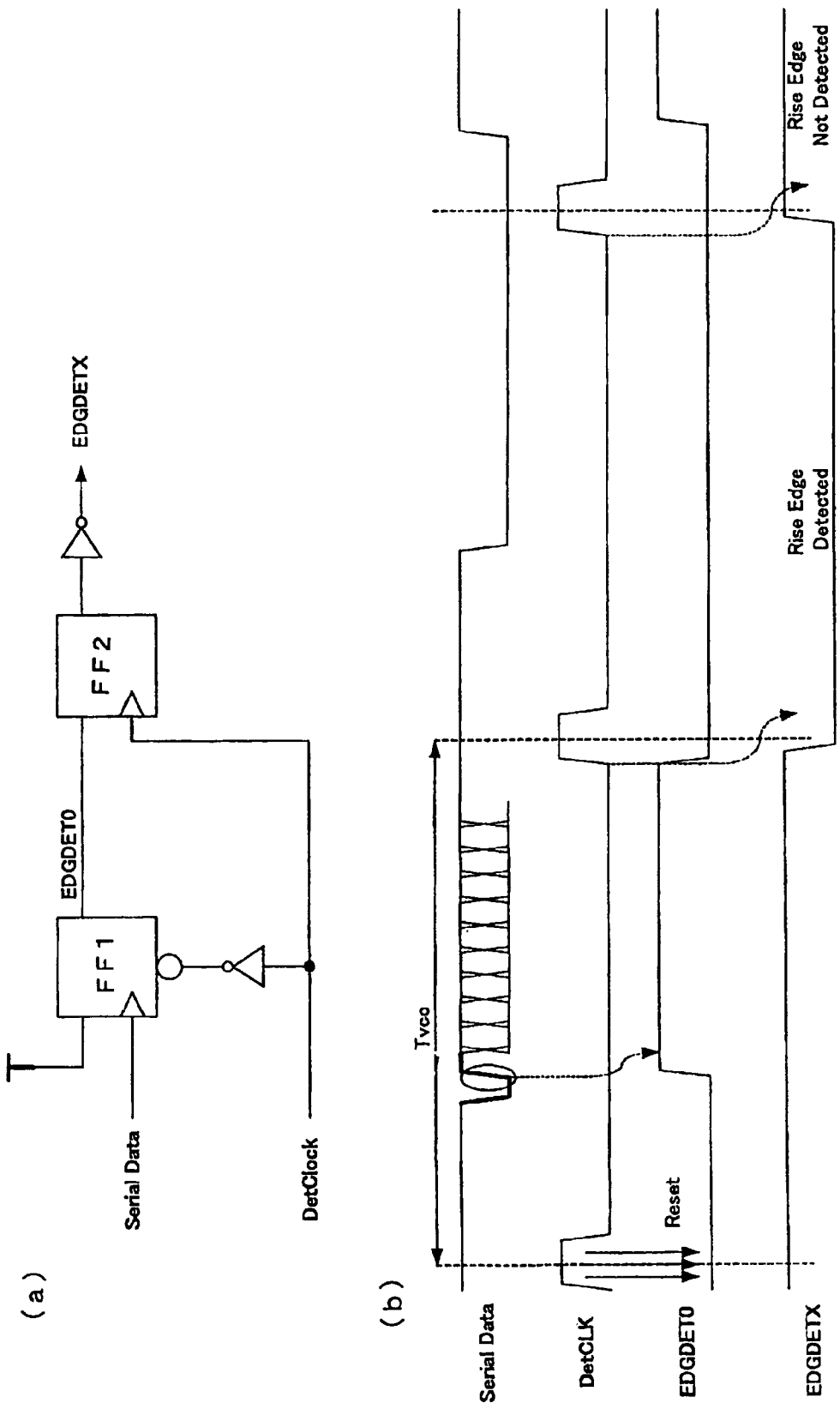
FIG. 24 is a hardware block diagram showing a circuit configuration of an edge detection circuit, and a timing chart showing input/output signals.

The edge detection circuit (EDGDET) will now be described. FIG. 24 shows a hardware block diagram showing a circuit configuration of the edge detection circuit (EDGDET), and a timing chart showing input/output signals. Referring to FIG. 24(a), the edge detection circuit receives the serial data and the edge detection clock (DetCLK) shown in FIG. 21, and detects the presence/absence of a rising edge in the serial data in the period Tvco. The edge detection clock is a signal in synchronism with Tvco. FIG. 24(b) shows a time chart. The output EDGDET0 from the flip-flop FF1 becomes "high" when a rising edge of the serial data is detected. Since FF1 is reset each time DetCLK becomes "high", EDGDET0 represents the presence/absence of a rising edge in the period during which DetCLK is "low". FF2 latches EDGDET0 with the rising edge of DetCLK, thus confirming the determination. The signal is inverted and output as EDGDETX. As shown in FIG. 24(b), if there is a rising edge in the serial data in the period during which DetCLK is "low", EDGDETX will be "low" in the following period, and if there is not a rising edge, EDGDETX will be "high" in the following period.

Figure 25:
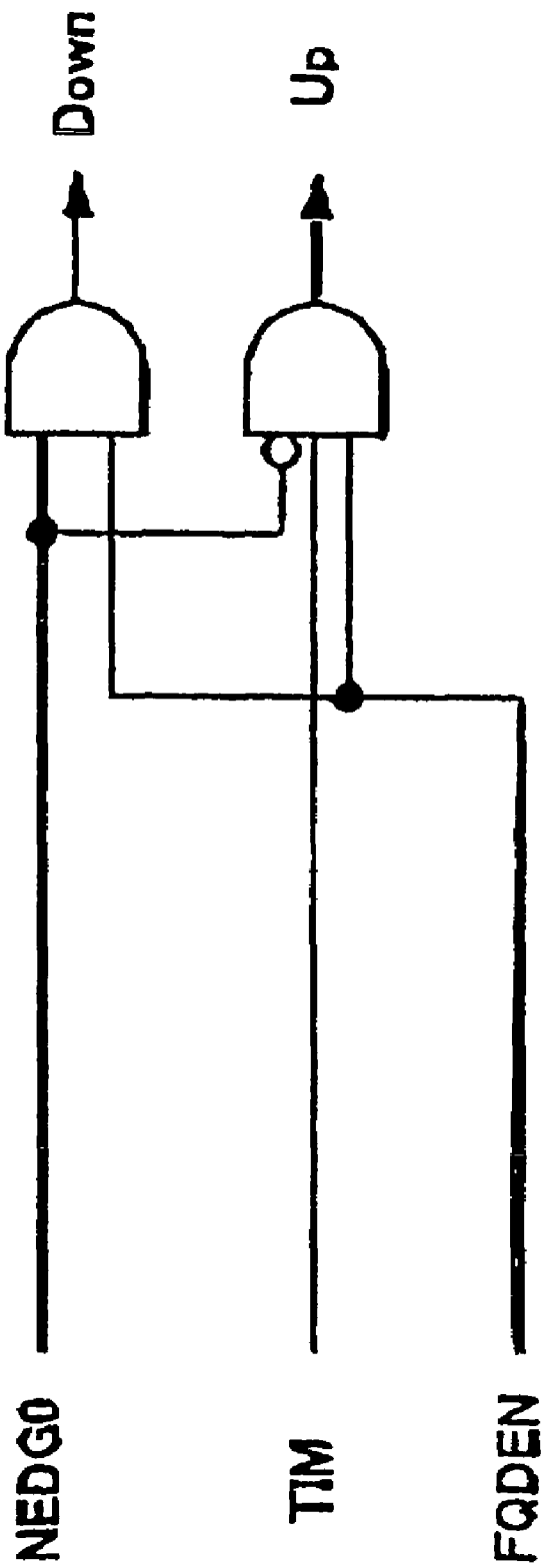
FIG. 25 is a hardware block diagram showing a circuit configuration of a frequency difference detection circuit.

As described above, the edge count determination circuit 51 outputs NEDG0 and NEDG1, each being a result of determination of the number of rising edges, and NEDG0 is input to the frequency difference detection circuit 52 and the timer 53 and NEDG1 is input to a control circuit 70. FIG. 25 is a circuit block diagram showing a circuit configuration of the frequency difference detection circuit 52. NEDG0 being input thereto means that the frequency of the fundamental clock generated by the oscillator of the voltage-controlled oscillator circuit 30 is high. Therefore, the frequency difference detection circuit 52 receiving NEDG0 takes a logical product with a signal (FQDEN) from the control circuit 70 to be described later indicating that the operation is in the frequency control mode, and outputs a frequency down signal, for decreasing the frequency, to the charge pump 60 of FIG. 16.

If NEDG0 is not asserted and NEDG1 is not asserted for a predetermined number of consecutive times or more, and such a state continues over an amount of time equal to or greater than one line scan, it means that the frequency of the fundamental clock is low. Therefore, the frequency difference detection circuit 52 obtains the logical product of the inverted signal of the low level of NEDG0, a signal (FQDEN) from the control circuit 70 for retaining the frequency control mode so as not to enter the phase control mode, and a predetermined time signal from the timer 53 to be described below, and outputs a frequency up signal for increasing the frequency. The circuit of FIG. 25 is an arbitration circuit that places a higher priority on a down signal. This is because a down determination has a higher probability than an up determination (because it can always be determined that fvco>fo if NEDG=0).

FIG. 26 is a hardware block diagram showing a circuit configuration of a timer, and a timing chart showing various signals. Referring to FIG. 26(a), the timer 53 for outputting a signal that indicates that an amount of time equal to or greater than one line has elapsed produces a predetermined time (TIM0) by counting oscillator clocks (OSCCLK), and performs an edge detection operation to produce a signal (TIM) that indicates an amount of time equal to or greater than one line scan time (tLine) shown in FIG. 17. The oscillator uses, as its enable signal (Enable), the signal (FQDEN) indicating that the operation is in the frequency control mode, and the counter uses, as its reset signal (RSTn), the logical product between FQDEN and the inverted signal of NEDG0. The interval between TIM signals is not limited to a particular interval as long as it is sufficiently longer than one line. Therefore, a very high temporal precision is not required for the period of the TIM signal. Therefore, the oscillator may be an oscillator of a lower precision, such as an RC oscillator or a ceramic oscillator. The temporal relationship between the signals is shown in the timing chart of FIG. 26(b).

Figure 27:
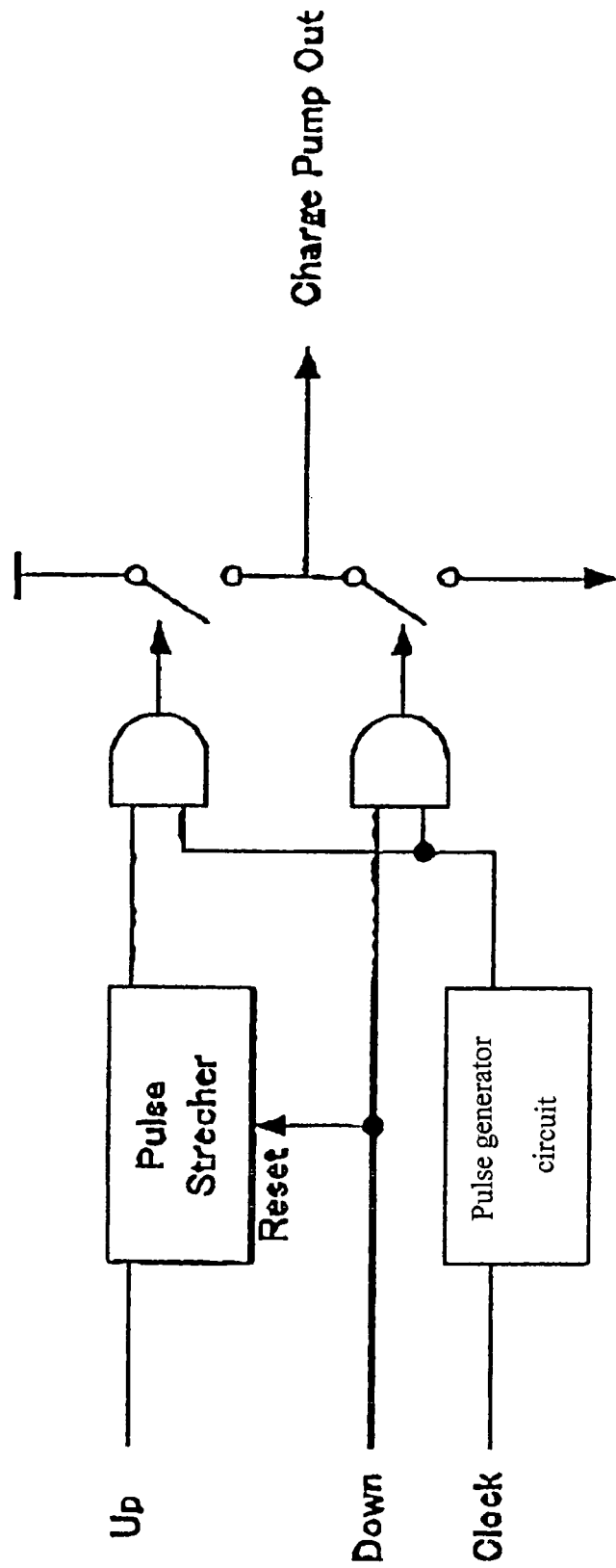
FIG. 27 is a circuit block diagram showing a configuration of a charge pump.

FIG. 27 is a circuit block diagram showing a circuit configuration of the charge pump 60. The charge pump 60 receives the output from the frequency difference detection circuit 52, and outputs a charge/discharge current pulse for controlling the frequency to the loop filter 20 of FIG. 16. The current pulse is produced by a pulse generator circuit based on the clock (CLK) from the voltage-controlled oscillator circuit 30. Since up signals for increasing the frequency are less frequent than down signals, if an up signal is input, a greater amount of charge is charged than the amount of charge to be discharged in response to a down signal. For example, in FIG. 27, an up signal is stretched by a pulse stretcher. Alternatively, the charge current can be set to be greater than the discharge current. The charge current pulse is produced by using the logical product between the charge current pulse and the stretched up signal, and the discharge current pulse is produced by using the logical product with the down signal, and the produced pulses are output to the loop filter 20. The voltage-controlled oscillator circuit 30 oscillates at a frequency according to the voltage of the loop filter 20. Thus, when an up signal is input, a greater amount of charge is charged than the amount of charge to be discharged in response to a down signal, or the charge current is set to be greater than the discharge current. Therefore, it is possible to quickly bring the oscillation frequency of the voltage-controlled oscillator circuit 30 into the capture range.

Figure 28:
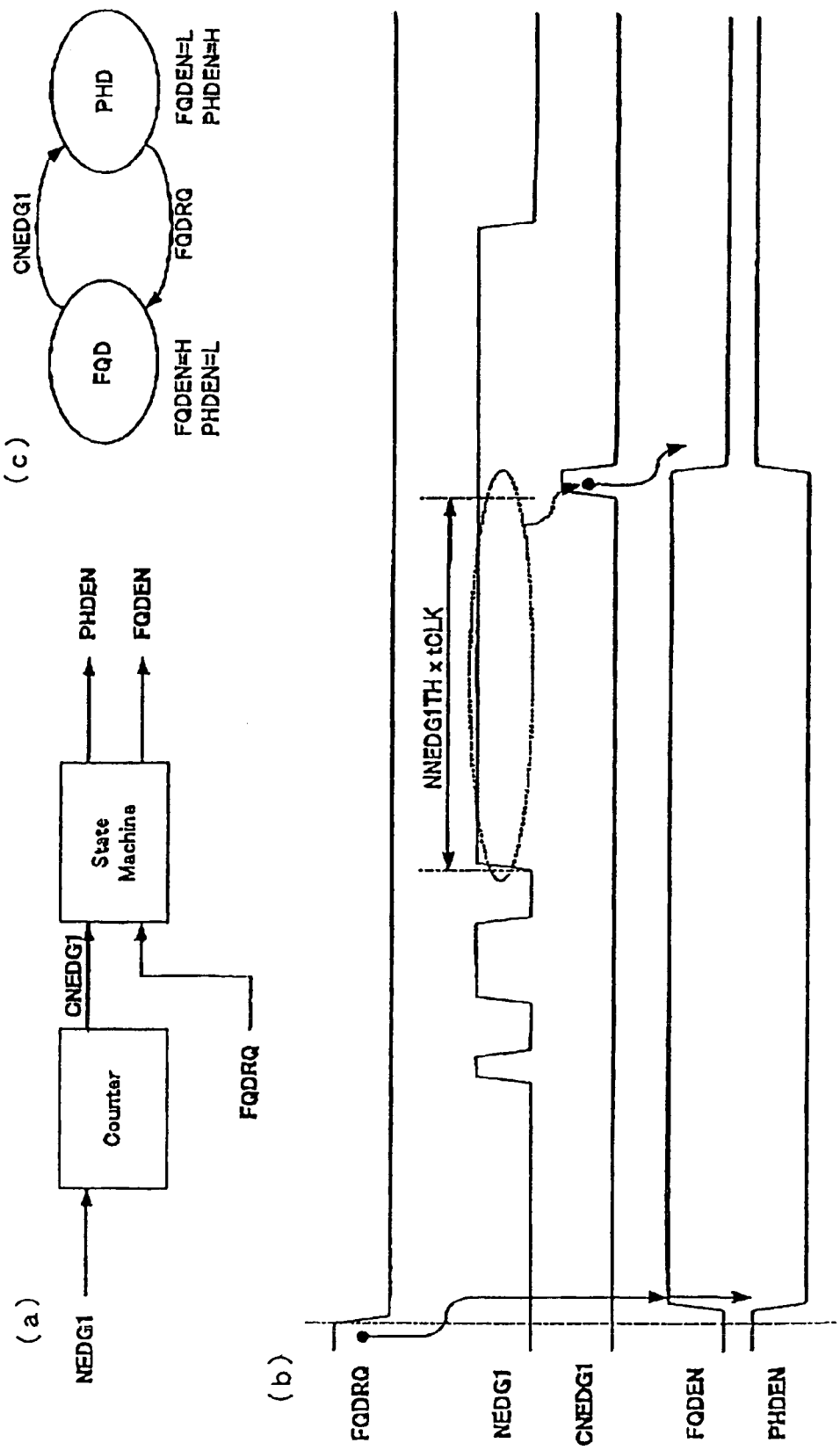
FIG. 28 is a hardware block diagram showing a circuit configuration of a control circuit, a timing chart thereof, and a state transition diagram showing a control operation thereof.

FIG. 28 is a circuit block diagram showing a configuration of the control circuit 70, a timing chart thereof, and a state transition diagram showing a control operation thereof. Referring to FIG. 28(*a*), the control circuit 70 receives the NEDG1 signal from the edge count determination circuit 51 and counts the number of consecutive inputs thereof with a counter, and outputs CNEDG1 when the count exceeds a predetermined value. A state machine, connected at a position following the counter, receives CNEDG1 and a signal (FQDRQ), which is output from the phase comparison circuit 10 at power-on or when the phase comparison loop can no longer be drawn in, and produces a phase comparison enable signal (PHDEN) and a frequency control enable signal (FQDEN). The state machine outputs PHDEN to the phase comparison circuit 10 and FQDEN to the frequency difference detection circuit 52 and the timer 53, thus switching the phase comparison loop and the frequency comparison circuit from one to another. FIG. 28(*c*) is a state transition diagram of the state machine.

Referring to FIG. 28(*b*), FQDEN rises in response to FQDRQ to set the clock data recovery phase locked loop circuit 200 in the frequency control mode. When the number of NEDG1 signals counted by the counter exceeds a predetermined value, the CNEDG1 signal rises to reset FQDEN while bringing PHDEN high to set the clock data recovery phase locked loop circuit 200 in the phase comparison control mode. The state transitions are shown in FIG. 28(*c*).

Figure 29:
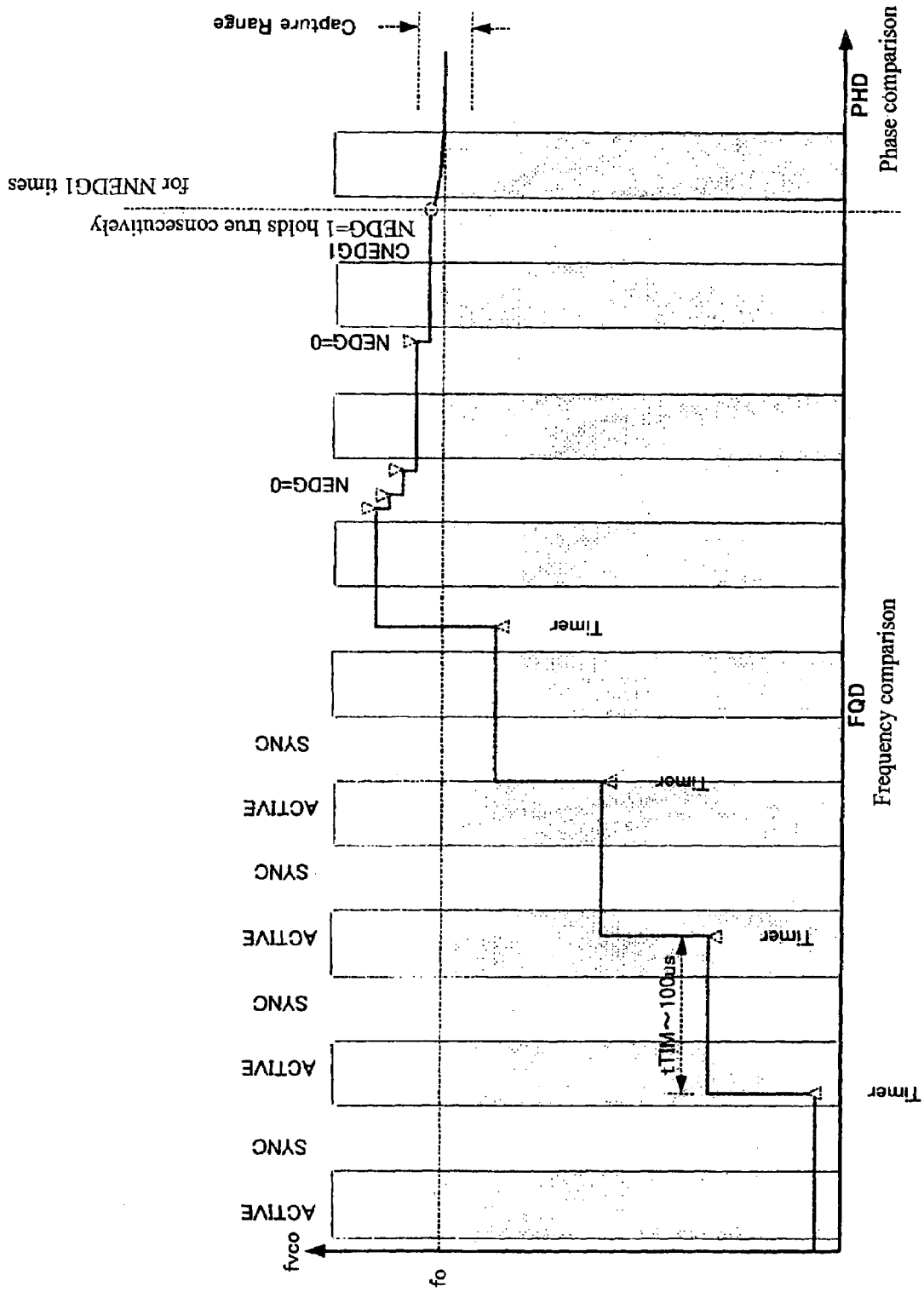
FIG. 29 is a graph showing transitions over time of the frequency of a voltage-controlled oscillator in a clock extraction process.

FIG. 29 shows transitions of the frequency of the voltage-controlled oscillator 30 from start-up until the locked state is achieved. The operation is first in the frequency comparison mode, and the fundamental frequency (fvco) of the voltage-controlled oscillator 30 is controlled by the frequency comparison circuit 50 to gradually approach the frequency (fo) of one symbol period (To) of the blanking period, enters the capture range and is then locked. If fvco is significantly low with respect to fo, the frequency is increased repeatedly at an interval set by the timer 53. When fo is exceeded, the frequency decreases each time NEDG=0 is detected. If NEDG=1 holds true consecutively at a certain point in time, it is detected by the control circuit 70, and if the number of consecutive times exceeds a predetermined value, it is determined that the frequency has entered the capture range, thus transitioning to the phase control mode, whereby the frequency is locked by the phase comparison circuit 10.

As described above, according to the present invention, it is possible to extract the reference clock from only the serial data. The present invention does not require a reference clock, which is necessary in the prior art for adjusting the frequency into the capture range, and does not require reverse-direction transfer from the receiver side to the transmitter side. Therefore, it is possible to realize a transfer system with a simple configuration, and it is possible to perform high-quality data transfer operations at low cost. Means for realizing the functions described above do not limit the present invention, and may be any circuits or devices as long as they can implement the functions, and some of the functions may be implemented in the form of software.

As described above, with the data transfer system of the present embodiment, color signals and synchronization signals can be serially transferred while being clearly distinguished from each other, and the clock can be reliably extracted on the receiver side. A superior advantage of the present invention is that it does not require a handshake operation using a training signal and an acknowledge signal between the transmitter unit and the receiver unit, which is performed in the prior art.

With the digital data transfer system of the present embodiment, serial digital data can be transferred from the transmitter unit to the receiver unit by using a pair of wires (including the use of an optical fiber). Where the present invention is applied to optical fiber transfer, an E/O converter element is provided, in place of the output buffer 2506, in the transmitter unit 2501 so as to convert an electrical serial signal to an optical serial signal and output the optical signal to the optical channel, and an O/E converter element is provided, in place of the input buffer 2527, in the receiver unit 2521 so as to convert an optical serial signal to an electrical serial signal for subsequent processes. The optical fiber transfer has a high cost per one channel including the transmission/reception system. Where the present invention is used in optical fiber transfer, it no longer requires full-duplex communications for a handshake operation using a training signal and an acknowledge signal, which is necessary for conventional optical fiber transfer, and so it is not necessary to increase the number of fibers, thus presenting a significant cost reduction.

While Hsync, Vsync and CTRL are transferred as the second information in the second period (blanking period) in the data transfer system of the present embodiment in the above description, information that can be transferred as the second information is not limited to Hsync, Vsync and CTRL, and information whose amount of information per unit time is smaller than that of the first information (e.g., sound data, text information, etc.) can be transferred as the second information.

With the digital data transfer system of the present embodiment, it is not necessary to provide a clock input from a quartz oscillator or an external oscillator to the clock extraction circuit of the receiver unit, which means that even if the size of an image represented by serial digital data changes, the system can automatically follow the changes, and the system is in compliance with plug and play.

While the focus is placed on the rising edge of serial data in the embodiment above, it may alternatively be placed on the falling edge, and the present invention can be carried out with the same effects even if the rising edge and the falling edge are switched around in the description of the embodiment above.

EXAMPLE 1

The present example is directed to an alternative example of the first encoder circuit 2504*a* in the digital data transfer system of the present invention as described in the embodiment above. Other elements are as described in the embodiment above, and will not be further described below.

Figure 30:
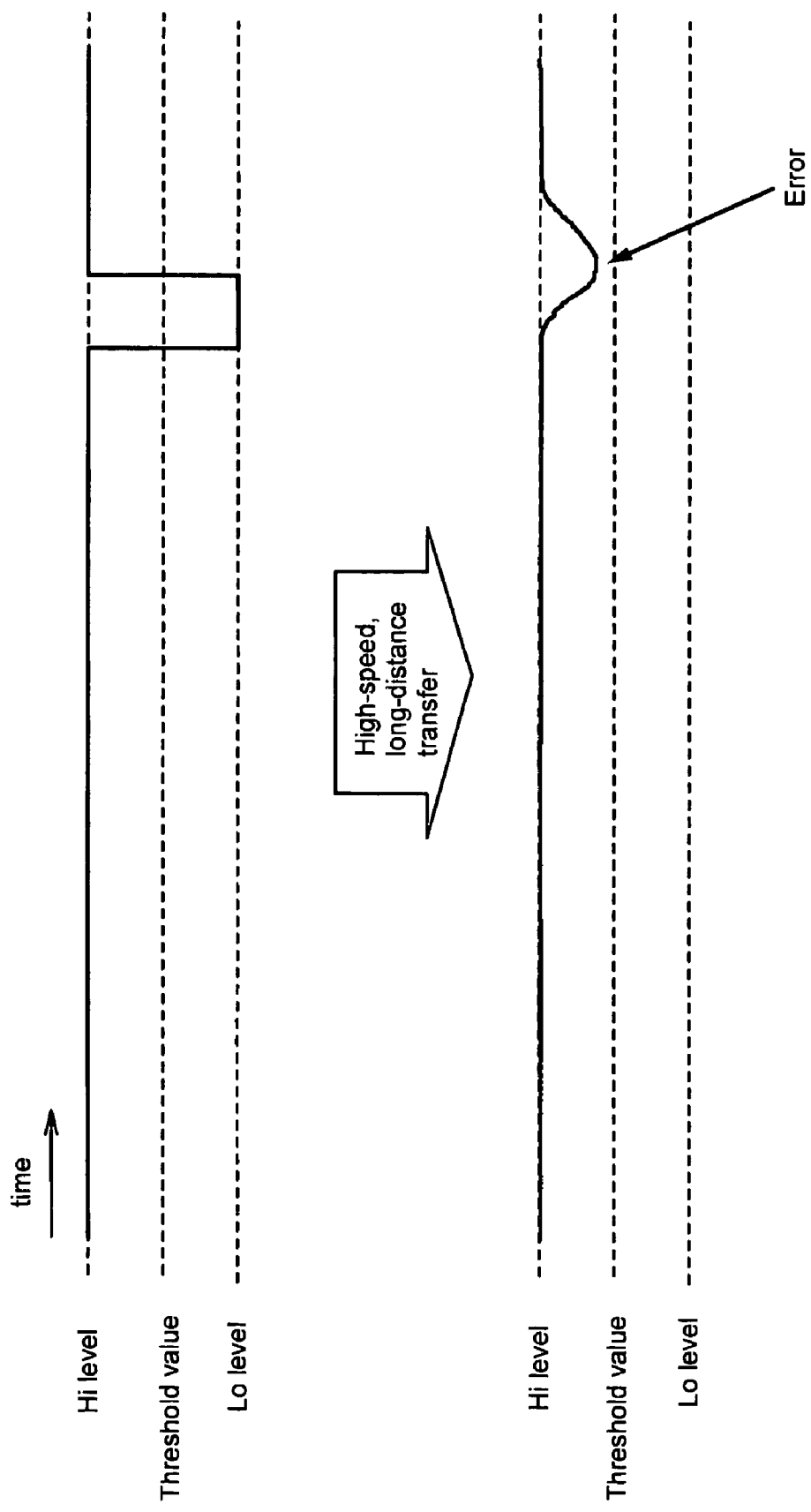
FIG. 30 is a diagram illustrating a data error occurring in a serial transfer of digital data.

Referring to FIG. 30, FIG. 30 is a diagram illustrating an example of a data error occurring in a serial transfer of digital data. In a data transfer system such as that of the present invention, serial digital data is transferred at a high speed via a pair of wires or cables. Therefore, when data is transferred over a long distance by increasing the wire length or the cable length, or when the wires or cables have poor characteristics, the waveform of the digital data may become smoothed, and bit errors are more likely to occur due to ISI (Intersymbol Interference). Such a data error is significant when low-level data is transferred after high-level data were being transferred for a while, as shown in FIG. 30. With data transfer as shown in FIG. 30, the data waveform cannot exceed the threshold value on the receiver unit side, thus causing a data error.

Figure 31:
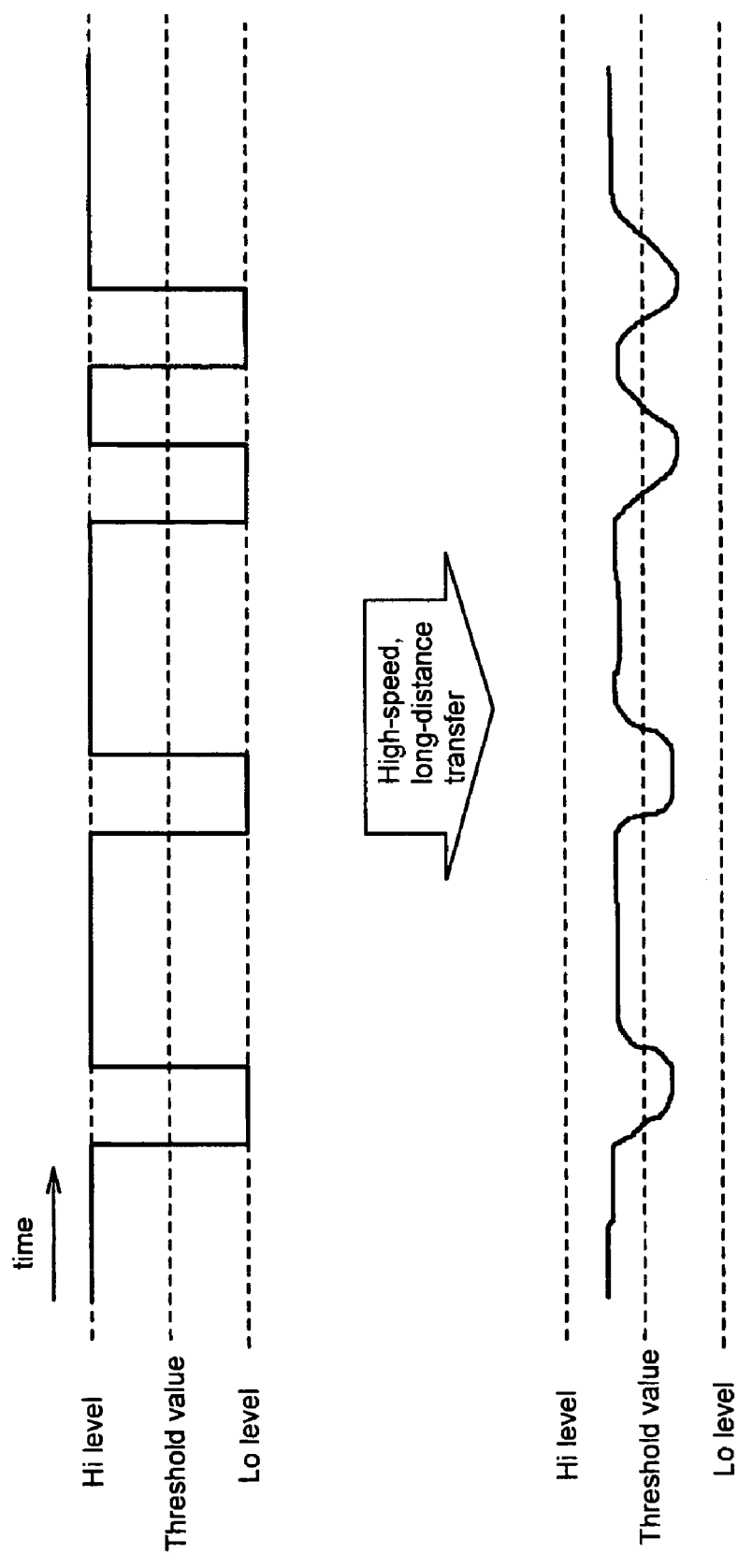
FIG. 31 is a diagram illustrating a serial transfer of digital data with no data errors.

As a result of reviewing the problem above, the present inventors discovered that it is possible to suppress the smoothing of a data waveform and to prevent a data error by ensuring that the same bit value does not occur a number of consecutive times or more, as shown in FIG. 31.

Then, in order to solve the problem above, the present inventors developed an encoding method used in a digital data transfer operation capable of providing long-distance transfer of serial digital data with suppressed error occurrence without being influenced by the characteristics of the wire or cable.

Figure 32:
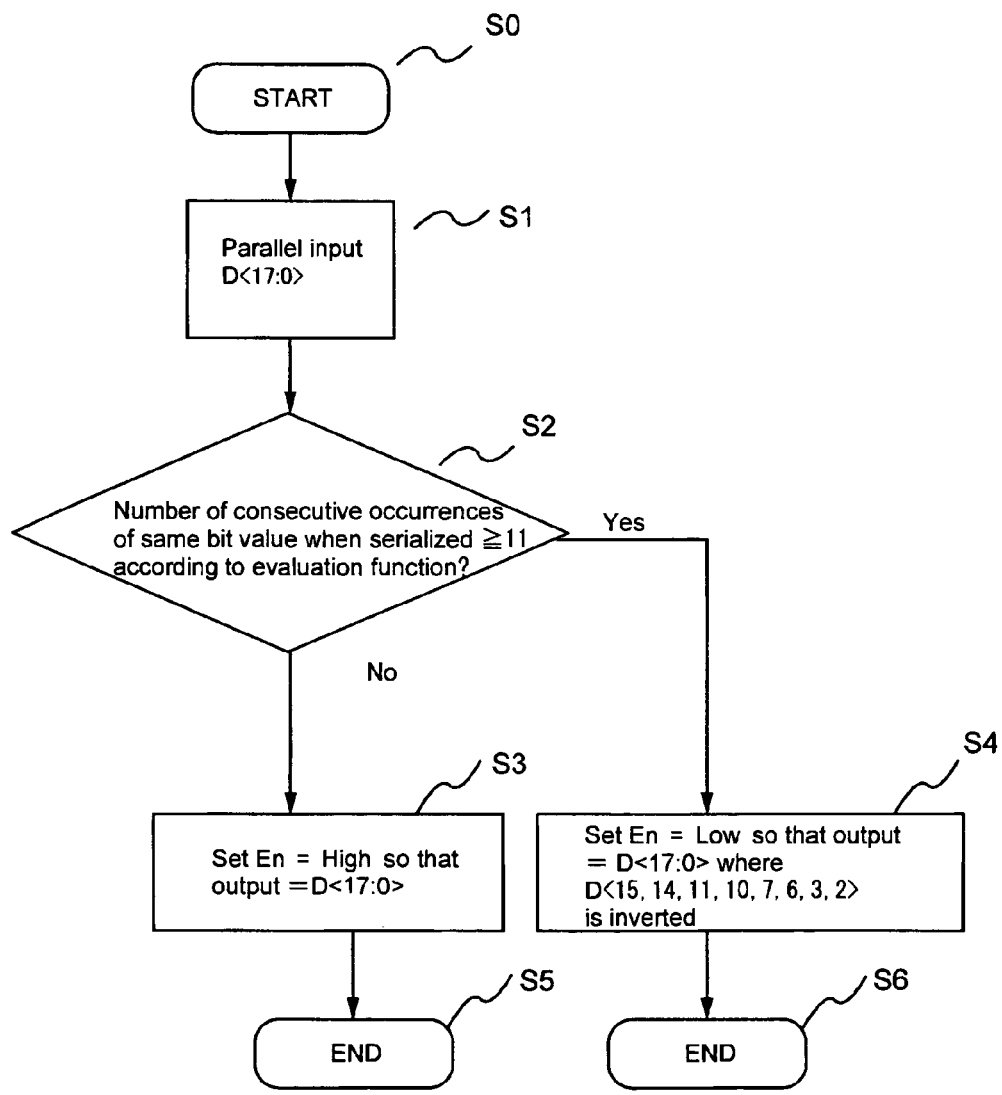
FIG. 32 is a flow chart showing an encoding method according to one example of the present invention.

Referring to FIG. 32, FIG. 32 is a flow chart showing an encoding method used in the first encoder circuit 2504a of the transmitter-side unit in the digital data transfer system according to the present example. First, the first information D <17:0> is input (step S1). Then, a particular evaluation function is used to estimate the number of consecutive occurrences of the same bit value for serial data obtained by encoding and then serializing the first information D <17:0>. In the present example, it is evaluated whether or not the number of consecutive occurrences of the same bit value is 11 or more (step S2).

Figure 34:
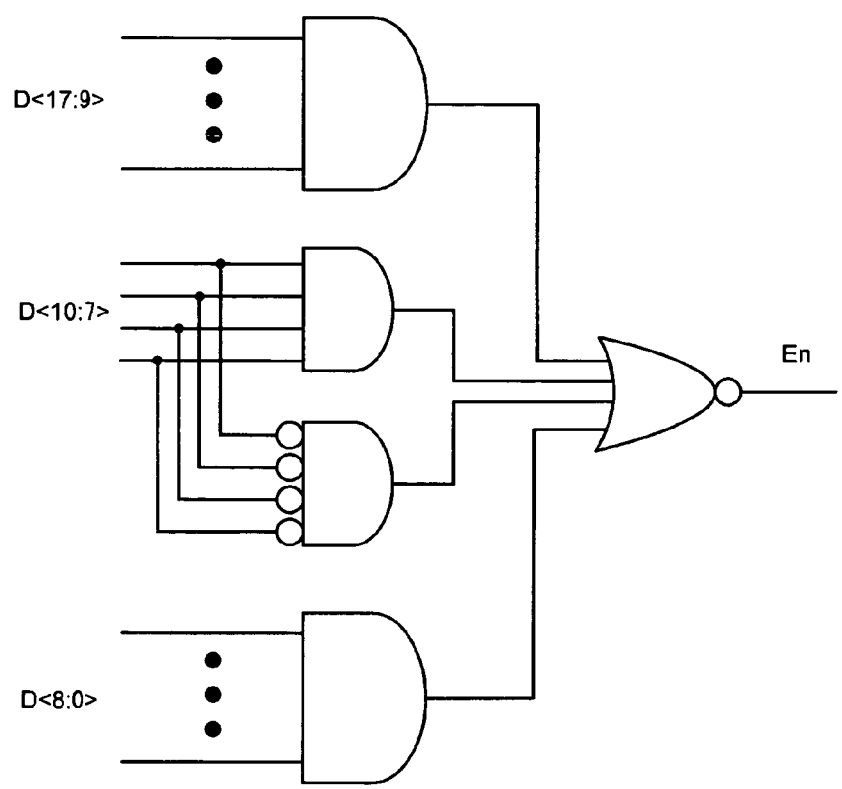
FIG. 34 is a circuit configuration diagram showing an evaluation function according to one example of the present invention.

The determination circuit for performing the evaluation may be, for example, a circuit show in FIG. 34, including four AND circuits and one NOR circuit in combination. By estimating the serial data obtained by serializing the first information based on the determination circuit and switching the encoding mode from one to another as will be described below, it is possible to ensure that the number of consecutive occurrences of the same bit value for the serial data is 10 or less. The determination circuit performs the determination while dividing the first information D <17:0> into three blocks of D <8:0>, D <10:7> and D <17:9>. En is "high" if all of the four bits of D <10:7> at the center of one symbol are of the same bit value, and En is also "high" if the bits are all "1" in D <8:0> or in D <17:9>. It is determined whether or not all of the four bits of D <10:7> at the center are of the same bit value. Therefore, when it is determined that the number of consecutive occurrences is equal to or greater than 11, every other 2-bit portion is inverted as will be described below, thereby ensuring that there is a transition in the four bits of D <10:7> at the center. Note that in the present example, by using the determination circuit and switching the encoding mode in the combined logic circuit from one to another so that the number of consecutive occurrences of the same bit value for the serial data obtained through encoding and subsequent serialization will not be equal to or greater than 11 (serial digital data length 18 (bits)/2+2=11). However, the combination of the determination circuit and the encoding mode of the combined logic circuit is not limited thereto. For example, if the serial digital data length is m bits, an evaluation function and an encoding mode of the logic circuit are combined together so that the number of consecutive occurrences of the same bit value will be (n/2+2).

If it is estimated by the evaluation function described above that the number of consecutive occurrences of the same bit value for the serial data obtained through encoding and subsequent serialization will not be equal to or greater than 11 (i.e., it will be less than or equal to 10), the encode bit (En) as the determination signal is set to "high", and the data is encoded so that D <17:0> is output as it is (step S3), thus exiting the encoding process (step S5). If the encode bit (En) as the determination signal is set to "low", part of the parallel input D <17:0>, i.e., D <15, 14, 11, 10, 7, 6, 3, 2>, is inverted to obtain output data (step S4), thus exiting the encoding process (step S6). Then, the serializer circuit 2502 serializes the parallel data D <17:0>+En to transmit the obtained data as serial digital data to the receiver unit 2521. When serializing the encoded data, the serializer circuit 2502 adds a "high" start bit at the beginning of one symbol of the serial data and a "low" stop bit at the end thereof.

Figure 33:
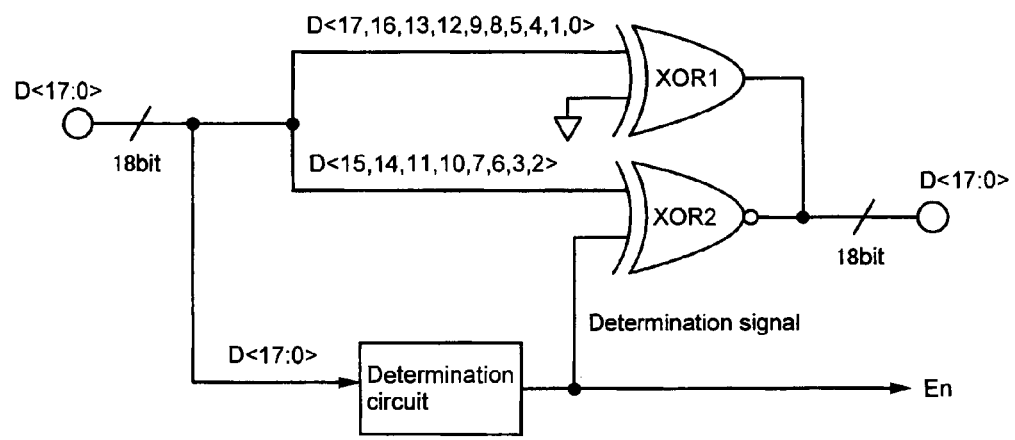
FIG. 33 is a circuit configuration diagram showing an encoder circuit according to one example of the present invention.

FIG. 33 shows a circuit configuration diagram of the first encoder circuit 2504a of the present example. The determination circuit 2504a-2 receives parallel 18-bit input color data D <17:0> as it is. D <17, 16, 13, 12, 9, 8, 5, 4, 1, 0> of the input color data D <17:0> are input to one input terminal of each XOR circuit 1, and D <15, 14, 11, 10, 7, 6, 3, 2> of the input color data D <17:0> are input to one input terminal of each XOR circuit 2. The other input terminal of each XOR circuit 1 receives "low", and the other input terminal of each XOR circuit 2 receives the determination signal, being the output of the determination circuit. Each XOR circuit 2 outputs D <15, 14, 1, 10, 7, 6, 3, 2> as they are if the determination signal of the determination circuit 2504a-2 is "high", and outputs inverts D <15, 14, 1, 10, 7, 6, 3, 2> if the determination signal of the determination circuit 2504a-2 is "low". The determination signal is used also as the data enable (En). Then, the output from each XOR circuit 1 and the output from each XOR circuit 2 are added together to form 18-bit output data. As described above, with the circuit configuration of the first encoder circuit 2504a as shown in FIG. 33, it is possible to realize the encoding process of the flow chart shown in FIG. 32.

By using the encoding method of the present example, it is possible to form serial data in which the same bit value does not occur a number of consecutive times or more. Therefore, by transferring serial data that has been serialized using the encoding method, it is possible, in the determination of the received digital signal, to suppress the influence of the smoothing of a data waveform due to channel characteristics, etc., making it possible to improve the data error rate.

EXAMPLE 2

Example 2 is an alternative example of the encoding method of the data transfer system described in the embodiment above. Other elements are as described in the embodiment above, and will not be further described below.

It is characteristic of the present example that the transmitter unit 2501 includes a DC balance circuit, and the encoding process is performed so as to ensure a DC balance of the serial data. The DC balance circuit counts the total number of "high"s (=1) and the total number of "low"s (=0) in the encoded data, and feeds back to the evaluation function a signal according to the counts. The feedback operation is for selecting encoding mode in the evaluation function so that the total number of "high"s (=1) and the total number of "low"s (=0) in the encoded data converge to the same number. The function of the DC balance circuit as described above will be referred to as a DC balance operation.

Figure 35:
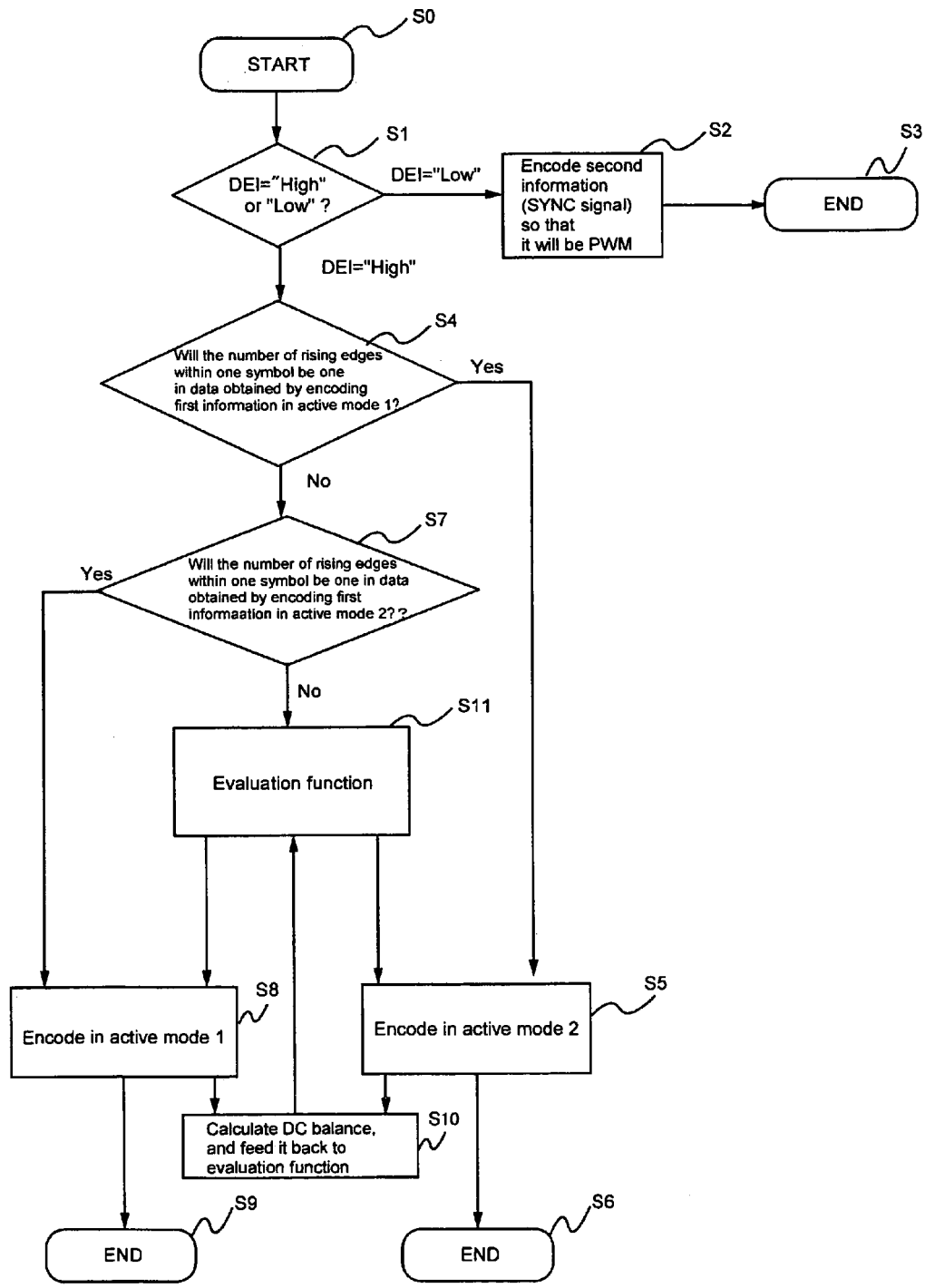
FIG. 35 is a flow chart showing an encoding method according to one example of the present invention.

The encoding method in the data transfer system of the present example will now be described in detail with reference to FIG. 35. FIG. 35 shows a flow chart of the encoding method of the present example.

First, it is determined whether input DEI is "high" or "low" (step S1). If DEI="low", the second information (HsyncI, VsyncI and CTRLI) is modulated by pulse width modulation (PWM) so that the modulated data has a data structure where there is only one rising edge within one symbol (step S2), thus exiting the second information encoding process (step S3).

If DEI="high" in step S1, it is determined whether or not the number of rising edges will be one when the first information (input color data (RI5 to RI0, GI5 to GI0, BI5 to BI0)) is encoded in the active mode 1 and then serialized (step S4). If it is determined that the number of rising edges will be one, the input color data (RI5 to RI0, GI5 to GI0, BI5 to BI0) is encoded in the active mode 2 (step S5), thus exiting the first information encoding process (step S6). The data encoded in the active mode 2 is input to the DC balance circuit, and the total number of "high"s and the total number of "low"s in the data are counted (step 10). If it is determined that the number of rising edges will not be one when the input color data (RI5 to RI0, GI5 to GI0, BI5 to BI0) is encoded in the active mode 1 and then serialized, the process proceeds to step 7.

In step 7, it is determined whether or not the number of rising edges will be one when the input color data (RI5 to RI0, GI1 to GI0, BI5 to BI0) is encoded in the active mode 2 and serialized (step S7). If it is determined that the number of rising edges will be one, the input color data (RI5 to RI0, GI5 to GI0, BI5 to BI0) is encoded in the active mode 1 (step S8), thus exiting the first information encoding process (step S9). The data encoded in the active mode 1 is input to the DC balance circuit, and the DC balance circuit counts the total number of "high"s and the total number of "low"s in the data (step 10). If it is determined that the number of rising edges will not be one when the input color data (RI5 to RI0, GI5 to GI0, BI5 to BI0) is encoded in the active mode 2, the process proceeds to step S11.

In step S11, it is evaluated, based on a predetermined evaluation function, whether the encoding operation is to be performed in the active mode 1 or in the active mode 2 to select the active mode 1 (step S8) or the active mode 2 (step S5). The first information is encoded in the selected encoding mode, and the process exits the first information encoding process (step S9 or step S6). In step S11, the total number of "high"s and the total number of "low"s in the encoded data are input from the DC balance circuit to the evaluation function. The evaluation function selects whether the information is to be encoded in the active mode 1 or in the active mode 2 so that the total number of "high"s and the total number of "low"s will converge to the same number. Note that in step S11, whether the first information is encoded in the active mode 1 or in the active mode 2, it will not be the same as the serial data in a case where DEI="low" (where the number of rising edges is one).

As described above, the DC balance circuit counts the total number of "high"s and the total number of "low"s in data obtained by encoding the first information. Alternatively, the DC balance circuit may count the total numbers not only in the data obtained by encoding the first information but also in the data, plus at least one of the start bit, the stop bit and the En bit. In such a case, since it is predetermined in the serializer circuit whether the start bit, the stop bit and the En bit are "high" or "low", the DC balance circuit may store the information in advance so that it can count the total numbers including the start bit, the stop bit and the En bit. It is also preferred that data obtained by encoding the second information is further input to the DC balance circuit so as to count the total number of "high"s and the total number of "low"s in the data obtained by encoding the second information and the start bit, the stop bit, etc., of one symbol of the second information, whereby the entirety of the serial data 2515 to be serially transferred will be DC-balanced.

Through the encoding operation as described above, serial data encoded when DEI="low" and that encoded when DEI="high" are clearly distinguished from each other with respect to whether the number of rising edges within one symbol is one (DEI="low") or two (DEI="high").

Through the operation as described above, the input color data 2511 being first information and the input synchronization data 2512 being second information, which are input as parallel data, are encoded and then serialized, and transferred as the serial data 2515 from the transmitter unit 2501 to the receiver unit 2521. In the present example, a DC balance operation is performed so that the total number of "high"s and the total number of "low"s in the serial data 2515 will converge to the same number, making it possible to maintain the DC balance of the serial data 2515.

In the receiver unit 2521, the received serial data 2515 is deserialized by the deserializer circuit 2522 and is input to the decoder circuits 2524. The operation of the receiver unit 2521 is as described in the embodiment above, and will not be further described below.

As described above, with the encoding method and the decoding method of the digital data transfer system of the present example, data can be serially transferred while clearly distinguishing the color signal and the synchronization signal from each other, and it is possible to reliably extract the clock on the receiver side.

Moreover, in the data transfer system of the present example, serial digital data can be transferred from the transmitter unit to the receiver unit by means of a pair of wires (including the use of an optical fiber). Since the system does not require a handshake operation using a training signal and an acknowledge signal, which is performed in the prior art between the transmitter unit and the receiver unit, it is possible to realize a data transfer system with a simple configuration. Particularly, where the present invention is used in optical fiber transfer, it no longer requires a full-duplex communications system necessary for a handshake operation using a training signal and an acknowledge signal, thus presenting a significant cost reduction for the system.

With the digital data transfer system of the present example, it is possible to transmit low-frequency data (e.g., sound data) during blanking periods (normally, Hsync, Vsync).

In the data transfer system of the present example, it is possible to reliably extract the clock from the serial digital data without requiring a clock input from a quartz oscillator or an external oscillator to the clock extraction circuit of the receiver unit. Therefore, the present invention can be used with data of different transfer rates, e.g., image data of different image sizes, and the clock can be reliably extracted from data of different transfer rates. Thus, the system is in compliance with plug and play, or the like.

EXAMPLE 3

Example 3 is an alternative example of the clock data recovery phase locked loop circuit (clock extraction circuit) in the data transfer system of the embodiment described above.

Figure 36:
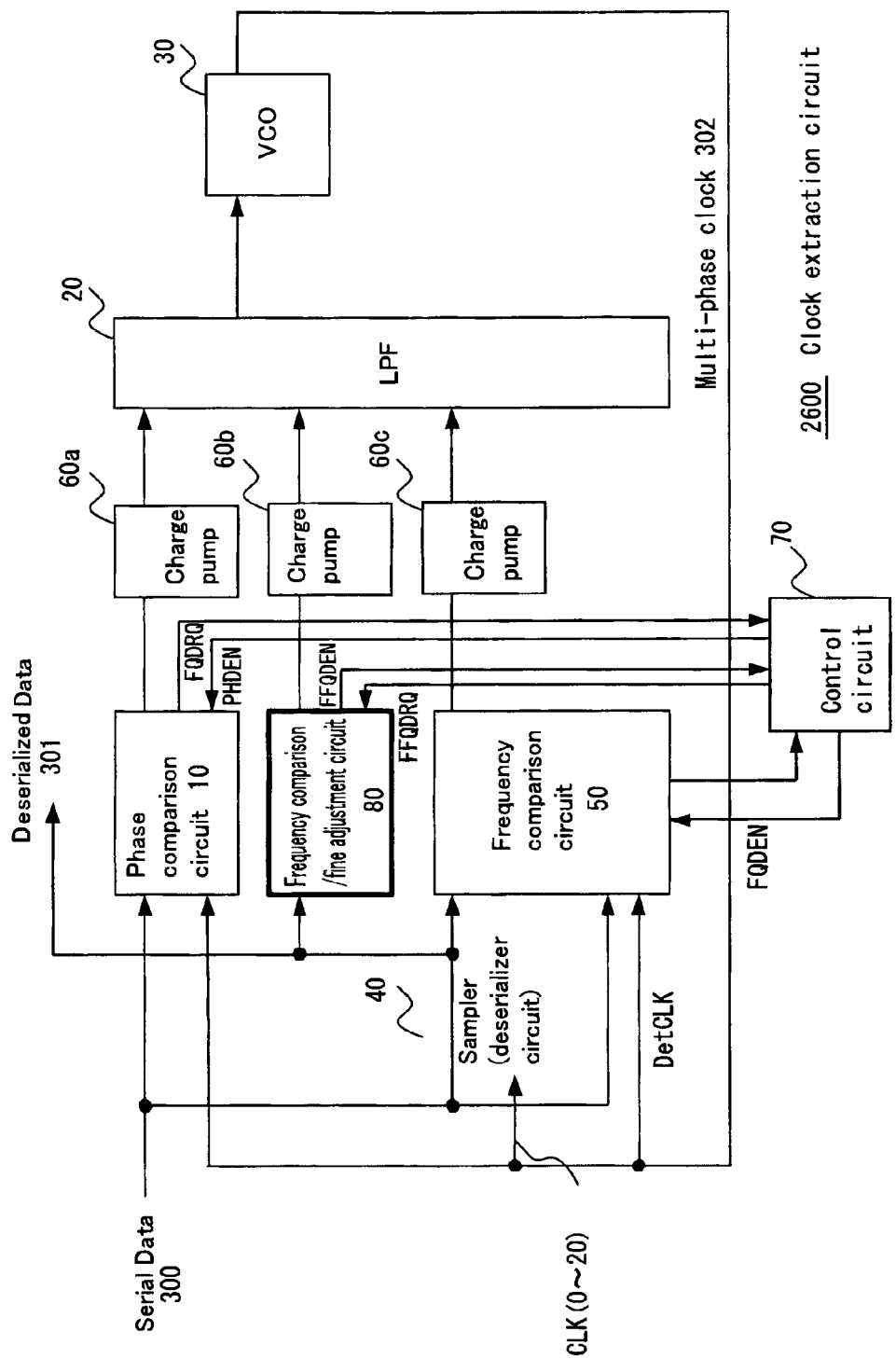
FIG. 36 is a hardware block diagram showing a circuit configuration of a clock data recovery phase locked loop circuit 2600 according to one example of the present invention.

Referring to FIG. 36, FIG. 36 is a hardware block diagram showing a circuit configuration of a clock data recovery phase locked loop circuit (clock extraction circuit) 2600 being a receiver circuit of the present invention. The clock extraction circuit 2600 of the present example is similar to the clock extraction circuit 2523 described in the embodiment above, but further includes a frequency comparison/fine adjustment circuit 80. The same elements as those described in the embodiment above will not be further described below.

The clock data recovery phase locked loop circuit 2600 of the present example includes the frequency comparison/fine adjustment circuit 80 for performing a finer frequency adjustment (fine frequency adjustment) of the voltage-controlled oscillator 30 after the frequency adjustment (coarse frequency adjustment) of the voltage-controlled oscillator 30 is performed by the frequency comparison circuit 50 and before the frequency adjustment (phase adjustment) of the voltage-controlled oscillator 30 is performed by the phase comparison circuit 10. Therefore, it is possible to perform a fine adjustment of the oscillation frequency of the voltage-controlled oscillator circuit 30, and it is possible to shorten the amount of time required for the oscillation frequency to converge, compared with a case where the oscillation frequency is adjusted by the phase comparison circuit 10 immediately after the oscillation frequency is adjusted by the frequency comparison circuit 50.

Figure 37:
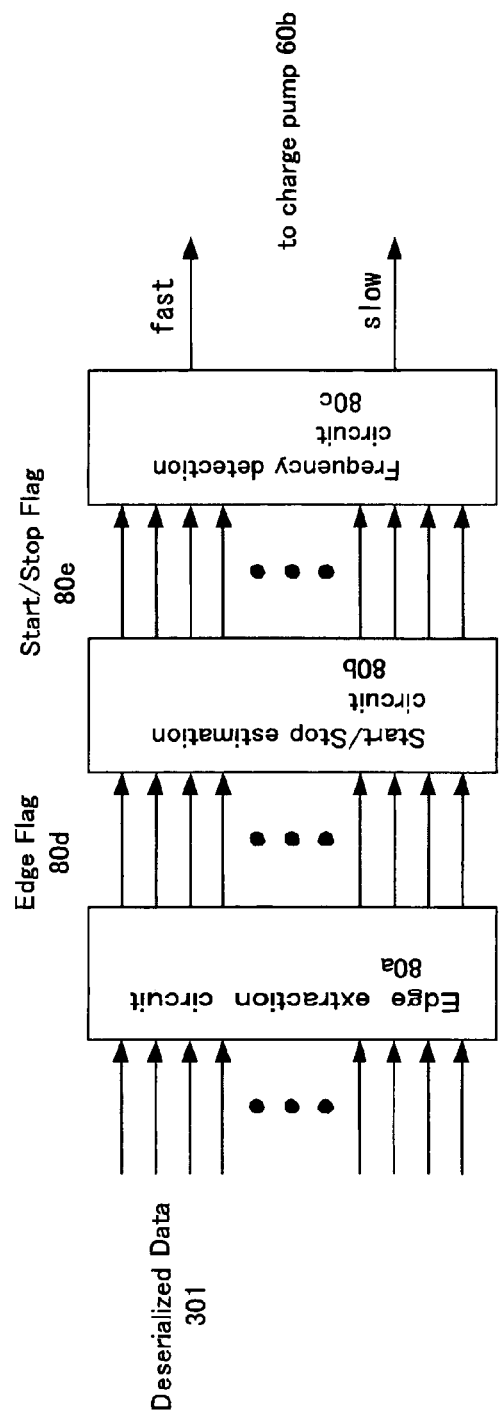
FIG. 37 is a circuit block diagram showing a frequency comparison/fine adjustment circuit 80 according to one example of the present invention.

Referring to FIG. 37, FIG. 37 is a circuit block diagram showing the frequency comparison/fine adjustment circuit 80 of the present example. The frequency comparison/fine adjustment circuit 80 includes an edge extraction circuit 80a, a start/stop estimation circuit 80b and a frequency detection circuit 80c.

The sampler (sampling circuit) 40 uses the sampling pulses produced by the voltage-controlled oscillator circuit 30 to sample the serial data 300 transmitted from the transmitter unit and produce parallel data 301 (Deserialized Data). As shown in FIG. 37, the parallel data 301 is first input to the edge extraction circuit 80a of the frequency comparison/fine adjustment circuit 80. The edge extraction circuit 80a produces an edge flag 80d based on the received parallel data 301. Here, the edge flag 80d between bits where the rising edge exists is set (becomes high). Then, the edge extraction circuit 80 outputs the edge flag 80d to the start/stop estimation circuit 80b. The start/stop estimation circuit 80b produces a start/stop flag 80e based on the received edge flag 80d, and outputs the produced flag to the frequency detection circuit 80c. Based on the received start/stop flag 80e, the frequency detection circuit 80c detects the frequency shift between the frequency of the oscillation signal of the voltage-controlled oscillator circuit 30 and the period of the rising edge of the serial data within one symbol, and outputs a control signal according to the frequency shift to the voltage-controlled oscillator circuit 30 via a charge pump 60b and the loop filter 20.

Figure 38:
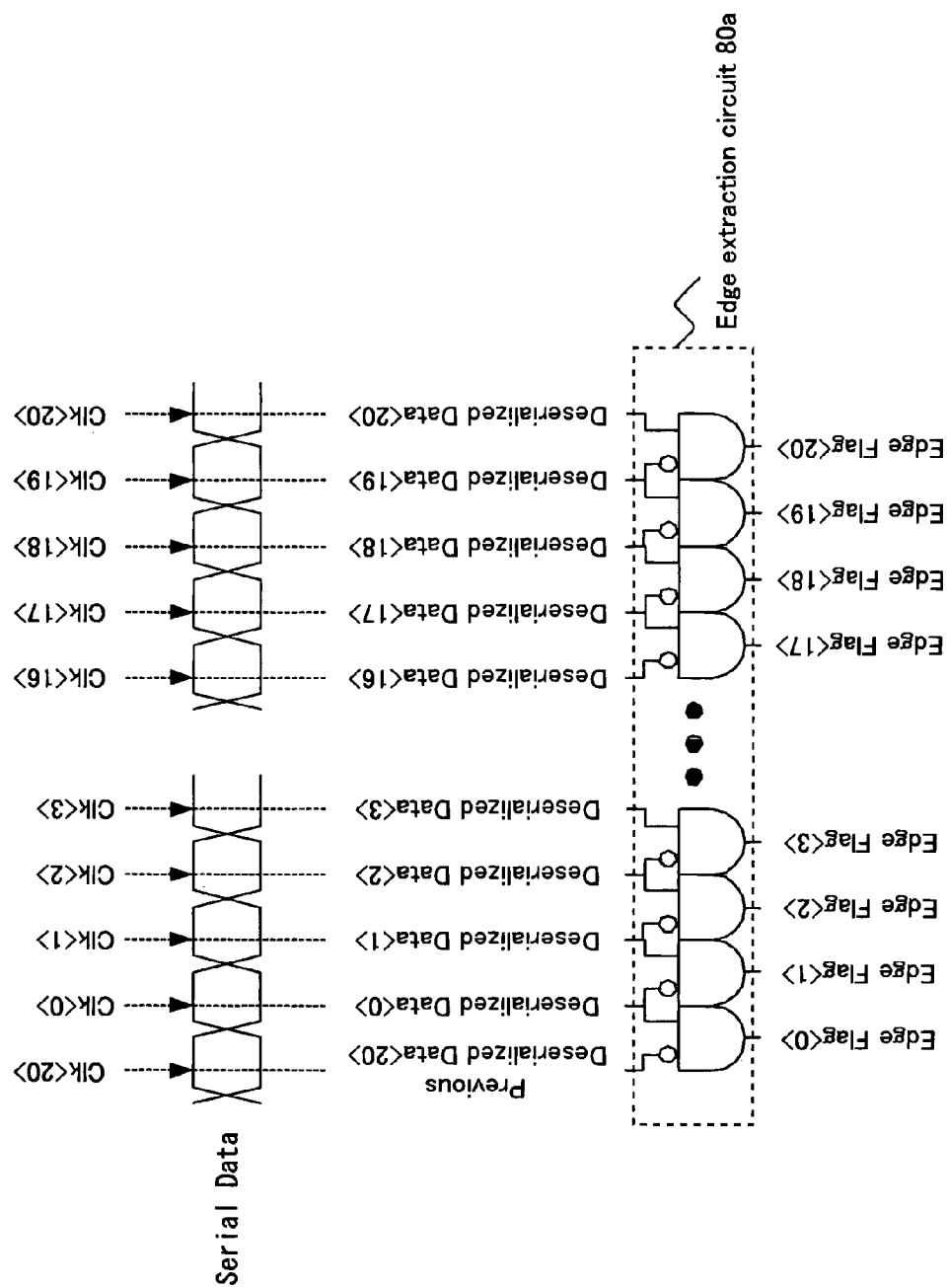
FIG. 38 is a diagram showing a circuit configuration of an edge extraction circuit 80*a* according to one example of the present invention.

FIG. 38 shows how the edge extraction circuit 80a of the frequency comparison/fine adjustment circuit 80 of the present example produces the edge flag 80d, together with the circuit configuration of the edge extraction circuit 80a. FIG. 38 shows a correlation between the serial data 300 and the parallel data 301 (Deserialized Data <0> to <20>). The last data obtained by deserializing the serial data 300 of the previous symbol (Previous Deserialized Data <20>) is also input to the edge extraction circuit 80a, together with the parallel data 301 obtained by deserializing the serial data 300 of the current symbol (Deserialized Data <0> to <20>).

As shown in FIG. 38, the parallel data 301 sampled by the sampler 40 is input to the AND circuits of the edge extraction circuit 80a. The edge extraction circuit 80a produces the edge flags (<0> to <20>) 80d based on the received parallel data 301. Among the edge flags (<0> to <20>) 80d, there are start/stop flags having data "high" corresponding to the boundary of the start bit (Start) and that of the stop bit (Stop).

Figure 39:
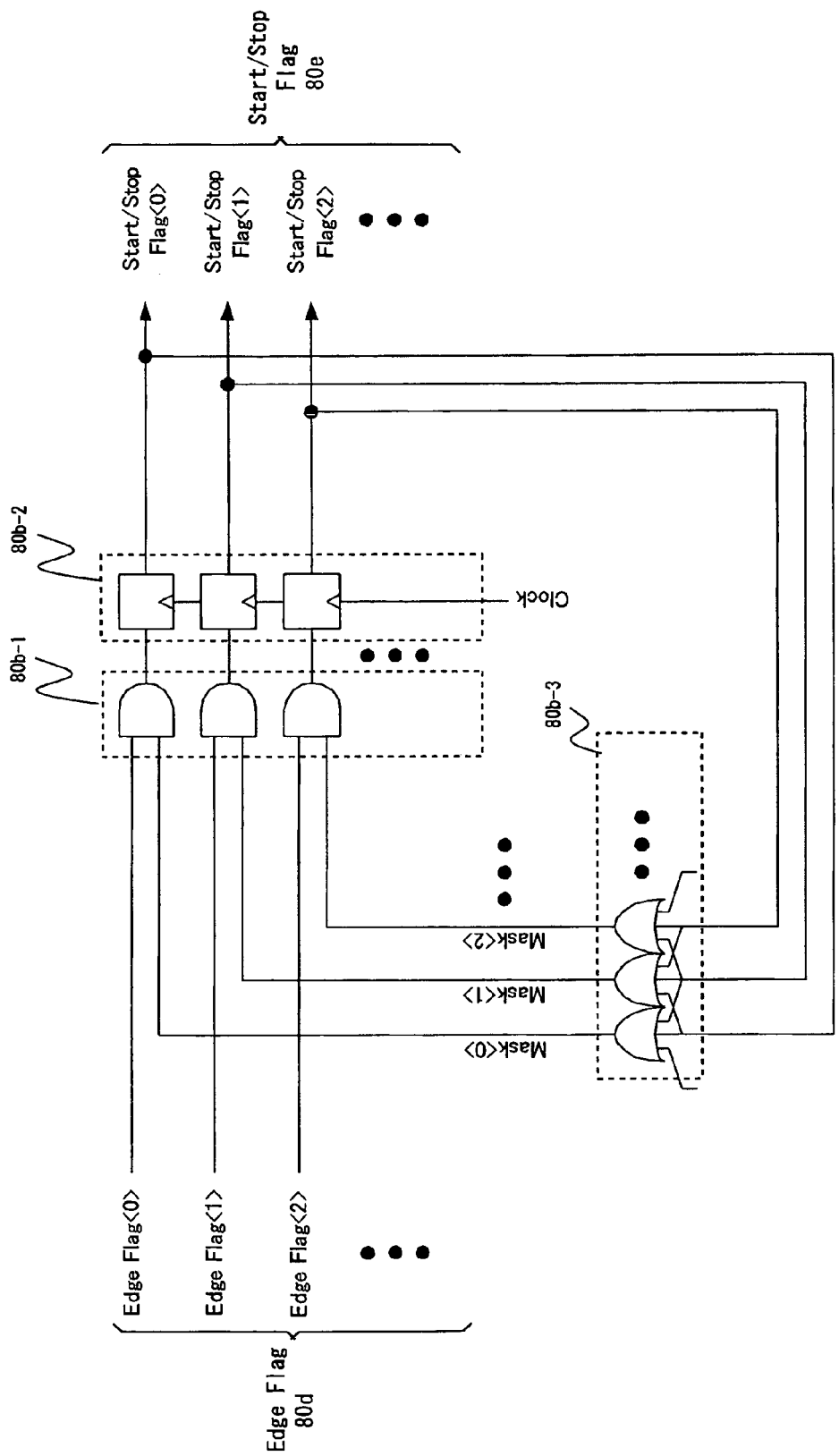
FIG. 39 is a diagram showing a circuit configuration of a start/stop estimation circuit 80*b* according to one example of the present invention.

The produced edge flags (<0> to <20>) 80d are input to the start/stop estimation circuit 80b. FIG. 39 shows a circuit configuration of the start/stop estimation circuit 80b of the present example. The start/stop estimation circuit 80b includes an AND circuit 80b-1, a flip-flop circuit 80b-2 and an OR circuit 80b-3. The start/stop estimation circuit 80b estimates flags that are start/stop flags from among the edge flags (<0> to <20>) 80d.

In the start/stop estimation circuit 80b, if the frequency of the oscillation signal of the voltage-controlled oscillator circuit 30 is equal to the frequency of the serial data 300, an edge flag is always set at the position of a start/stop flag. If the frequencies are somewhat shifted from each other, the positions of the start/stop flags will be slightly shifted. In view of this, a few bits before and after the previous estimation result (one symbol before) are used as masks, as being positions within the current symbol where the start/stop flag is likely to exist, and the logical products (AND) of the masks and the current edge flags (<0> to <20>) are calculated, making it possible to estimate the position of the current start/stop flag, i.e., which one of the start/stop flags (<0> to <20>) is being set.

Figure 40:
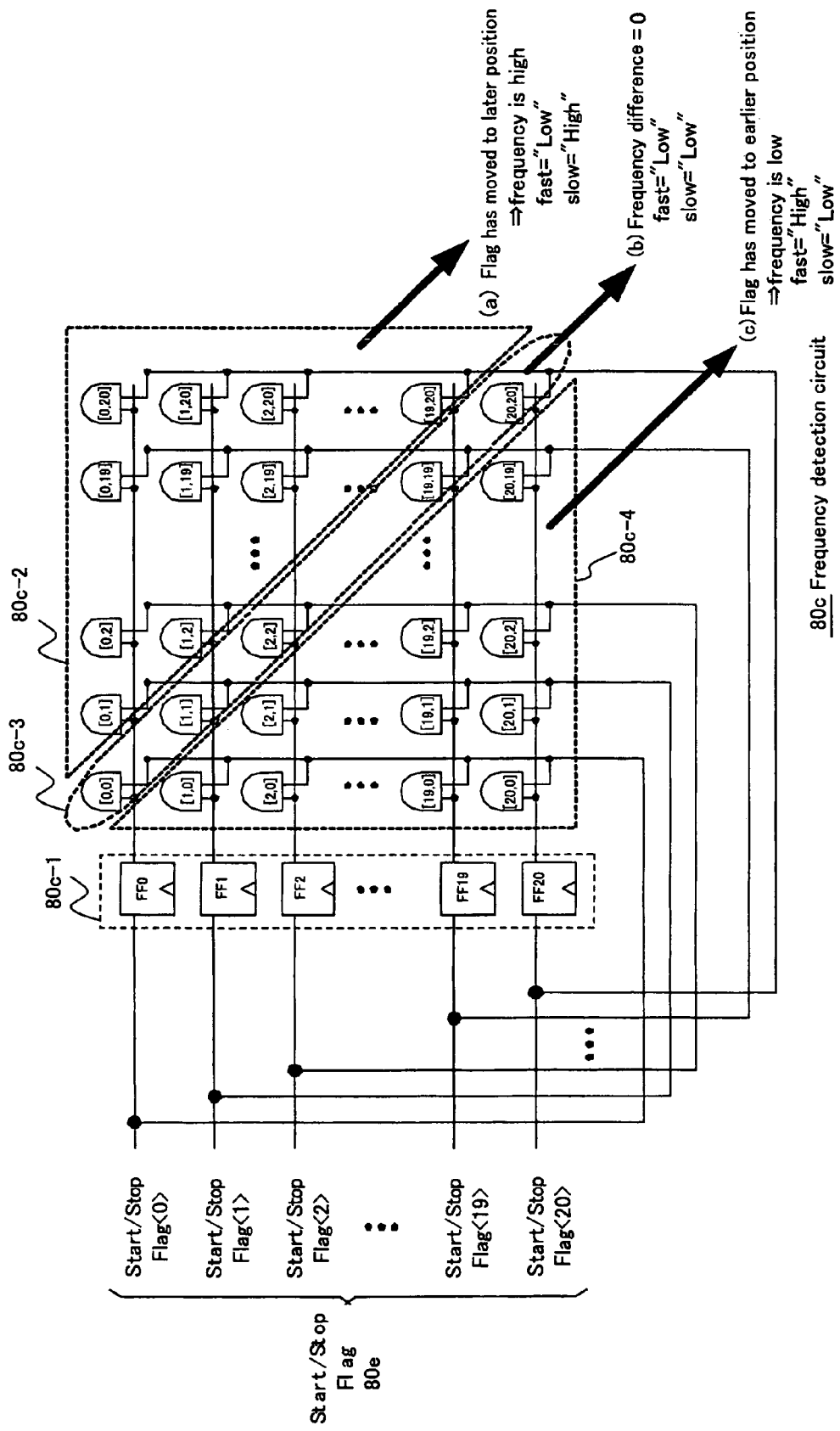
FIG. 40 is a diagram showing a circuit configuration of a frequency detection circuit 80*c* according to one example of the present invention.

Referring now to FIG. 40, the circuit configuration of the frequency detection circuit 80c and the operation thereof will be described. The start/stop flags (<0> to <20>) produced by the start/stop estimation circuit 80b are input to the frequency detection circuit 80c. The frequency detection circuit 80c includes a flip-flop circuit 80c-1, and includes circuits 80c-2, 80c-3 and 80c-4 where AND circuits ([0,0] to [20,20]) are arrange in a matrix pattern.

Based on the received start/stop flags (<0> to <20>), the frequency detection circuit 80c detects the difference between the frequency of the oscillation signal of the voltage-controlled oscillator circuit 30 and the frequency of the serial data 300. The frequency detection circuit 80c compares the start/stop flags (<0> to <20>) produced from the parallel data 301 one symbol ago held by the flip-flop circuit 80c-1 with the start/stop flags (<0> to <20>) produced from the parallel data 301 of the current symbol using the AND circuits 80c-2, 80c-3 and 80c-4 to detect the position of the start/stop flag being set, and the frequency difference is detected based on the movement of the start/stop flag being set. Specifically, if the position of the flag is detected by the AND circuit 80c-2, it is indicated that the flag has moved to a later position in the symbol, i.e., the frequency of the oscillation signal of the voltage-controlled oscillator circuit 30 is higher than the frequency of the serial data 300 (a). In this case, a control signal is transmitted to the voltage-controlled oscillator circuit 30 such that the oscillation frequency is lowered. If the position of the flag is detected by the AND circuit 80c-3, it is indicated that the flag positions coincide with each other, i.e., the frequency of the oscillation signal of the voltage-controlled oscillator circuit 30 coincides with the frequency of the serial data 300 (b). In this case, a phase comparison request signal (FFQDEN) is output to the control circuit 70, and the control circuit 70 receives FFQDEN and outputs a phase comparison enable signal (PHDEN) to the phase comparison circuit 10 to activate the phase comparison loop. If the position of the flag is detected by the AND circuit 80c-4, it is indicated that the flag position has moved to an earlier position in the symbol, i.e., the frequency of the oscillation signal of the voltage-controlled oscillator circuit 30 is lower than the frequency of the serial data 300 (c). In this case, a control signal is transmitted to the voltage-controlled oscillator circuit 30 such that the oscillation frequency is increased. The control signal output by the frequency detection circuit 80c includes the fast and slow outputs of the frequency detection circuit 80c as shown in FIG. 37. In a case (a) where the frequency of the oscillation signal of the voltage-controlled oscillator circuit 30 is higher than the frequency of the serial data 300, the fast output is "low" and the slow output is "high". In a case (b) where the frequency of the oscillation signal of the voltage-controlled oscillator circuit 30 coincides with the frequency of the serial data 300, the fast output is "low" and the slow output is "low". In a case (c) where the frequency of the oscillation signal of the voltage-controlled oscillator circuit 30 is lower than the frequency of the serial data 300, the fast output is "high" and the slow output is "low".

By repeating the operation loop of the sampler 40, the frequency comparison/fine adjustment circuit 80, the charge pump 60b, the loop filter 20 and the voltage-controlled oscillator circuit 30, it is possible to perform a fine frequency adjustment of the output signal of the voltage-controlled oscillator circuit 30. Then, after the oscillation frequency of the voltage-controlled oscillator circuit 30 has entered a predetermined capture range, the phase adjustment of the oscillation frequency of the voltage-controlled oscillator circuit 30 is performed by the phase comparison circuit 10.

As described above, with the clock extraction circuit of the present example, it is possible to perform a fine frequency adjustment of the output signal of the voltage-controlled oscillator circuit 30, making it possible to shorten the amount of time required for the oscillation frequency of the voltage-controlled oscillator circuit 30 to converge, compared with a case where the phase adjustment of the oscillation frequency of the voltage-controlled oscillator circuit 30 is performed by the phase comparison circuit 10 immediately after the coarse frequency adjustment of the oscillation frequency of the voltage-controlled oscillator circuit 30 by the frequency comparison circuit. Means for realizing the functions described above do not limit the present invention, and may be any circuits or devices as long as they can implement the functions, and some of the functions may be implemented in the form of software.

EXAMPLE 4

Example 4 is an alternative example of an encoder method of the data transfer system of the present invention, in which the DC balance operation of Example 2 described above is incorporated. Other elements are as described in the embodiment above and in Example 2, and will not be further described below.

Figure 41:
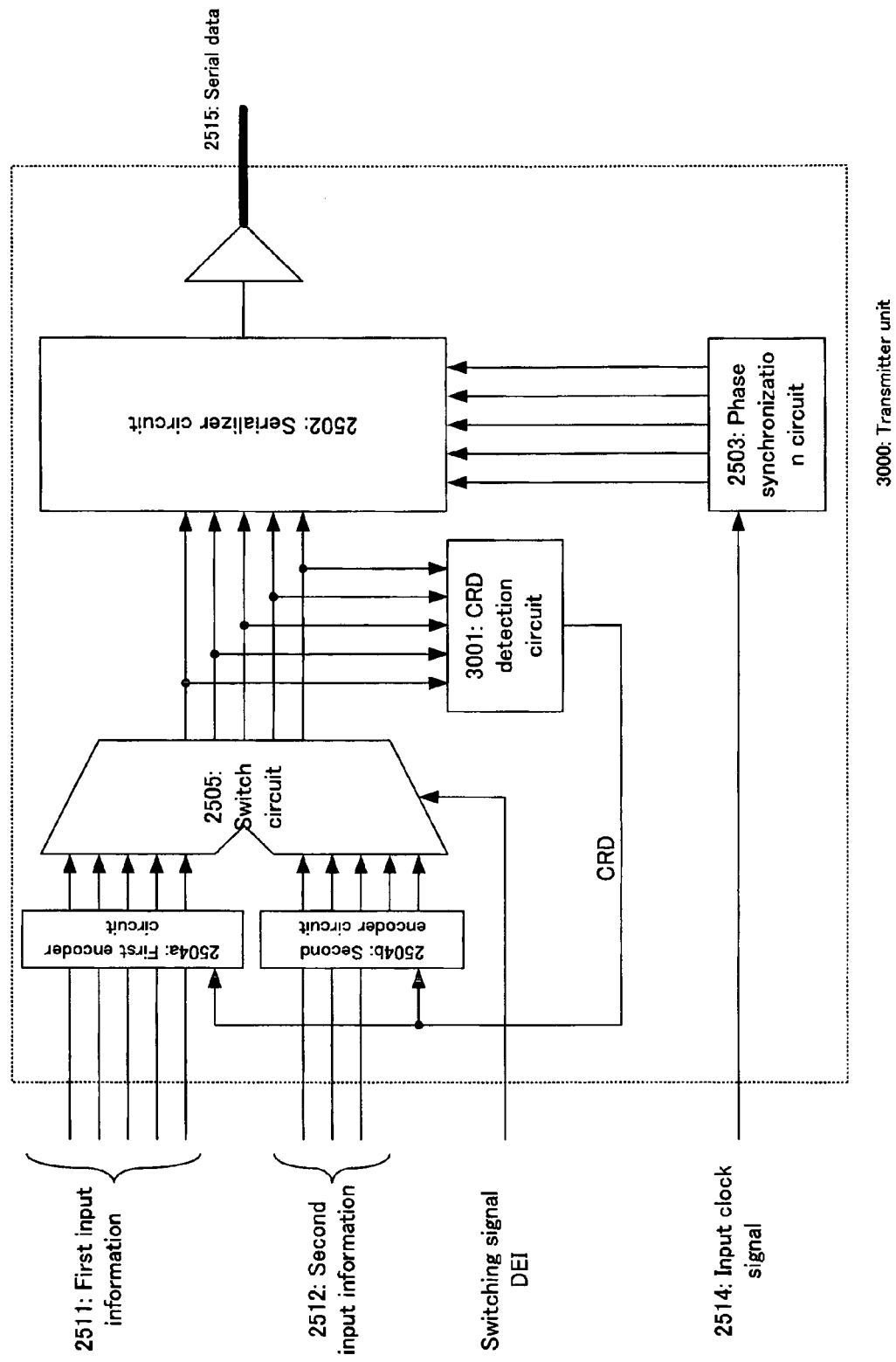
FIG. 41 is a diagram showing a general configuration of a transmitter unit 3000 according to one example of the present invention.

FIG. 41 shows a transmitter unit 3000 of the data transfer system of the present example. The transmitter unit 3000 includes a CRD detection circuit 3001. Herein, CRD (Current Running Disparity) is a value that indicates the difference between the number (total number) of 1's ("high"s) and the number (total number) of 0's ("low"s) in the encoded data from the initiation of the operation of the transmitter circuit to the present. The CRD detection circuit 3001 calculates CRD based on data obtained by encoding the first input information and data obtained by encoding the second input information, and outputs a CDR signal for controlling the encoding operation of the first encoder circuit 2504a and the second encoder circuit 2504b according to the calculated CRD value so as to reduce the absolute value of CRD. A case where 8×3=24 bits of the first input information 2511 and three bits of the second input information 2512 are serialized into serial data will be described.

Figure 42:
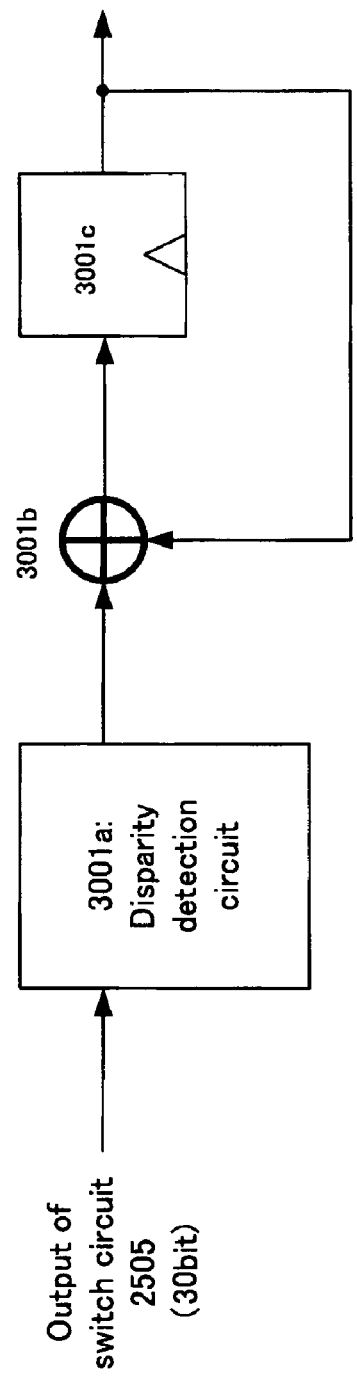
FIG. 42 is a diagram showing a circuit configuration of a CRD detection circuit 3000 according to one example of the present invention.

FIG. 42 shows the circuit configuration of the CRD detection circuit 3001. The CRD detection circuit 3001 includes a disparity detection circuit 3001a, an adder 3001b and a flip-flop 3001c. The disparity detection circuit 3001a outputs a value obtained by subtracting the number of 0's in the 30-bit data output from the switch circuit 2505 from the number of 1's therein. A value obtained by the adder 3001b adding together the CRD value held by the flip-flop 3001c and the output value from the disparity detection circuit 3001a is latched by the flip-flop 3001c for each clock, thus updating CRD.

Figure 43:
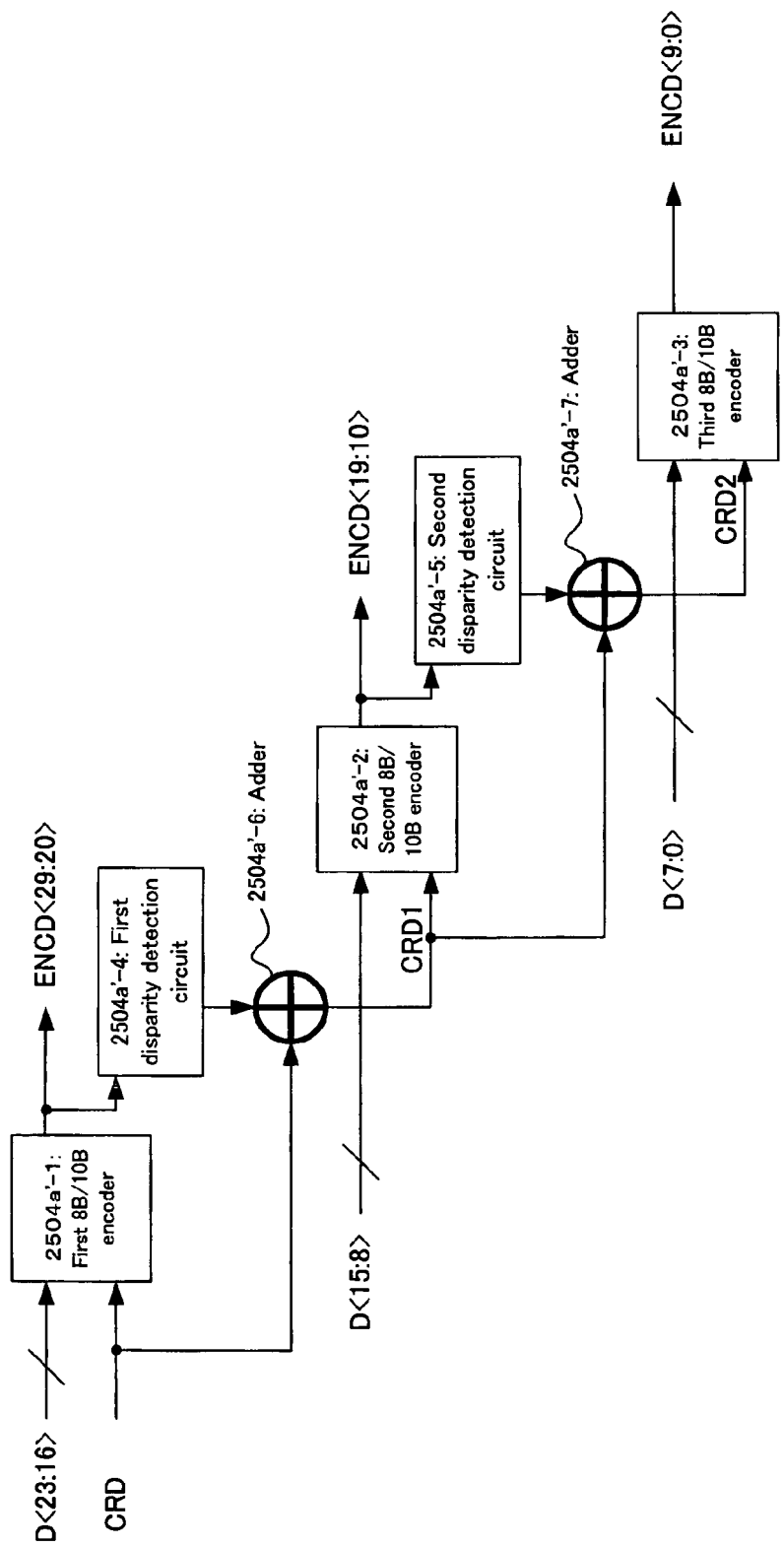
FIG. 43 is a diagram showing a circuit configuration of a first encoder circuit according to one example of the present invention.

Referring now to FIG. 43, FIG. 43 shows an alternative example of the first encoder circuit 2504a of the present example. A first encoder circuit 2504a' shown in FIG. 43 includes first to third 8B/10B encoder circuits 2504a'-1, 2504a'-2 and 2504a'-3 and first and second disparity detection circuits 2504a'-4 and 2504a'-5.

Each of the 8B/10B encoder circuits 2504a'-1, 2504a'-2 and 2504a'-3 converts an 8-bit input to a 10-bit signal so that the number of 0's will be larger than the number of 1's if the sign of the received disparity is positive, or so that the number of 1's will be larger than the number of 0's if the sign of the received disparity is negative. Note that the conversion is performed so that there is always a rising edge in the 10bit output.

The first 8B/10B encoder circuit 2504a'-1 obtains D <23:16> and converts D <23:16> to ENCD <29:20> so that the number of 1's in the 10-bit output is smaller than the number of 0's therein if the sign of CRD is positive, or so that the number of 1's is larger than the number of 0's if the sign of CRD is negative.

The first disparity detection circuit 2504a'-4 detects the disparity of ENCD <29:20>. An adder 2504a'-6 adds together CRD and the output of the first disparity detection circuit 2504a'-4, and outputs the result as CRD1.

The second 8B/10B encoder circuit 2504a'-2 obtains D <15:8> and converts D <15:8> to ENCD <19:10> so that the number of 1's in the 10-bit output is smaller than the number of 0's therein if the sign of CRD1 is positive, or so that the number of 1's is larger than the number of 0's if the sign of CRD is negative.

A second disparity detection circuit 2504a'-5 detects the disparity of ENCD <19:10>. An adder 2504a'-7 adds together CRD1 and the output of the second disparity detection circuit 2504a'-5, and outputs the result as CRD2.

The third 8B/10B encoder circuit 2504a'-3 obtains D <7:0> and converts it to ENCD <9:0> in a similar manner to that described above, according to the sign of CRD2.

Thus, the first encoder circuit 2504a' encodes the 24-bit input so as to reduce the absolute value of CRD.

The second encoder circuit 2504b can encode one type of input data into two types of data, which are when serialized differently from each other in terms of the pulse width (the number of consecutive occurrences of bits of "high"=1). The second encoder circuit 2504b encodes the second input information so as to reduce the pulse width, i.e., so that the number of 1's is smaller than the number of 0's, if the sign of CRD is positive, or so as to increase the pulse width if the sign of CRD is negative. The input-output relationship of the second encoder circuit 2504b is as shown in Table 1 below, for example.

TABLE 1

| Input | CRD | Second Encoder Output |
|---|---|---|
| 000 | − | 11_1111_1111_1111_1100_0000_0000_0000 |
|  | + | 11_1111_1111_1111_0000_0000_0000_0000 |
| 001 | − | 11_1111_1111_1111_1110_0000_0000_0000 |
|  | + | 11_1111_1111_1110_0000_0000_0000_0000 |
| 010 | − | 11_1111_1111_1111_1111_0000_0000_0000 |
|  | + | 11_1111_1111_1100_0000_0000_0000_0000 |
| 011 | − | 11_1111_1111_1111_1111_1000_0000_0000 |
|  | + | 11_1111_1111_1000_0000_0000_0000_0000 |
| 100 | − | 11_1111_1111_1111_1111_1100_0000_0000 |
|  | + | 11_1111_1111_0000_0000_0000_0000_0000 |
| 101 | − | 11_1111_1111_1111_1111_1110_0000_0000 |
|  | + | 11_1111_1110_0000_0000_0000_0000_0000 |
| 110 | − | 11_1111_1111_1111_1111_1111_0000_0000 |
|  | + | 11_1111_1100_0000_0000_0000_0000_0000 |
| 111 | − | 11_1111_1111_1111_1111_1111_1000_0000 |
|  | + | 11_1111_1000_0000_0000_0000_0000_0000 |

Figure 68:
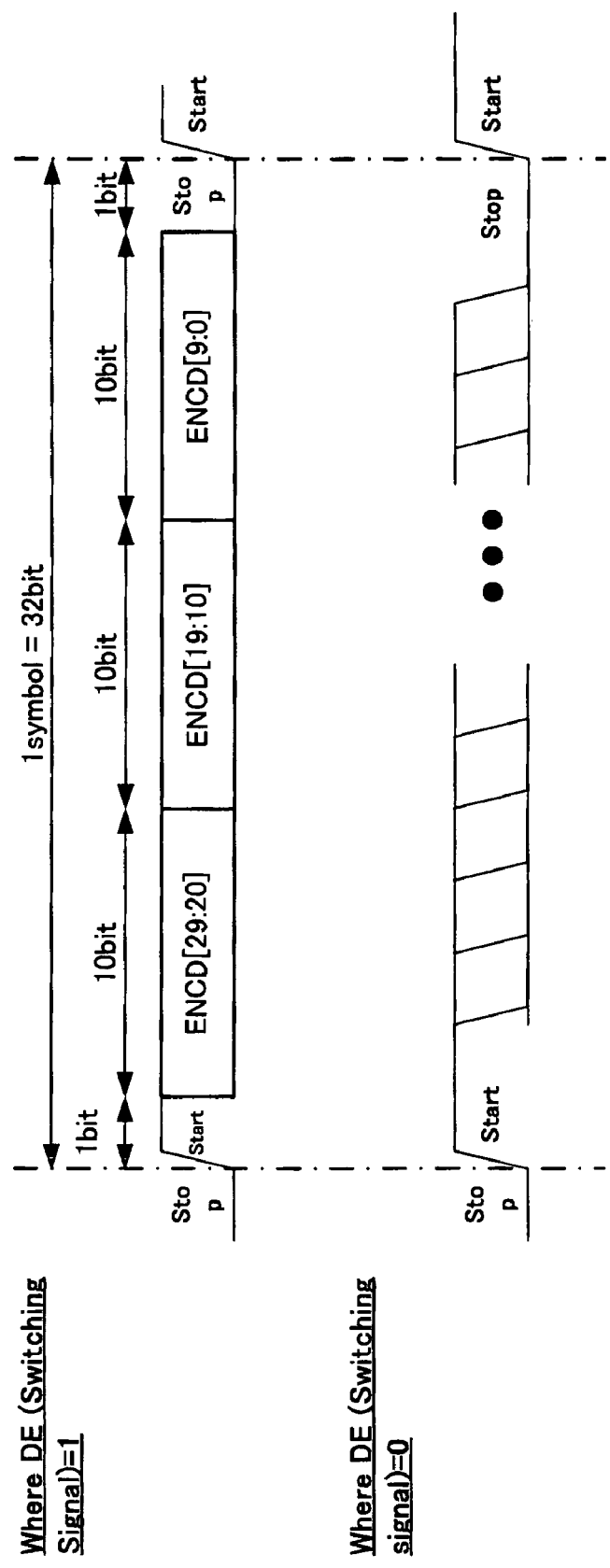
FIG. 68 is a diagram showing serial digital data according to one example of the present invention.
Figure 69:
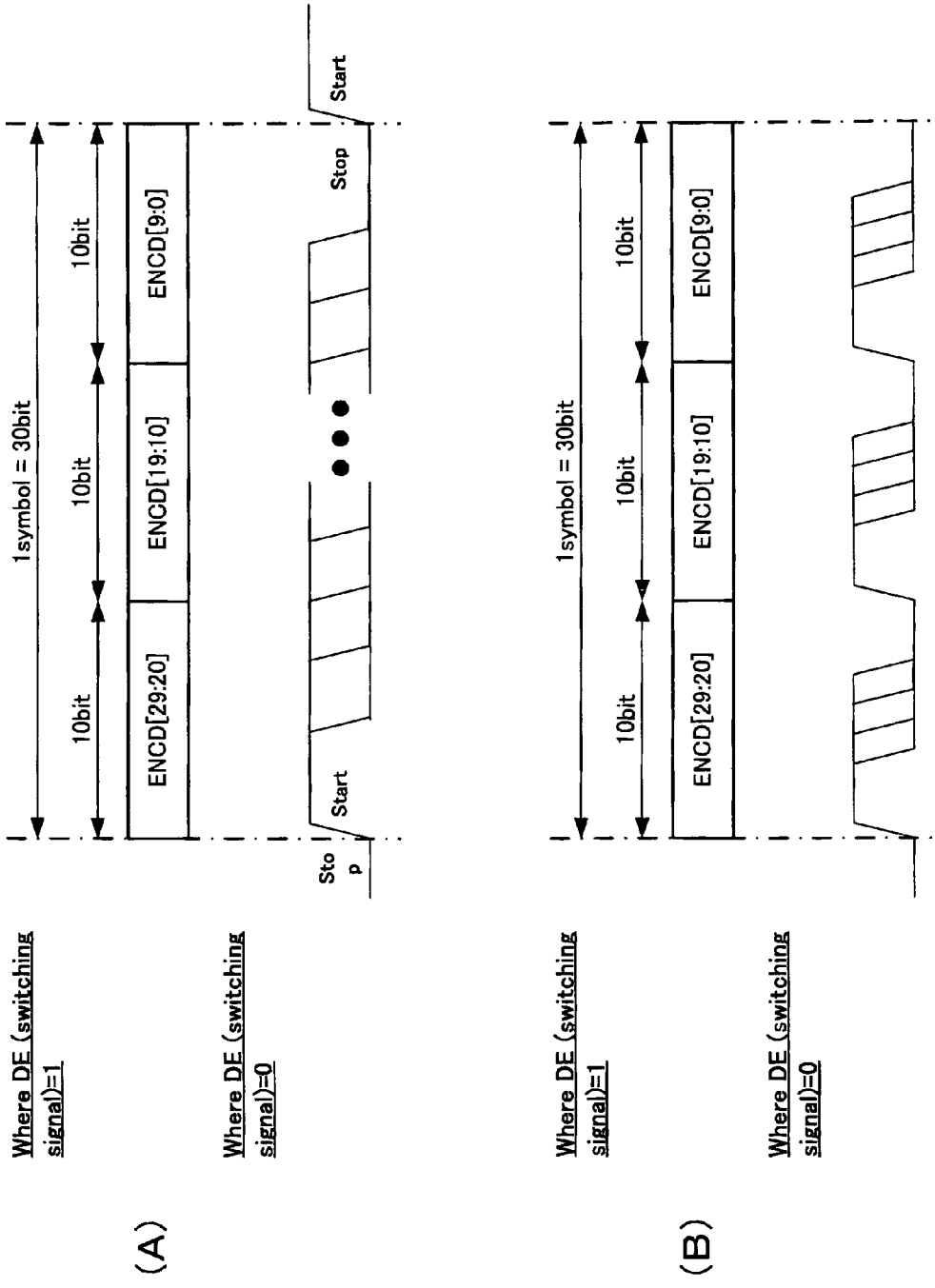
FIG. 69 is a diagram showing serial digital data according to one example of the present invention.

FIG. 68 and FIG. 69 show Waveform Examples 1 to 3 of the serialized data where such an encoding operation is performed.

Waveform Example 1 of FIG. 68 is a symbol of a total of 32 bits obtained where DEI (switching signal)=1 (high), with start and stop bits attached to the beginning and the end of a group of three 10-bit blocks obtained through 8B/10B encoding of the first information. Where DEI (switching signal)=0 (low), the second information is turned into a pulse-width-modulated signal of a 32-bit period through a DC-balanced encoding process as described above.

Waveform Example 2 of FIG. 69(A) is a waveform similar to Waveform Example 1 where DEI (switching signal)=1, except that the start and stop bits are omitted. In this case, each symbol of the first information is a 30-bit symbol. Where DEI (switching signal)=0, the second information is a pulse-width-modulated signal of a 30-bit period.

Waveform Example 3 of FIG. 69(B) is a variation of Waveform Example 2, where the waveform is obtained by connecting together three pulse-width-modulated signals each of a 10-bit period where DEI (switching signal)=0. Also in this case, the data is DC-balanced.

The serial data waveforms as described above can be realized by changing the connection relationships between the input terminals of the switch circuit 2505 and the output terminals of the encoder described in the embodiment above.

As described above, with the transmitter unit 3000 of the present example, it is possible to encode the first input information so as to reduce the absolute value of CRD, i.e., so that the obtained data is DC-balanced. Moreover, the second input information can be encoded into a pulse-width-modulated signal that is DC-balanced.

In the receiver circuit receiving the output from the transmitter unit of the present example, the first decoder circuit performs a decoding operation corresponding to the encoding operation performed by the first encoder circuit of the present example, and the second decoder circuit performs a decoding operation corresponding to the encoding operation performed by the second encoder circuit of the present example, thus recovering the first input information and the second input information.

EXAMPLE 5

Figure 44:
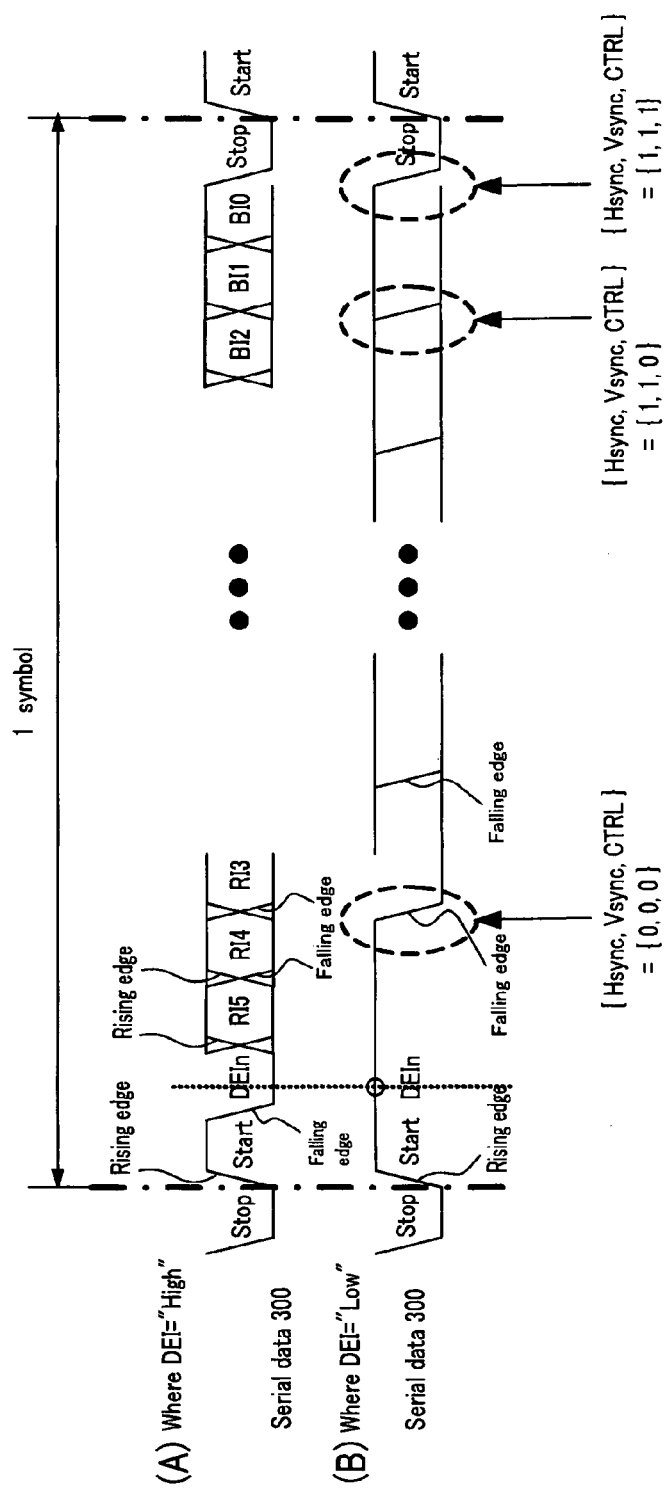
FIG. 44 is a diagram showing serial digital data according to one example of the present invention.

Example 5 is an example of a data structure where DEI data is embedded as it is within one symbol. The digital data transmitter circuit, the receiver circuit, the digital data transfer method and the concept of the system of the present example will be described with reference to FIG. 44(A) and FIG. 44(B). FIG. 44(A) and FIG. 44(B) show examples of signal waveforms of the serial data 300 obtained by serializing input color digital data (RI5 to RI0, GI5 to GI0, BI5 to BI0: also referred to as a group of input color digital data or main information), input synchronization data (HsyncI (input horizontal synchronization data), VsyncI (input vertical synchronization data), CTRLI (input control): also referred to as a group of synchronization data or subordinate information) and DEI (input selection signal (input data enable)), which are input as parallel data, in the digital data transfer method of the present invention and the system thereof. While the color data of the serial data is 6-bit data for each of the colors R, G and B (RI5 to RI0, GI5 to GI0, BI5 to BI0), it is understood that the present invention is not limited to this.

First, while DEI (data enable)="high", i.e., in the active period, one symbol of the serial data 300 is formed by data that is obtained by serializing the start bit (Start), the data enable inverted signal (DEIn), the color data (RI5, RI4, ..., BI2, BI1, BI0) and the stop bit (Stop) in this order.

While DEI (data enable)="low", i.e., in the blanking period, one symbol of the serial data 300 is formed by data that is obtained by serializing the start bit (Start), the data enable inverted signal (DEIn), the encoded HsyncI, VsyncI and CTRLI and the stop bit (Stop) in this order. While DEI="low", i.e., in the blanking period, HsyncI, VsyncI and CTRLI are serialized after being encoded so that there is only one rising edge within one symbol of the serial data 300. Specifically, HsyncI, VsyncI and CTRLI are encoded, and then output by the encoder circuit so that MSB is at a higher level than LSB, after which the data is serialized by the serializer circuit successively from MSB to LSB. Therefore, where DEI is low, the data is such that the output from the serializer circuit is at a higher level earlier in time within one symbol, so that a rising edge occurs only between symbols.

With such a configuration, it is possible to sufficiently reduce the possibility of errors when recovering the clock from the serial data including the synchronization data transmitted in the blanking period.

One embodiment of the digital data transmitter circuit, the receiver circuit, the digital data transfer method and the system of the present invention will be described with reference to FIG. 45 to FIG. 50.

Figure 45:
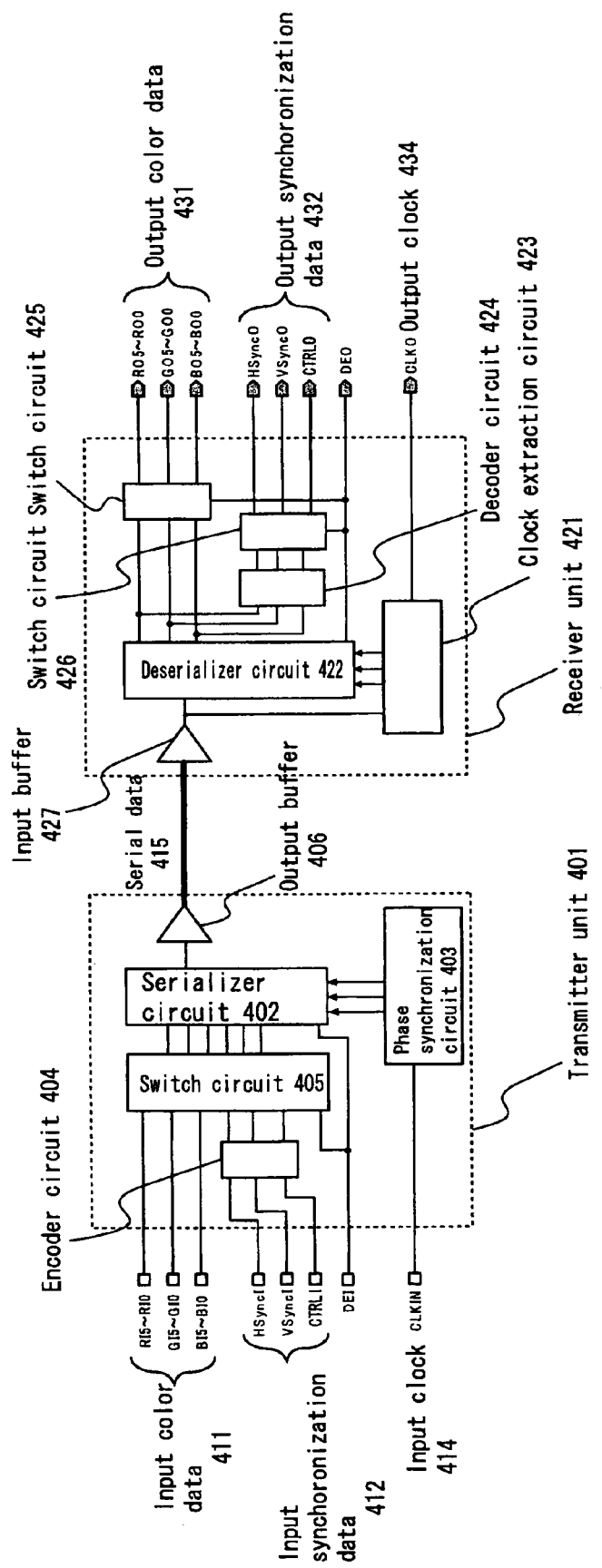
FIG. 45 is a diagram showing one example of the present invention.

First, referring to FIG. 45, FIG. 45 shows one embodiment of the digital data transmitter circuit and the receiver circuit of the present invention, the digital data transfer method using the same and the system thereof.

A transmitter unit (transmitter circuit) 401 transmits to a receiver unit 421 serial data 415 obtained by serializing input color data 411 (RI5 to RI0, GI5 to GI0, BI5 to BI0) and input synchronization data 412 (HsyncI (input horizontal synchronization data), VsyncI (input vertical synchronization data), CTRLI (input control) and DEI (input selection signal (input data enable))).

The receiver unit (receiver circuit) 421 receives and deserializes the serial data 415 transmitted from the transmitter unit 401 and recovers therefrom output color data 431 (RO5 to RO0, GO5 to GO0, BO5 to BO0), output synchronization data 432 (HsyncO (output horizontal synchronization data), VsyncO (output vertical synchronization data), CTRLO (output control), DEO (output selection signal (output data enable))) and an output clock 434.

The transmitter unit 401 includes a serializer circuit 402 (Serializer), a phase synchronization circuit 403 (PLL circuit: Phase Locked Loop circuit), an encoder circuit 404 (Encoder), a switch circuit 405 and an output buffer 406 (Output Buffer).

The receiver unit 421 includes a deserializer circuit 422 (De-serializer), a clock extraction circuit (CDRPLL circuit: Clock Data Recovery Phase Locked Loop circuit) 423, a decoder circuit 424 (Decoder), switch circuits 425 and 426 and an input buffer 427 (Input Buffer). Note that the output buffer 406 and the input buffer 427 may be optional. While R, G and B data are each 6-bit data for the input color data 411 in the present example, it is understood that the present invention is not limited to this. The decoder circuit 424 (Decoder) and the switch circuits 425 and 426 may also be referred to collectively as an information separation circuit.

In the transmitter unit 401, the input color data 411 is input to the switch circuit 405. The input synchronization data 412 excluding DEI, i.e., HsyncI, VsyncI and CTRLI, are input to the encoder circuit 404 and encoded by the encoder circuit 404. The switch circuit 405 uses DEI as an input selection signal to select the input color data 411 if DEI is high and select the output of the encoder circuit 404 if DEI is low, and outputs the selected signal to the serializer circuit 402. An input clock 414 is converted to a multiphase clock by the phase synchronization circuit 403, and the serializer circuit 402 uses the multiphase clock to serialize the output of the switch circuit 405 and the inverted signal of DEI to output the obtained signal through the output buffer 406.

In the transmitter unit 401, HsyncI, VsyncI and CTRLI are encoded and output from the encoder circuit so that MSB is at a higher level than LSB, where MSB is the signal that comes earlier in time within one symbol when the data is serialized, and are serialized by the serializer circuit 402 successively from MSB to LSB. Therefore, where DEI is low, the data is such that the output from the serializer circuit is at a higher level earlier in time within one symbol, so that a rising edge occurs only between symbols.

In the receiver unit 421, first, the clock extraction circuit 423 recovers the output clock (CLKO) 434 and the multiphase clock from the serial data 415. Then, by using the multiphase clock, the serial data 415 is converted by the deserializer circuit 422 to a parallel signal. The parallel signal contains the inverted signal of the DEI signal. The parallel signal excluding DEI is input to, and decoded by, the decoder circuit 424. When DEI is high, the switch circuit 425 is active and outputs the parallel signal as output color data (RO5 to RO0, GO5 to GO0, BO5 to BO0). When DEI is low, the switch circuit 425 outputs a low level as the output color data. When DEI is low, the switch 426 is active and outputs the output of the decoder circuit 424 as output synchronization data. When DEI is high, the switch 426 maintains the output.

Figure 46:
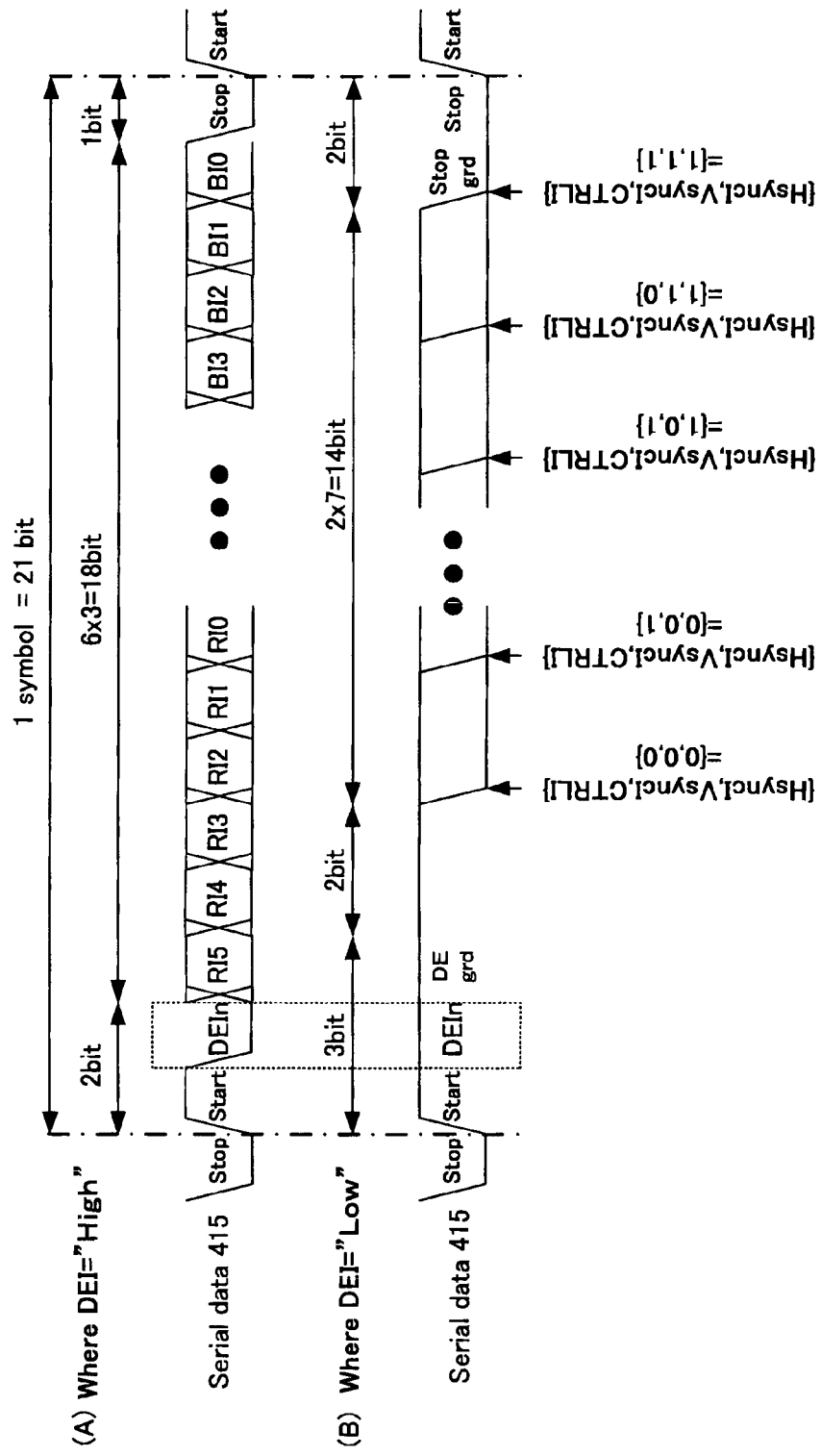
FIG. 46 is a diagram showing one example of the present invention.

Referring now to FIG. 46, FIG. 46(A) and FIG. 46(B) show examples of signal waveforms of the serial data 415 obtained by serializing, in the receiver-side unit of the present example, input color data (RI5 to RI0, GI5 to GI0, BI5 to BI0) each having six bits and input synchronization data (HsyncI (input horizontal synchronization data), VsyncI (input vertical synchronization data), CTRLI (input control), DEI (input selection signal (input data enable))), which are input as parallel data.

First, while DEI (data enable)="high", i.e., in the active period, one symbol of the serial data 415 is formed by data that is obtained by serializing the start bit (Start), the data enable inverted signal (DEIn), the color data (RI5, RI4, ..., BI2, BI1, BI0) and the stop bit (Stop) in this order. Note that one symbol has 21 bits in the present example.

While DEI (data enable)="low", i.e., in the blanking period, one symbol of the serial data 415 is formed by data that is obtained by serializing the start bit (Start), the data enable inverted signal (DEIn), a data enable guard bit (DE grd), the encoded HsyncI, VsyncI and CTRLI, a stop guard bit (Stop grd) and the stop bit (Stop) in this order. While DEI="low", i.e., in the blanking period, HsyncI, VsyncI and CTRLI are serialized after being encoded so that there is only one rising edge within one symbol of the serial data 415. Note that when DEI="low", the input synchronization data is pulse-width-modulated with a period that is n times the pulse width of the digital data of the input color data.

With such a data structure where there is only one rising edge within one symbol as in the present example, it is possible to sufficiently reduce the possibility of errors when recovering the clock from the serial data including the synchronization data transmitted in the blanking period.

In the present example shown in FIG. 46, the data enable guard bit (DE grd) is provided following the data enable inverted signal (DEIn). With the provision of the data enable guard bit (DE grd), the data enable inverted signal (DEIn), which serves as the recovery point when recovering the parallel data and the clock from the serial data 415, is extracted with a higher precision, making it possible to reduce the possibility of sampling errors when sampling the synchronization data and the clock.

Figure 47:
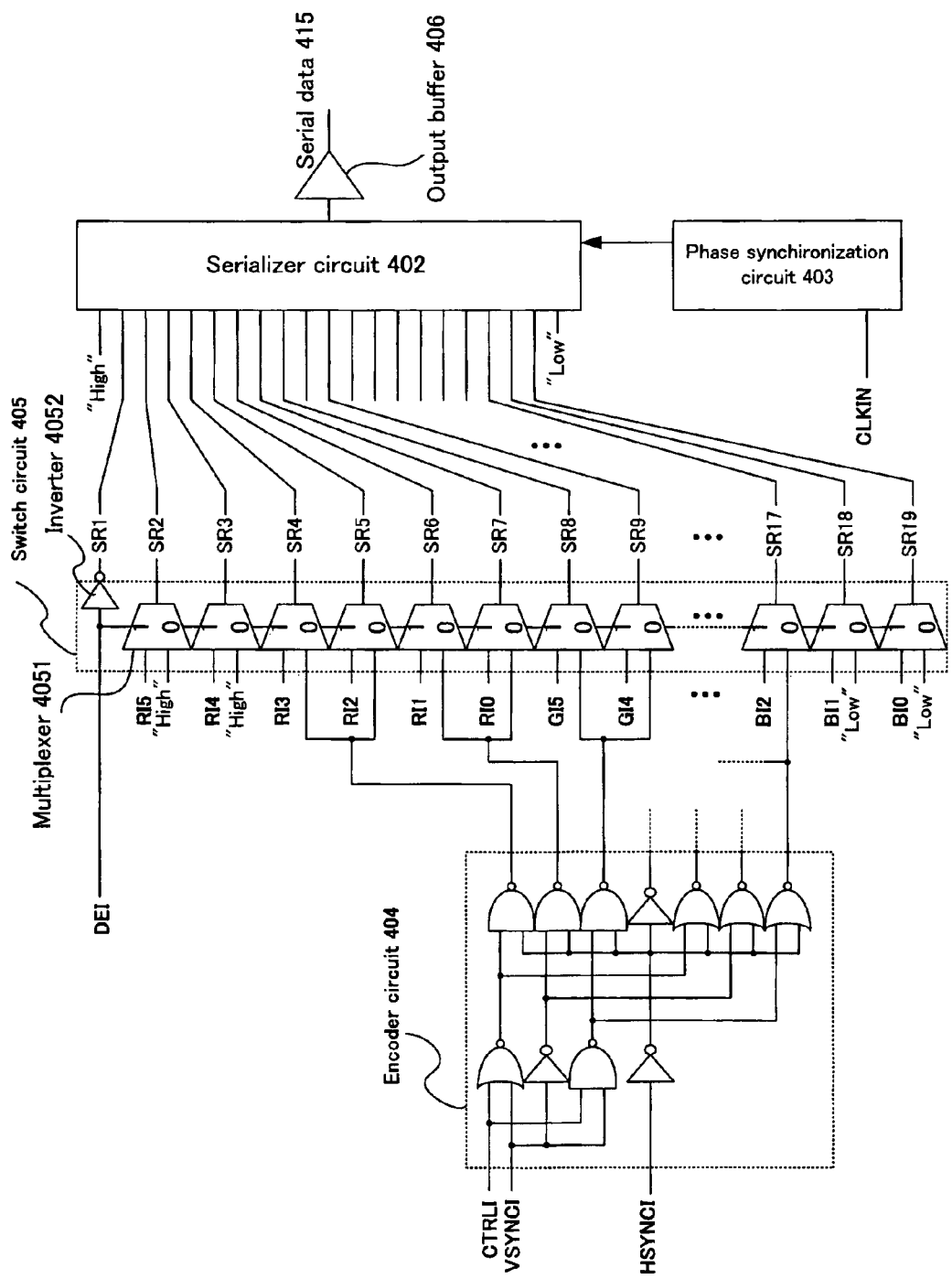
FIG. 47 is a diagram showing a transmitter unit according to one example of the present invention.
Figure 48:
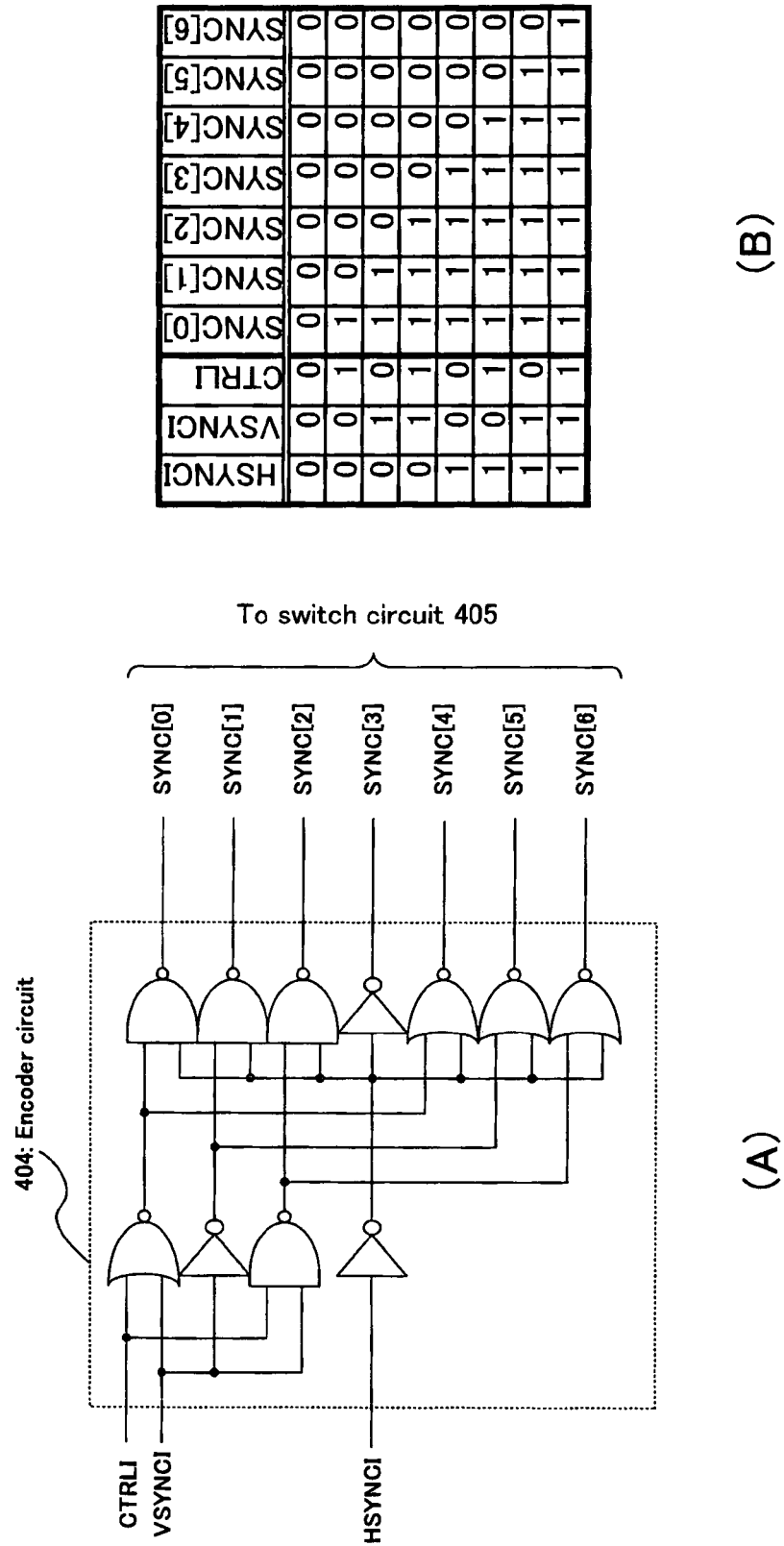
FIG. 48 is a diagram showing an encoder circuit according to one example of the present invention.
Figure 51:
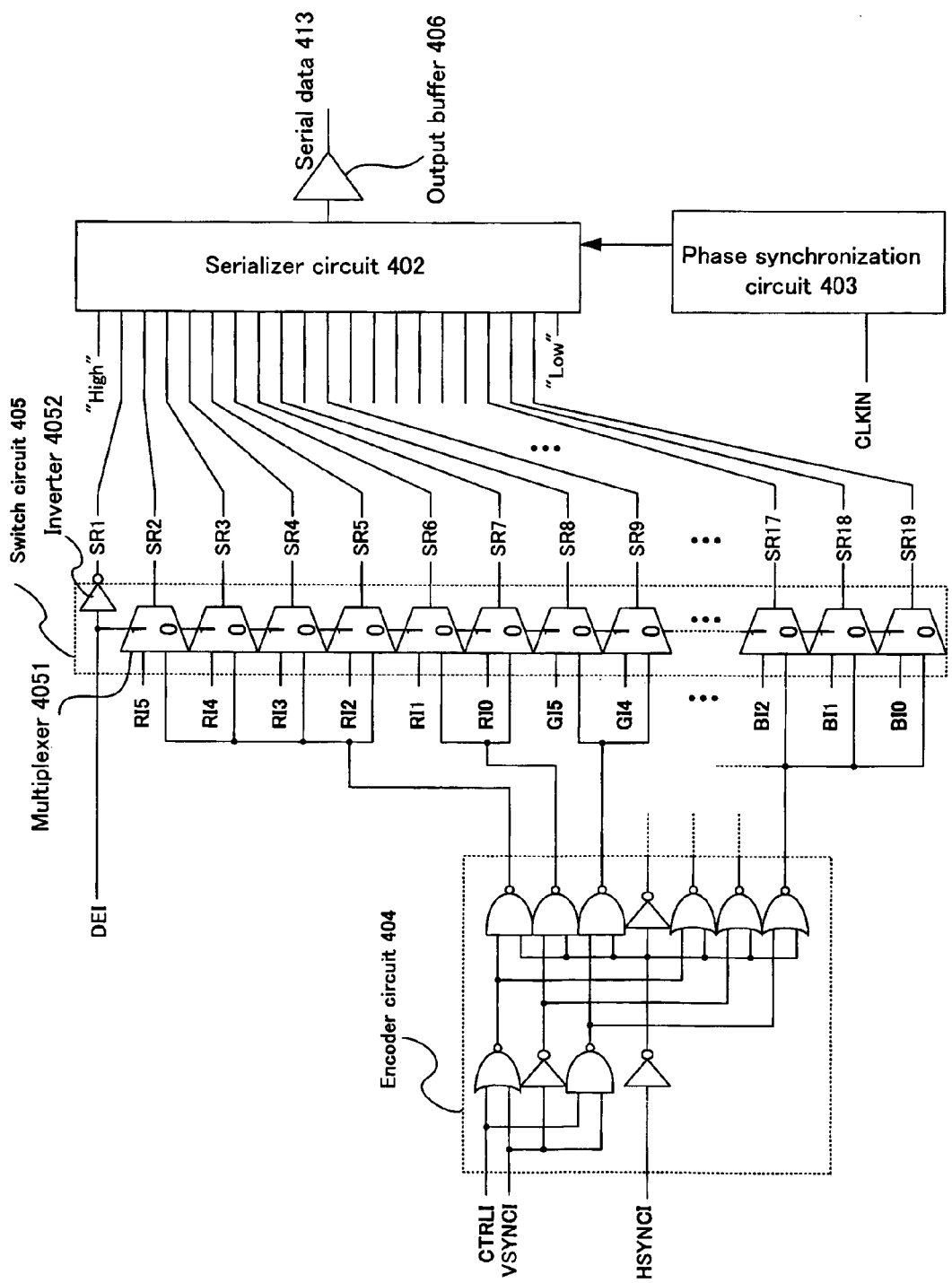
FIG. 51 is a diagram showing a transmitter unit according to one example of the present invention.

Referring to FIG. 47, FIG. 47 shows the configuration of the transmitter unit 401 of the present example. The encoder circuit 404 includes four NAND circuits, four NOR circuits and three inverter circuits. The switch circuit 405 includes a number of (18) multiplexers 4051 corresponding to the input color data 411 (RI5 to RI0, GI5 to GI0, BI5 to BI0), and an inverter 4052. In the present example, the output from the encoder circuit 404 is a 7-bit output, and a "high" signal is input to two of the multiplexers 4051 while a "low" signal is input to other two of the multiplexers 4051 so as to form stop guard bits. FIG. 51 shows an example where the stop guard bits are not provided.

Hsync, Vsync and CTRLI are input to the encoder circuit 404. The input Hsync, Vsync and CTRLI are encoded by the encoder circuit 404, and the encoded 7-bit data is output to the switch circuit 405.

Referring now to FIG. 48(A) and FIG. 48(B), the operation of the encoder circuit 404 will be described. FIG. 48(A) shows the circuit configuration of the encoder circuit 404 of the present example and the 7-bit output therefrom (SYNC[0] to SYNC[6]). FIG. 48(B) shows a data table of Hsync, Vsync and CTRLI input to the encoder circuit 404 of the present example and output data therefrom (SYNC[0] to SYNC[6]).

As shown in the data table of FIG. 48(B), the output data (SYNC[0] to SYNC[6]) from the encoder circuit 404 is such that when the input data Hsync, Vsync and CTRLI are received, the number of transitions is limited. In other words, 3-bit data {Hsync, Vsync, CTRLI} in which the most significant bit (MSB) is HsyncI and the least significant bit (LSB) is CTRLI is encoded into 7-bit data {SYNC[0] (most significant bit) to SYNC[6] (least significant bit)} so that as the value of the 3-bit data increases by one, the number of consecutive "high" data values to be output starting from the most significant bit of the 7-bit data increases. That is, the encoding operation is performed so as to output the 7-bit data {SYNC[0] (most significant bit) to SYNC[6] (least significant bit)} such that a value of an upper bit is always higher than a value of a lower bit. Such an output scheme is generally called "thermo-code", such encoding is called "thermo-code" type encoding, and such an encoder is called a "thermo-code" type encoder.

The encoder circuit 404 used in the digital data transfer method of the present invention and the system thereof is required to employ a thermo-code type output scheme. Note that the circuit configuration of the encoder circuit 404 is not limited to that shown in FIG. 48(A), but may be any suitable circuit configuration as long as it employs a thermo-code type output scheme. Thus, only one rising edge is produced within one symbol.

Referring again to FIG. 47, the output data (SYNC[0] to SYNC[6]) from the encoder circuit 404 and DEI (input data enable) are input to the switch circuit 405. In the present example, the input color data 411 (RI5 to RI0, GI5 to GI0, BI5 to BI0) are input successively to the multiplexers 4051 connected in parallel to one another forming the switch circuit 405, with "high" being input to the other input of the switches 4051 that are receiving RI5 and RI4 of the input color data 411 and "low" being input to the other input of the switches 4051 that are receiving BI1 and BI0. DEI is input to the other input of the switch 4051 that is receiving RI5 of the input color data 411. The switch circuit 405 outputs data (SR1 to SR19) to the serial circuit 402 based on the received DEI, the input color data 411 and the output data (SYNC[0] to SYNC[6]) from the encoder circuit 404.

Based on the input clock 414, the phase synchronization circuit 403 forms a plurality of clocks of different phases, and outputs them to the serializer circuit.

The serializer circuit 402 serializes the input data (SR1 to SR19) based on the plurality of clocks of different phases from the phase synchronization circuit 403 to form the serial data 415, and outputs the serial data 415 to the receiver unit 421 through the output buffer 406.

Figure 49:
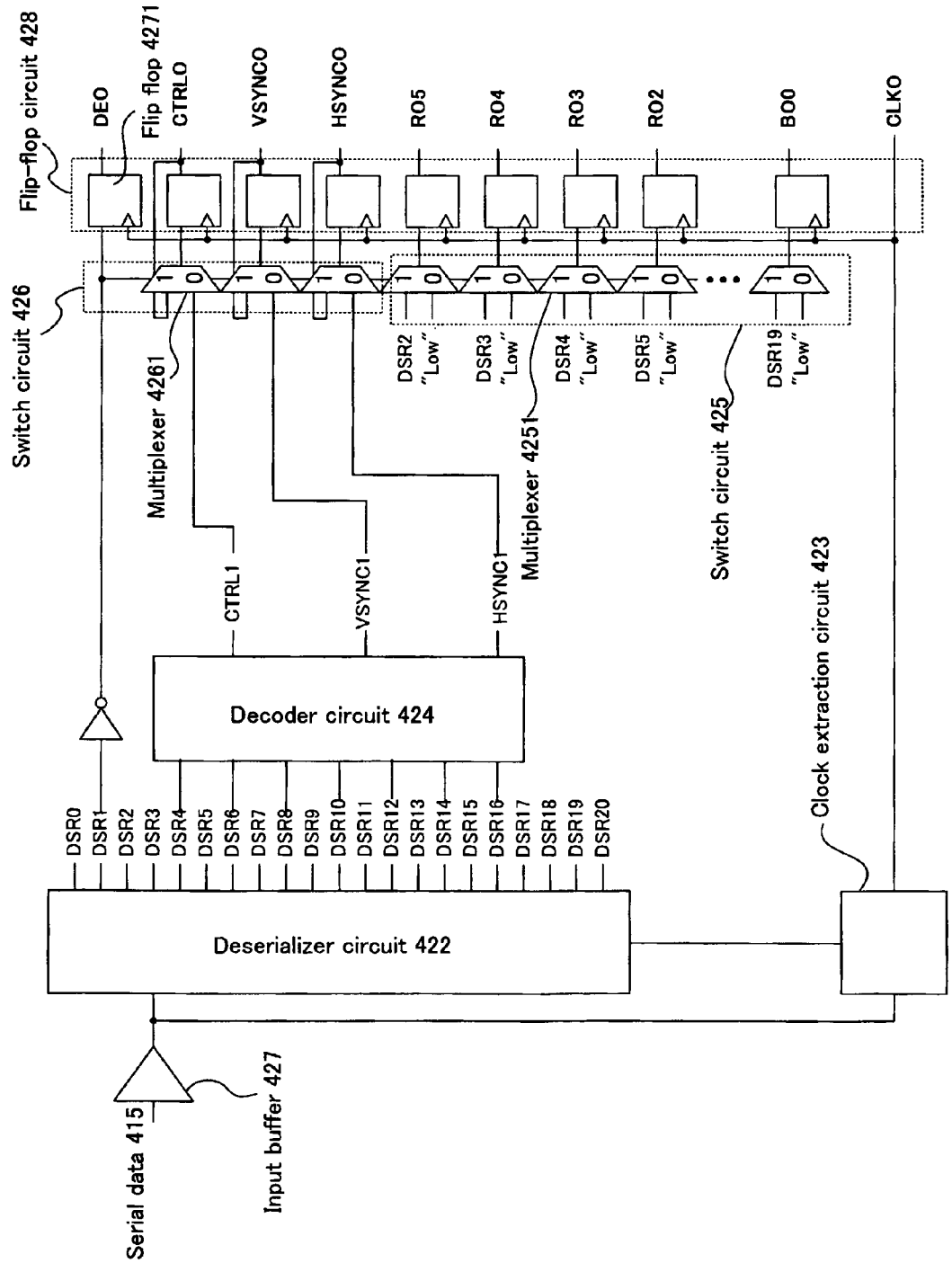
FIG. 49 is a diagram showing a receiver unit according to one example of the present invention.

FIG. 49 shows the configuration of the receiver unit 421 of the present example. The serial data 415 output from the transmitter unit 401 is input to the deserializer circuit 422 and the clock extraction circuit 423 through the input buffer 427. The clock extraction circuit 423 extracts the clock from the serial data 415 to recover the output clock 434 and a plurality of clocks of different phases. The deserializer circuit 422 deserializes the serial data 415 based on the plurality of clocks of different phases recovered by the clock extraction circuit 423, and outputs the output data (DSR0 to DSR20) to the decoder circuit 424 and the switch circuits 425 and 426. The decoder circuit 424 receives part of the output data (DSR0 to DSR20) that corresponds to the synchronization data (DSR4, DSR6, DSR8, DSR10, DSR12, DSR14 and DSR16 in the present example). The decoder circuit 424 decodes the received data and outputs data corresponding to the output synchronization data 432 (HsyncO, VsyncO, CTRLO) to the switch circuit 426.

Figure 50:
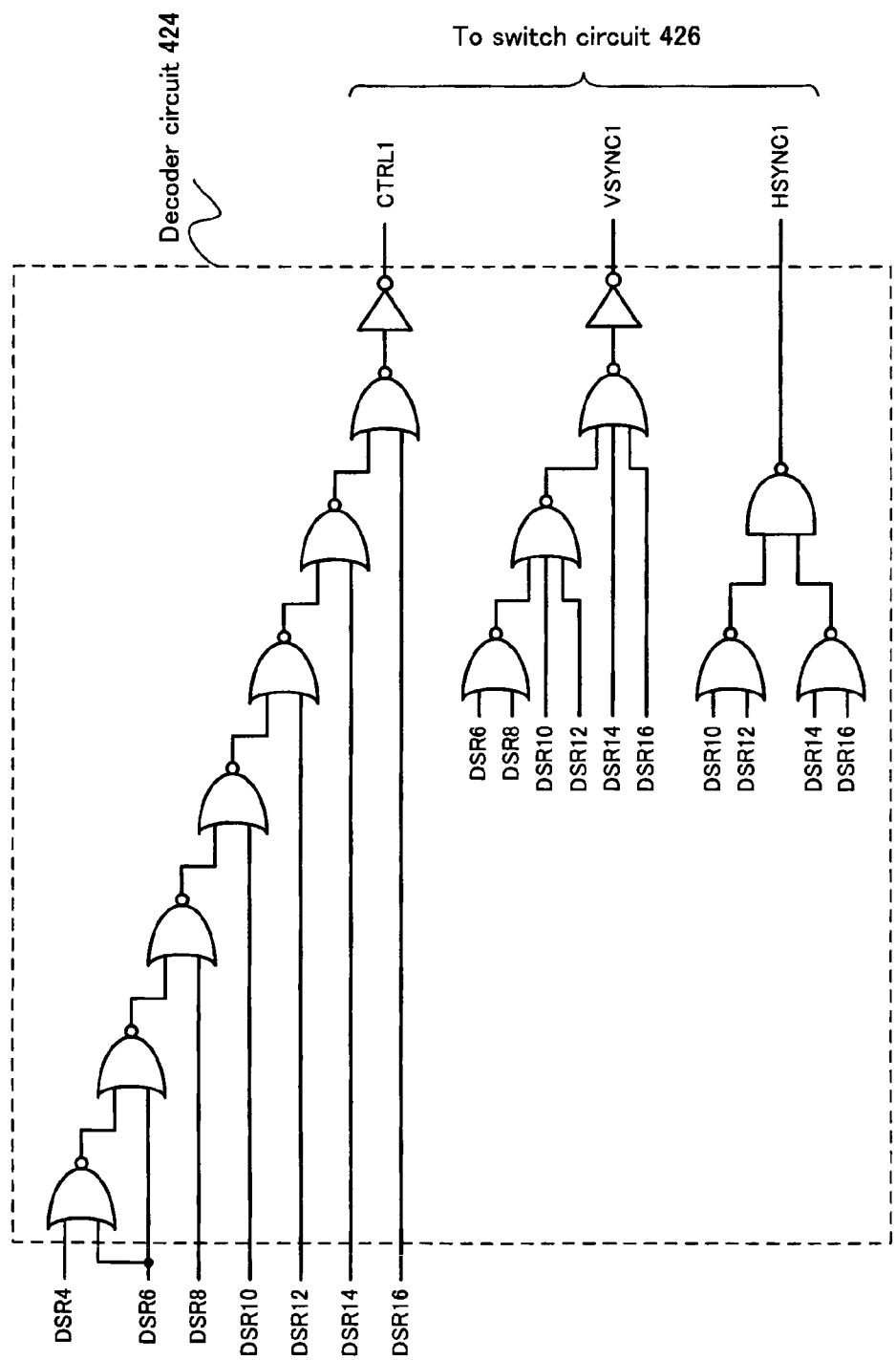
FIG. 50 is a diagram showing a decoder circuit according to one example of the present invention.

FIG. 50 shows the circuit configuration of the decoder circuit 424 of the present example. The decoder circuit 424 of the present example includes 12 NOR circuits, one NAND circuit and two inverter circuits. The circuit configuration of the decoder circuit is not limited to any particular circuit configuration as long as it is capable of decoding a "thermocoded" synchronization signal, and is not limited to the circuit configuration shown in FIG. 50.

Referring again to FIG. 49, the switch circuits 425 and 426 select data input from the deserializer circuit 422 and the decoder circuit 424 based on the plurality of clocks of different phases input from the clock extraction circuit 423, and output the selected data to a flip-flop circuit 428. The flip-flop circuit 428 includes 22 flip-flops 4271, and outputs the output color data (RO5 to RO0, GO5 to GO0, BO5 to BO0), the output synchronization data 432 (HsyncO, VsyncO, CTRLO) and EDO.

Thus, the input color data 411, the input synchronization data 412 and the input clock 414, which are input as parallel data, are serialized and then transmitted by the transmitter unit 401. Then, in the receiver unit, the transmitted data are deserialized, and the output color data 431, the output synchronization data 432 and the output clock 434 are recovered therefrom.

According to the present example, the number of rising edges per one symbol of serial data is fixed to one during blanking periods, making it possible to reduce errors occurring due to waveform degradation when extracting the clock from the serial data, thus realizing stable data transfer.

Figure 52:
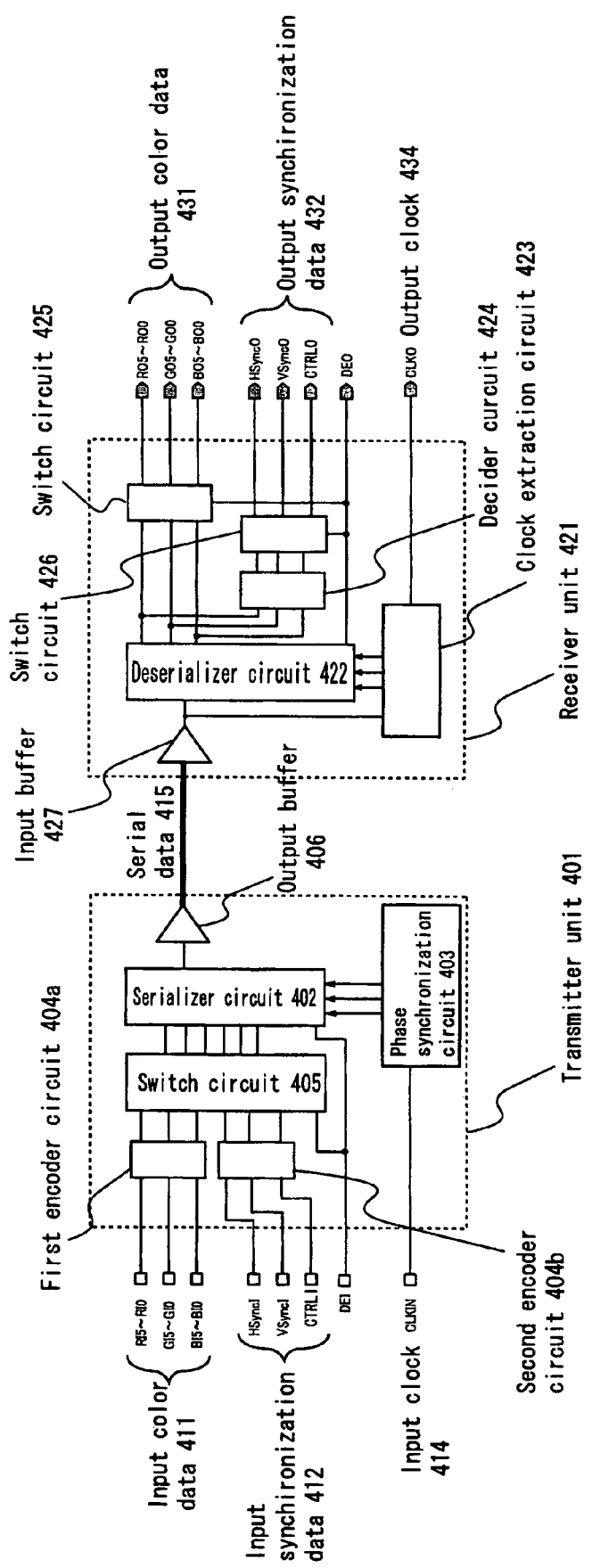
FIG. 52 is a diagram showing one example of the present invention.

Note that the transmitter unit 401 may include a first encoder 404*a* and a second encoder 404*b*, wherein the input color data 411 is input to the first encoder 404*a* and the input synchronization data 412 to the second encoder 404*b*, as shown in FIG. 52. In the present example, it may be considered that the input color data 411 is encoded by the first encoder 404*a* and input to the switch circuit 405.

EXAMPLE 6

Example 6 is an example where Example 5 in which the input color data is 6-bit data is applied to a case where the input color data is 8-bit data.

Figure 53:
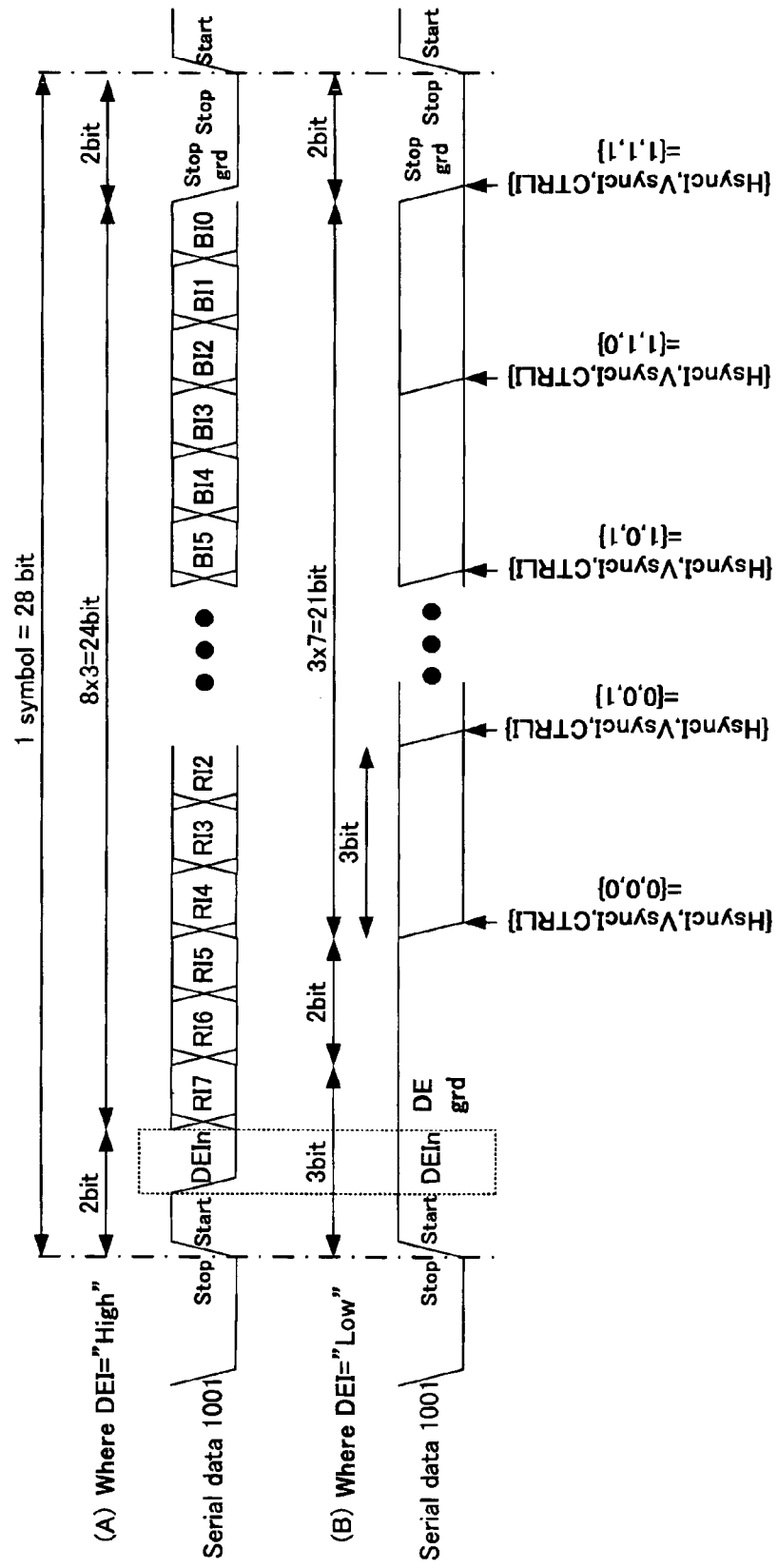
FIG. 53 is a diagram showing serial digital data according to one example of the present invention.

FIG. 53(A) and FIG. 53(B) show examples of signal waveforms of serial data 1001 obtained by serializing, in the receiver-side unit, input color data (RI7 to RI0, GI7 to GI0, BI7 to BI0) having eight bits for each color, synchronization data (HsyncI (input horizontal synchronization data), VsyncI (input vertical synchronization data), CTRLI (input control)), and DEI (input selection signal (input data enable)), which are input as parallel data, according to the present example.

First, while DEI (data enable)="high", i.e., in the active period, one symbol of the serial data 1001 is formed by data that is obtained by serializing the start bit (Start), the data enable inverted signal (DEIn), the color data (RI7, RI6, ..., BI2, BI1, BI0), the stop guard bit (Stop grd) and the stop bit (Stop) in this order. Note that one symbol has 28 bits in the present example.

While DEI (data enable)="low", i.e., in the blanking period, one symbol of the serial data 1001 is formed by data that is obtained by serializing the start bit (Start), the data enable inverted signal (DEIn), the data enable guard bit (DE grd), the encoded HsyncI, VsyncI and CTRLI, the stop guard bit (Stop grd) and the stop bit (Stop) in this order. Again, while DEI="low", i.e., in the blanking period, HsyncI, VsyncI and CTRLI are serialized after being encoded so that there is only one rising edge within one symbol of the serial data 1001.

With such a data structure where there is only one rising edge within one symbol as in the present example, it is possible to sufficiently reduce the possibility of errors when recovering the clock from the serial data including the synchronization data transmitted in the blanking period.

EXAMPLE 7

Example 7 is an example where a DE filter 1101 and a flip-flop circuit 1102 are further provided in the receiver unit 421 of the present invention shown in FIG. 45 and described in Example 5 above.

Figure 54:
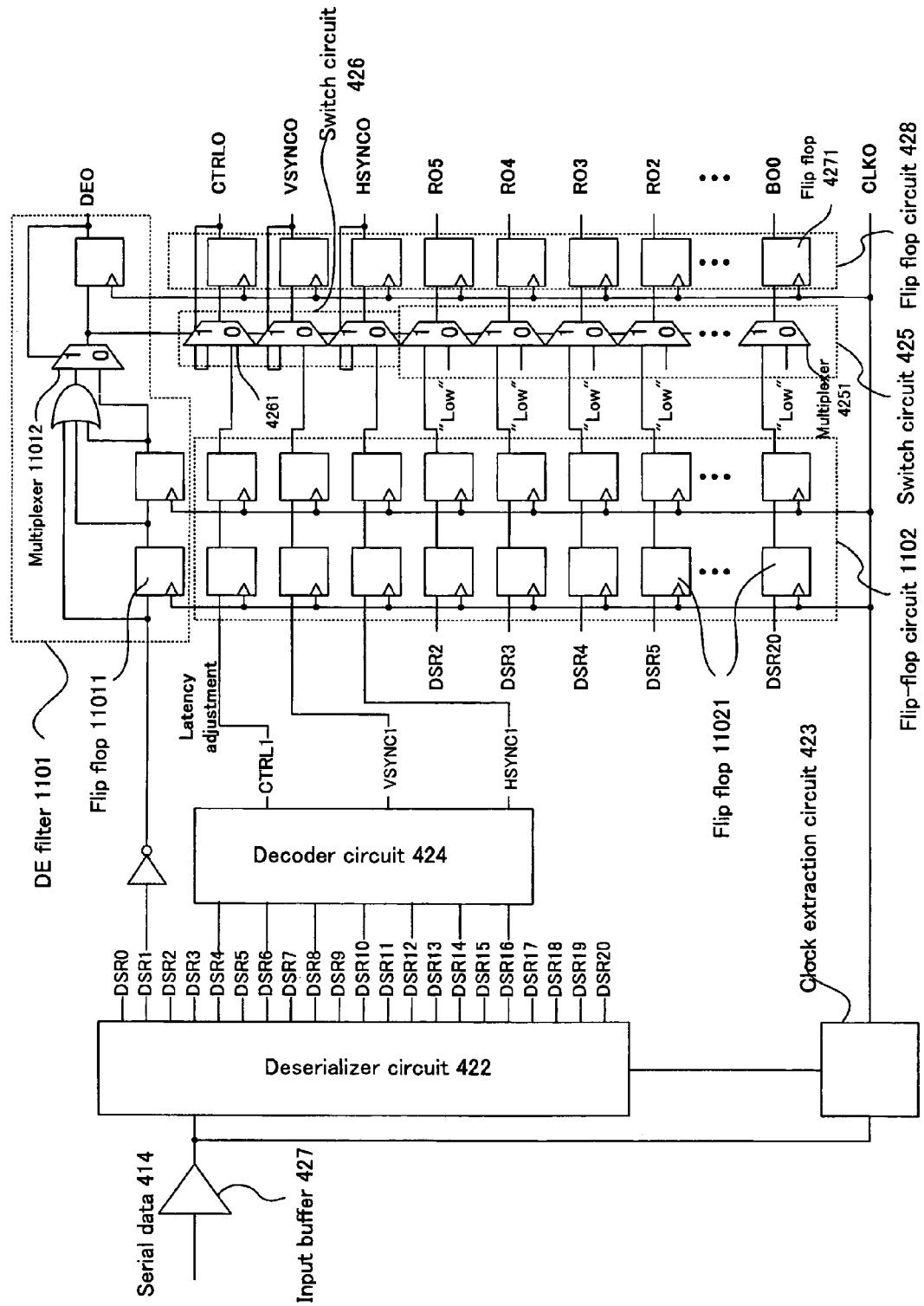
FIG. 54 is a diagram showing a receiver unit according to one example of the present invention.

FIG. 54 shows a circuit block diagram of the receiver unit of the present example. In the present example, the output DSR1 among the data (DSR0 to DSR20) output from the parallel circuit 422 that corresponds to DEI is input to the DE filter 1101.

Figure 55:
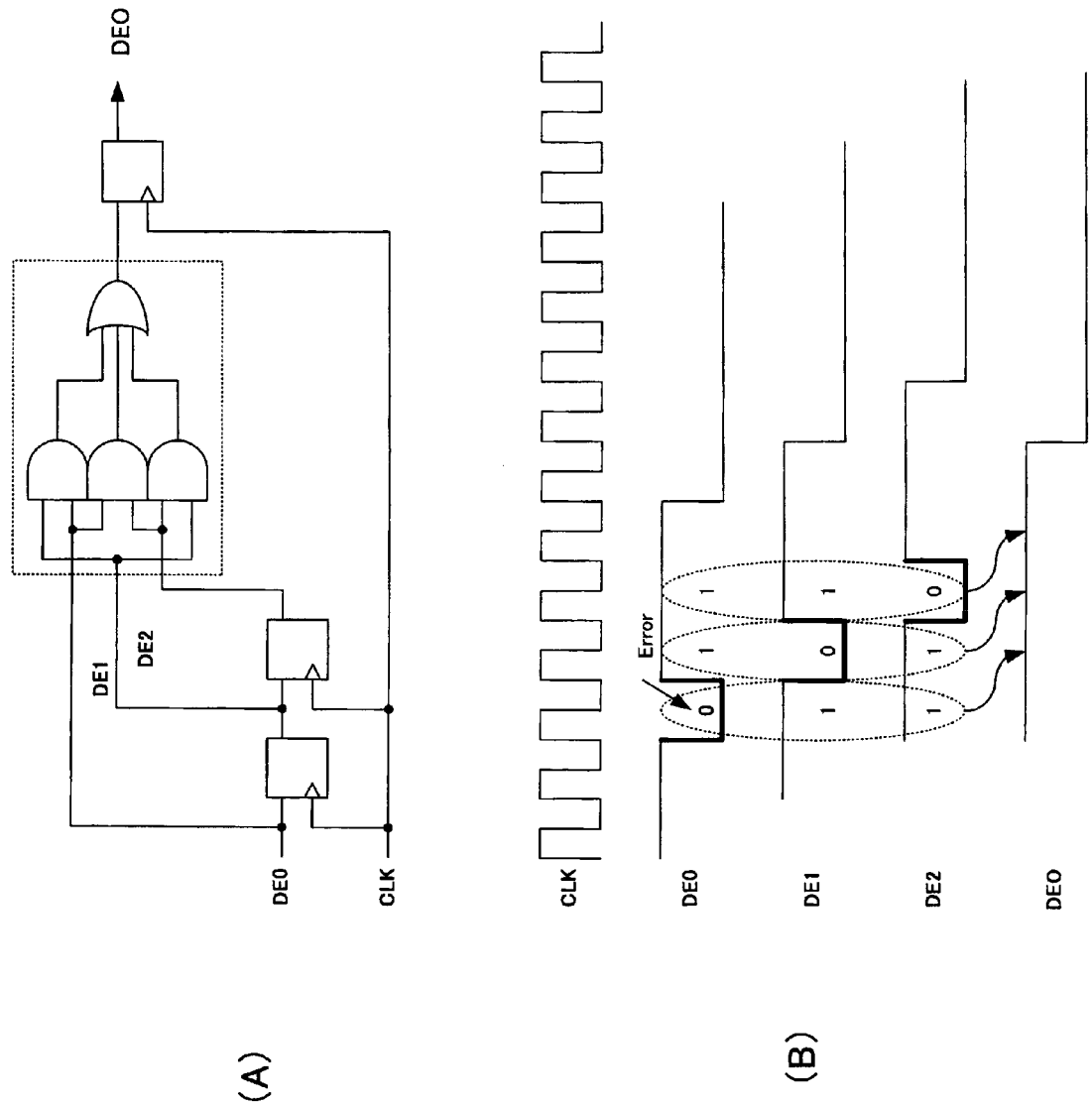
FIG. 55 is a diagram showing a DE filter according to one example of the present invention.

The function of the DE filter 1101 will be described with reference to FIG. 55. FIG. 55(A) shows a circuit configuration of the DE filter 1101, and FIG. 55(B) shows a timing chart of the data (DE0, DE1, DE2, DEO) in the DE filter 1101. The DE filter 1101 of the present embodiment includes a majority logic circuit 1101*a* and three flip-flops, the majority logic circuit 1101*a* including one OR circuit and three AND circuits.

As a characteristic of a DEI signal, a pulse of only one bit will not be output, but the pulse of the signal extends over a few bits. Therefore, if there is a pulse of only one bit, it is an error, which is filtered by the DE filter 1101. The DE filter 1101 includes a flip-flop circuit for delaying DEI, and the majority logic circuit 1101*a*. The majority logic circuit 1101*a* outputs "1" if the majority of its three inputs are "1" and outputs "0" if the majority of its three inputs are "0". In the waveform shown in FIG. 55(B), errors denoted by bold lines are filtered by the majority logic circuit 2540. With the circuit configuration shown in FIG. 55(A), even if an error occurs in DEO input to the DE filter 1101, the error is filtered, and so there is a very low possibility of errors occuring in the output DEO.

Referring again to FIG. 54, the synchronization signals Hsync, Vsync and CTRL decoded by the decoder circuit 424 and the color data DSR [20:0] output from the deserializer circuit 422 are output to the flip-flop circuit 1102. The flip-flop circuit 1102 includes 42 flip-flops 11021, and outputs data to the switch circuits 425 and 426. The switch circuits 425 and 426 selectively output the received data to the flip-flop circuit 428 based on the DE signal from the DE filter 1101. The flip-flop circuit 428 outputs the output color data (RO5 to RO0, GO5 to GO0, BO5 to BO0) and the output synchronization data 432 (HsyncO, VsyncO, CTRLO).

Thus, the input color data 411, the input synchronization data 412 and the input clock 414, which are input as parallel data, are serialized and then transmitted by the transmitter unit 401. Then, in the receiver unit 421, the transmitted data are deserialized, and the output color data 431, the output synchronization data 432 and the output clock 433 are recovered therefrom.

In the present example, the DE filter 1101 is provided, as a result of which there is a very low possibility of errors occuring in the output DEO. It is therefore possible to more accurately extract DEO.

EXAMPLE 8

Example 8 is an example where the "DC balance" operation (an operation performed so that the number of 1's and the number of 0's are substantially equal to each other) is performed for the color data and the synchronization data when forming the serial data in the transmitter unit.

Figure 56:
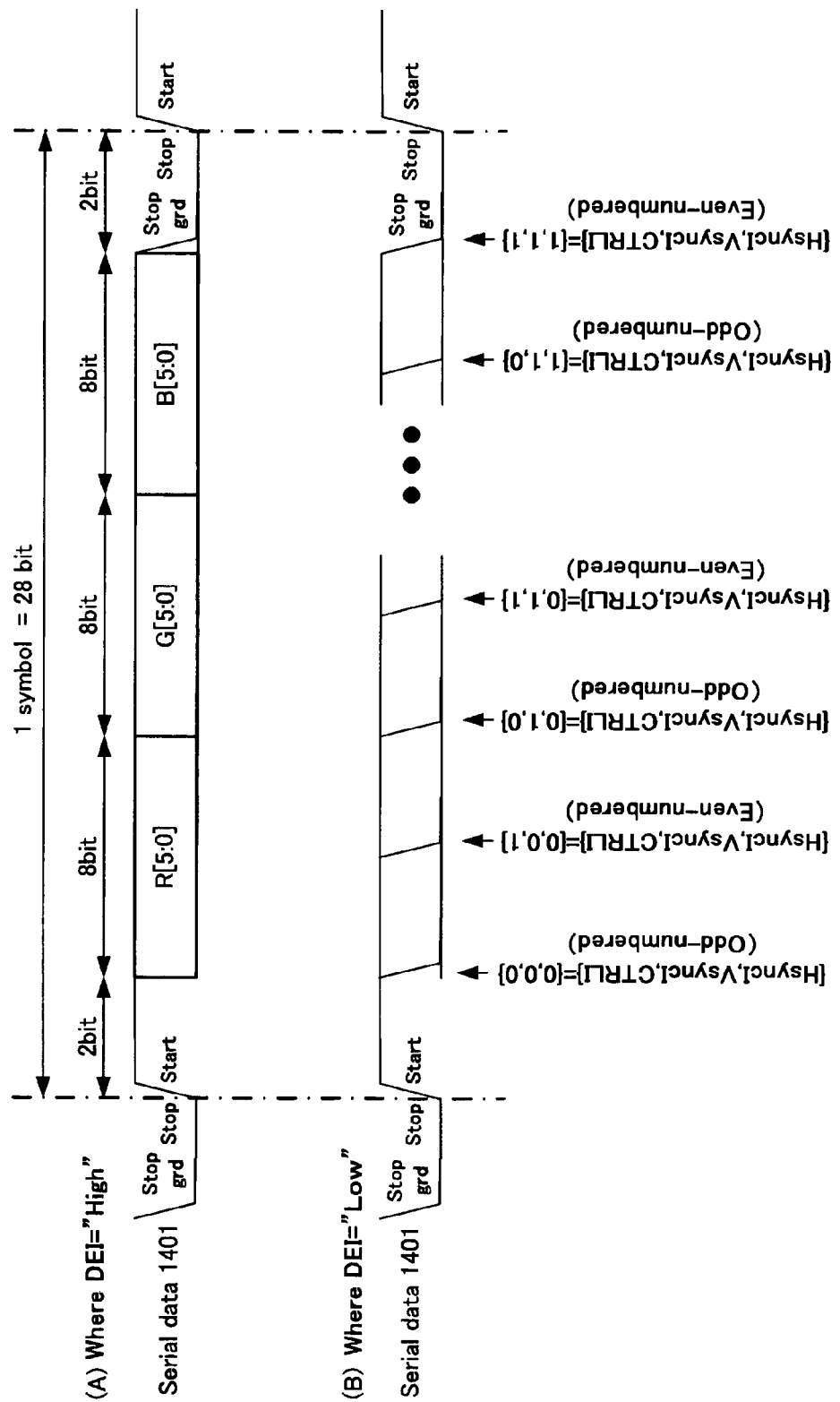
FIG. 56 is a diagram showing serial digital data according to one example of the present invention.

FIG. 56 shows a data structure of serial data 1401 in the present example. First, while DEI (data enable)="high", i.e., in the active period, one symbol of the serial data 1401 is formed by data that is obtained by serializing the start bit (Start), color data (R[5:0], G[5:0], B[5:0]) obtained by encoding R, G and B color data, each having six bits, to 8-bit data, the stop guard bit (Stop grd) and the stop bit in this order.

Figure 57:
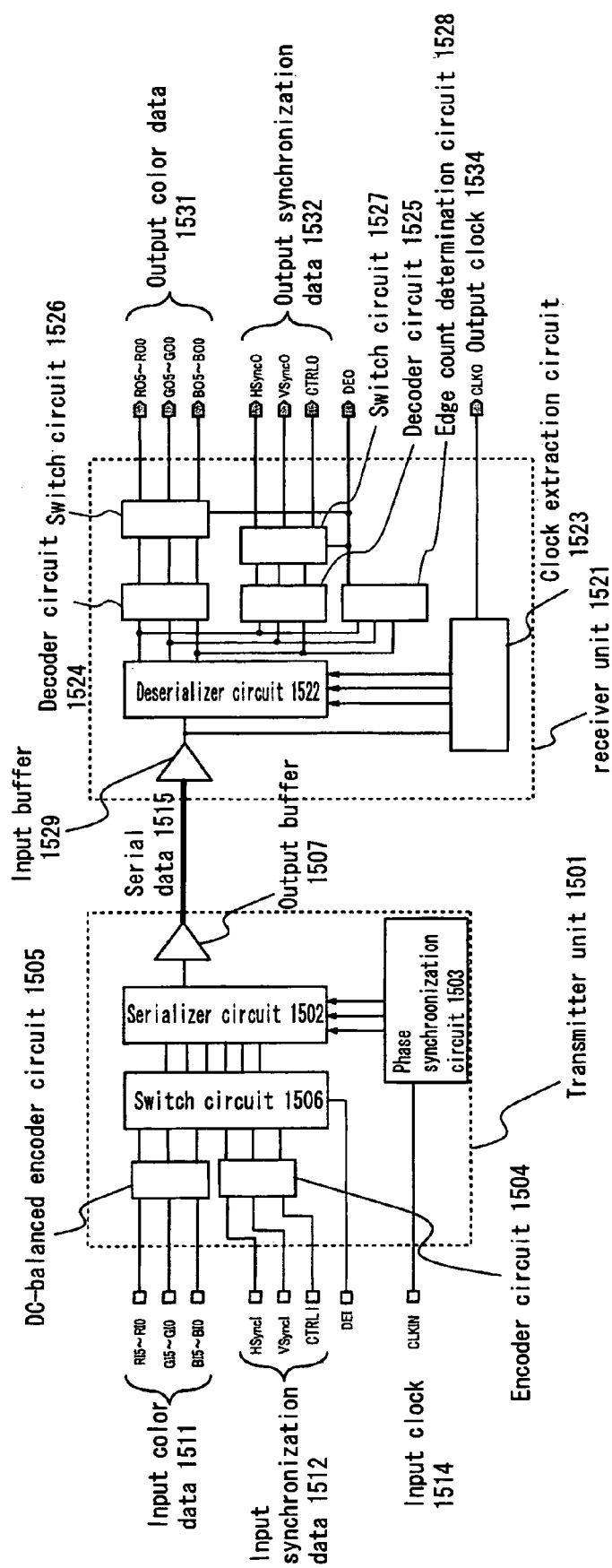
FIG. 57 is a diagram showing one example of the present invention.
Figure 58:
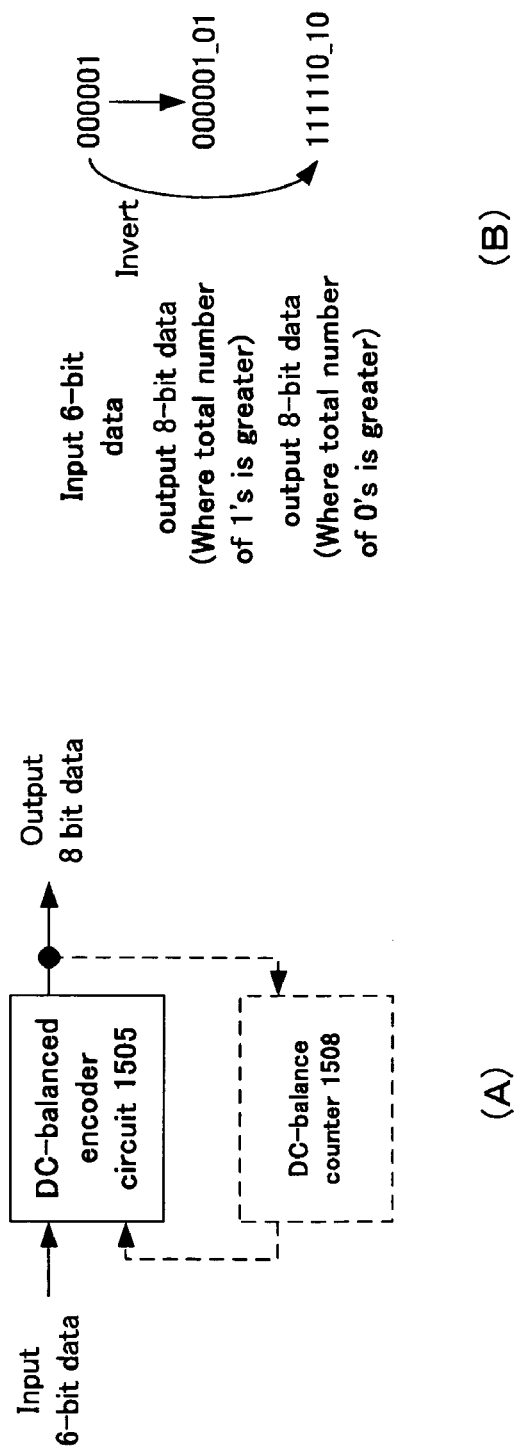
FIG. 58 is a diagram showing a DC-balanced encoder circuit according to one example of the present invention.

In the present example, the "DC balance" operation is performed when encoding the R, G and B color data, each having six bits, to 8-bit data using a DC-balanced encoder circuit 1505 as shown in FIG. 57 and FIG. 58(A) so that the total number of "high"s (=1) and the total number of "low"s (=0) converge into the same number for consecutive symbols each containing R, G and B 8-bit data. For example, consider a case where input 6-bit color digital data is "000001" as shown in FIG. 58(B). If there are more "1"s than "0"s in the digital data, it is encoded into 8-bit data by adding "01" following the lowermost bit of the 6-bit color digital data. If there are "0" that "1"s in the digital data, it is encoded into 8-bit data by inverting the 6-bit color digital data and adding "10" following the lowermost bit thereof. The color data, which has been encoded into 8-bit data as described above, is output to, and selected by, the switch circuit and is output to the serializer circuit. Each converted 8-bit data always contains "1" and "0", and serial data obtained by connecting together these 8-bit data always contains two or more rising edges.

While DEI (data enable)="low", i.e., in the blanking period, one symbol of the serial data 1401 is formed by data that is obtained by serializing the start bit (Start), the encoded HsyncI, VsyncI and CTRLI, the stop guard bit (Stop grd) and the stop bit (Stop) in this order. Thus, in the blanking period, HsyncI, VsyncI and CTRLI are encoded into thermo-code type data and then serialized so that there is only one rising edge in one symbol in the serial data 1401. Also in the period where DEI="low", pulse width modulation is performed so that the encoded HsyncI, VsyncI and CTRLI maintain a DC balance. In the present example, as shown in FIG. 56(B), HsyncI, VsyncI and CTRLI, which have been encoded into thermo-code type data, are assigned to a pulse width α, and each odd-numbered data is modulated into a pulse width (0.5+α) and sent to the switch circuit while each even-numbered data is modulated into a pulse width (0.5−α) and sent to the switch circuit. In this way, the average pulse width in one symbol is 0.5, thus maintaining a DC balance.

Referring to FIG. 57, FIG. 57 shows a digital data transmitter circuit and a receiver circuit of the present example, a digital data transfer method using the same and a system thereof.

Reference numeral 1501 denotes a transmitter unit (transmitter circuit) for serializing input color data 1511 (RI5 to RI0, GI5 to GI0, BI5 to BI0) and input synchronization data 1512 (HsyncI (input horizontal synchronization data), VsyncI (input vertical synchronization data), CTRLI (input control), DEI (input selection signal (input data enable))), which are input in synchronism with the input clock, to form and transmit serial data 1515 to a receiver unit 1521.

The receiver unit (receiver circuit) 1521 receives and deserializes the serial data 1515 transmitted from the transmitter unit 1501 and recovers therefrom output color data 1531 (RO5 to RO0, GO5 to GO0, BO5 to BO0), output synchronization data 1532 (HsyncO (output horizontal synchronization data), VsyncO (output vertical synchronization data), CTRLO (output control), DEO (output selection signal (output data enable))), and an output clock 1534.

The transmitter unit 1501 includes a serializer circuit 1502 (Serializer), a phase synchronization circuit 1503 (PLL circuit: Phase Locked Loop circuit), an encoder circuit 1504 (Encoder), the DC-balanced encoder circuit 1505 (DC Balance Encoder), a switch circuit 1506 and an output buffer 1507 (Output Buffer).

The receiver unit 1521 includes a deserializer circuit 1522 (De-serializer), a clock extraction circuit (CDRPLL circuit: Clock Data Recovery Phase Locked Loop circuit) 1523, decoder circuits 1524 and 1525 (Decoder), switch circuits 1526 and 1527, an edge count determination circuit 1528 and an input buffer 1529 (Input Buffer). Note that the output buffer 1507 and the input buffer 1529 may be optional. While R, G and B data are each 6-bit data for the input color data 1511 in the present example, it is understood that the present invention is not limited to this.

The input color data 1511 is input to the DC-balanced encoder circuit 1505 of the transmitter unit 1501, where it is DC-balanced, and is output to the switch circuit 1506. DEI (input data enable) is input to the switch circuit 1506. Other than this, the configuration is similar to that shown in FIG. 45.

In the transmitter unit 1501, the input color data is input to the DC-balanced encoder circuit 1505 and encoded into 24-bit data. The encoding operation is performed so that each of the 6-bit R, G and B data is converted to DC-balanced 8-bit data. Since each 8-bit data contains both "1" and "0", data obtained by serializing the 24 bits in the order of R, G and B will contain two or more rising edges.

The input synchronization data 1512 excluding DEI, i.e., HSYNCI, VSYNCI, CTRLI, are input to the encoder circuit 1504 and encoded into thermo-code type data. They are output from the encoder circuit 1504 so that MSB is at a higher level than LSB, where MSB is the signal that comes earlier in time within one symbol when the data is serialized, and are serialized by the serializer circuit 1502 successively from MSB to LSB. Therefore, where DEI is low, the data is such that the output from the serializer circuit is at a higher level earlier in time within one symbol, so that a rising edge occurs only between symbols.

The switch circuit 1506 uses DEI as an input selection signal to select the result obtained by encoding the input color data by the DC-balanced encoder circuit 1505 if DEI is high and select the output of the encoder circuit 1504 if DEI is low, and outputs the selected signal to the serializer circuit 1502. An input clock 1514 is converted by the phase synchronization circuit 1503 to a multiphase clock, and the serializer circuit 1502 uses the multiphase clock to serialize the output of the switch circuit 1506 to output the obtained signal through the output buffer 1507.

With such a configuration, there are two or more rising edges within one symbol excluding those between symbols when DEI is high, and a rising edge in one symbol occurs only between symbols when DEI is low.

In the receiver unit 1521, first, the clock extraction circuit 1523 recovers the output clock (CLKO) 1534 and the multiphase clock from the serial data 1515. Then, by using the multiphase clock, the serial data 1515 is converted by the deserializer circuit 1522 to a parallel signal. The parallel signal is input to the edge count determination circuit 1528. The edge count determination circuit 1528 outputs a high signal as DEO if there is a rising edge other than those between symbols, and otherwise outputs a low signal as DEO. The parallel signal is input to the decoder circuit 1524 and is decoded so as to reverse the encoding operation performed by the DC-balanced encoder circuit 1505 of the transmitter unit 1501. The parallel signal is similarly input also to the decoder circuit 1525 and is decoded so as to reverse the encoding operation performed by the encoder circuit 1504 of the transmitter unit 1501. When DEO is high, the switch circuit 1526 is active and outputs the output of the decoder circuit 1524 as the output color data 1531. When DEO is low, the switch circuit 1526 outputs a low level as the output color data. When DEO is low, the switch circuit 1527 is active and outputs the output of the decoder circuit 1525 as the output synchronization data 1532. When DEO is high, the switch 426 maintains the output.

As denoted by dotted lines in FIG. 58(A), the DC-balanced encoder circuit 1505 for DC-balancing the input color data may be provided with a DC balance counter so that the color data output from the DC-balanced encoder circuit 1505 is DC-balanced.

EXAMPLE 9

Example 9 is an example where an encoder circuit is not used in the transmitter-side unit and a decoder circuit is not used in the receiver-side unit.

Figure 59:
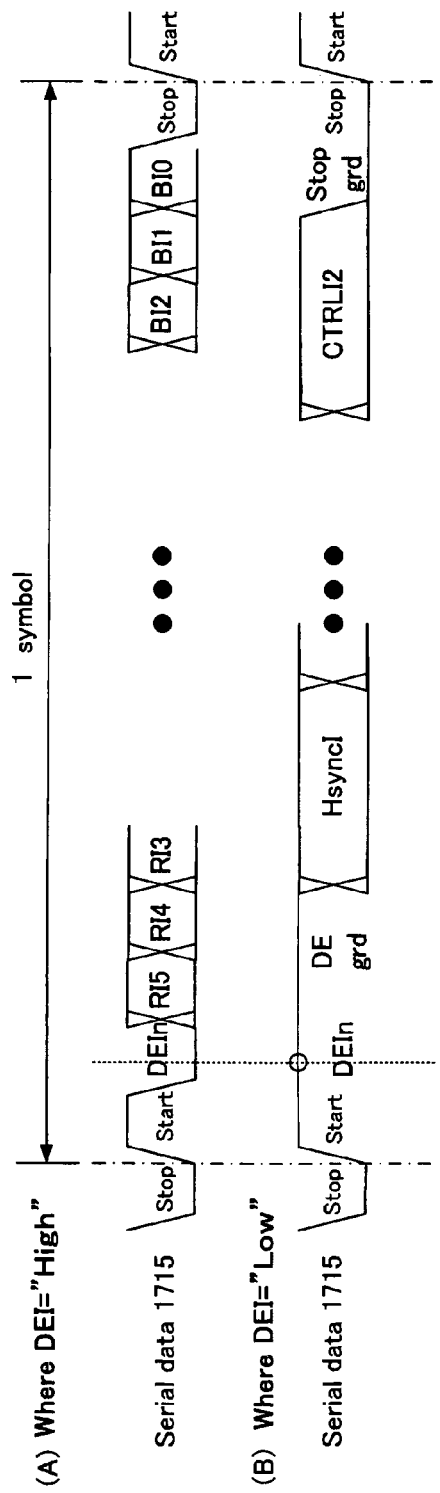
FIG. 59 is a diagram showing one example of the present invention.

FIG. 59(A) and FIG. 59(B) show examples of signal waveforms of serial data 1715 obtained by serializing, in the receiver-side unit of the present example, color data (RI5 to RI0, GI5 to GI0, BI5 to BI0) having six bits for each color and synchronization data (HsyncI, VsyncI, CTRLI0 to CTRLI2, DEI), which are input as parallel data.

First, while DEI (data enable)="high", i.e., in the active period, one symbol of the serial data 1715 has a data structure that is obtained by serializing the start bit (Start), the data enable inverted signal (DEIn), the color data (RI5, RI4, . . . , BI2, BI1, BI0) and the stop bit (Stop) in this order.

While DEI (data enable)="low", i.e., in the blanking period, one symbol of the serial data 1715 has a data structure that is obtained by serializing the start bit (Start), the data enable inverted signal (DEIn), the data enable guard bit (DE grd), HsyncI, VsyncI and CTRLI0 to CTRLI2, the stop guard bit (Stop grd) and the stop bit (Stop) in this order.

In the present example, the data enable guard bit (DE grd) is provided following the data enable inverted signal (DEIn). With the provision of the data enable guard bit (DE grd), the data enable inverted signal (DEIn), which serves as the recovery point when recovering the parallel data from the serial data 1715, is extracted with a higher precision, making it possible to reduce the possibility of sampling errors when sampling the synchronization data, and it is possible to recover the clock with a high precision.

In the present example, the stop guard bit (Stop grd) is provided following the synchronization data. In this way, it is possible to more accurately extract the next synchronization data, thus increasing the reliability in the transfer of the synchronization data and realizing stable data transfer.

Figure 60:
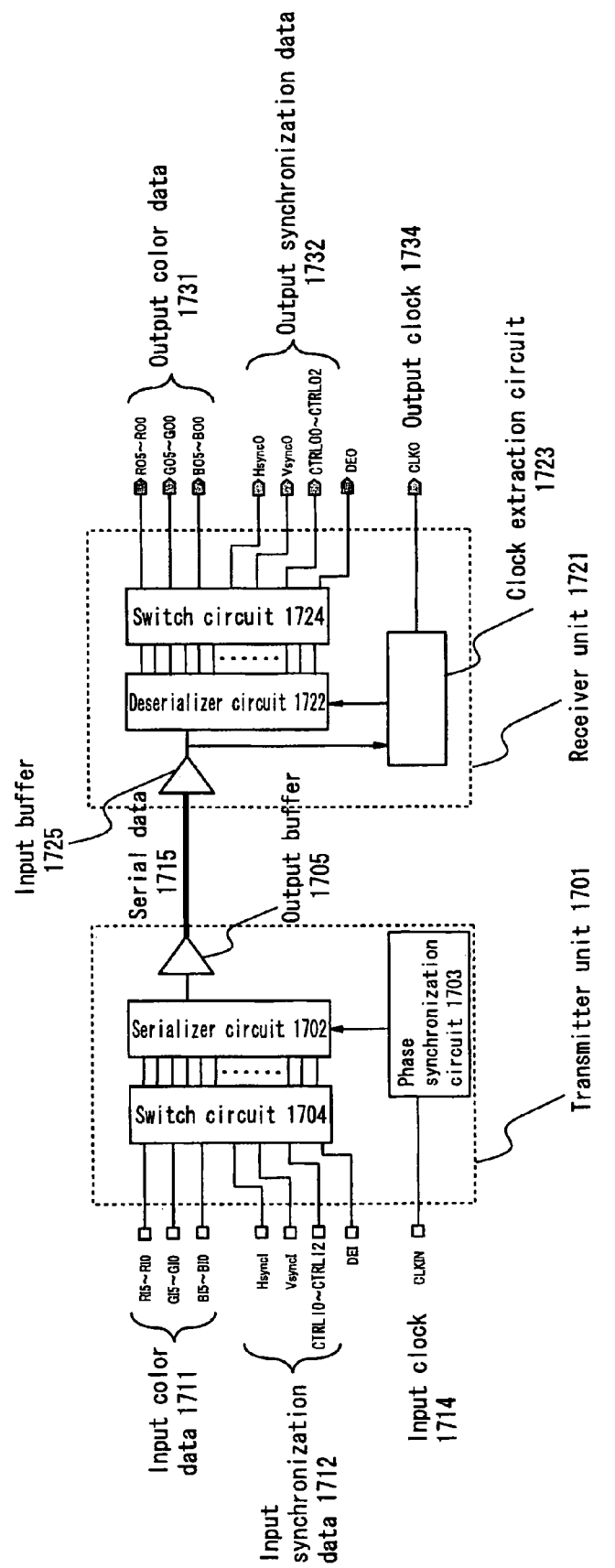
FIG. 60 is a diagram showing one example of the present invention.

The configuration of the data transfer system of the present example will now be described with reference to FIG. 60. Reference numeral 1701 denotes a transmitter unit for serializing input color data 1711 (RI5 to RI0, GI5 to GI0, BI5 to BI0), input synchronization data 1712 (HsyncI (input horizontal synchronization data), VsyncI (input vertical synchronization data), CTRLI0 to CTRLI2 (input controls 0 to 2), DEI (input selection signal (input data enable))) and an input clock 1714 to form and transmit the serial data 1715 to a receiver unit 1721.

The receiver unit 1721 receives and deserializes the serial data 1715 transmitted from the transmitter unit 1701 and recovers therefrom output color data 1731 (RO5 to RO0, GO5 to GO0, BO5 to BO0), output synchronization data 1732 (HsyncO (output horizontal synchronization data), VsyncO (output vertical synchronization data), CTRLO0 to CTRL2 (output controls 0 to 2)), an output selection signal 1733 (DEO (output data enable)) and an output clock 1734.

The transmitter unit 1701 includes a serializer circuit 1702 (Serializer), a phase synchronization circuit 1703 (PLL circuit), a switch circuit 1704 and an output buffer 1705 (Output Buffer).

The receiver unit 1721 includes a deserializer circuit 1722 (De-serializer), a clock extraction circuit (CDRPLL circuit) 1723, a switch circuit 1724 and an input buffer 1725 (Input Buffer).

Note that the output buffer 1705 and the input buffer 1725 are optional. While R, G and B data are each 6-bit data for the input color data 1711 in the present example, it is understood that the present invention is not limited to this.

The input color data 1711 and the input synchronization data 1712 are input to the switch circuit 1704 of the transmitter unit 1701. The input clock 1714 is input to the phase synchronization circuit 1703 and is converted by the phase synchronization circuit 1703 to a plurality of clocks having phase differences therebetween, and the plurality of clocks having phase differences therebetween are input to the serializer circuit 1702. The switch circuit 1704 selects data to be output to the serializer circuit 1702 differently when DEI="high" and when DEI="low". The serializer circuit 1702 forms the serial data 1715 based on the input color data 1711 and the input synchronization data 1712 from the switch circuit 1704 and the plurality of clocks having phase differences therebetween from the phase synchronization circuit 1703.

The serial data 1715 is output to the receiver unit 1721 via the output buffer 1705. The deserializer circuit 1722 of the receiver unit 1721 deserializes the serial data 1715 input via the input buffer 1725, and outputs the output to the switch circuit 1724. The clock extraction circuit 1723 recovers the output clock 1734 and a plurality of clocks of different phases based on the received data, and outputs the plurality of clocks of different phases to the deserializer circuit 1722. When DE is high, the switch circuit 1724 outputs the deserialized output color data signal 1731. When DE is low, the switch circuit 1724 outputs a low level as the output color data. When DE is low, the switch circuit 1724 outputs the deserialized synchronization data as the output synchronization data 1532. When DE is high, the switch circuit 1724 maintains the output.

Figure 61:
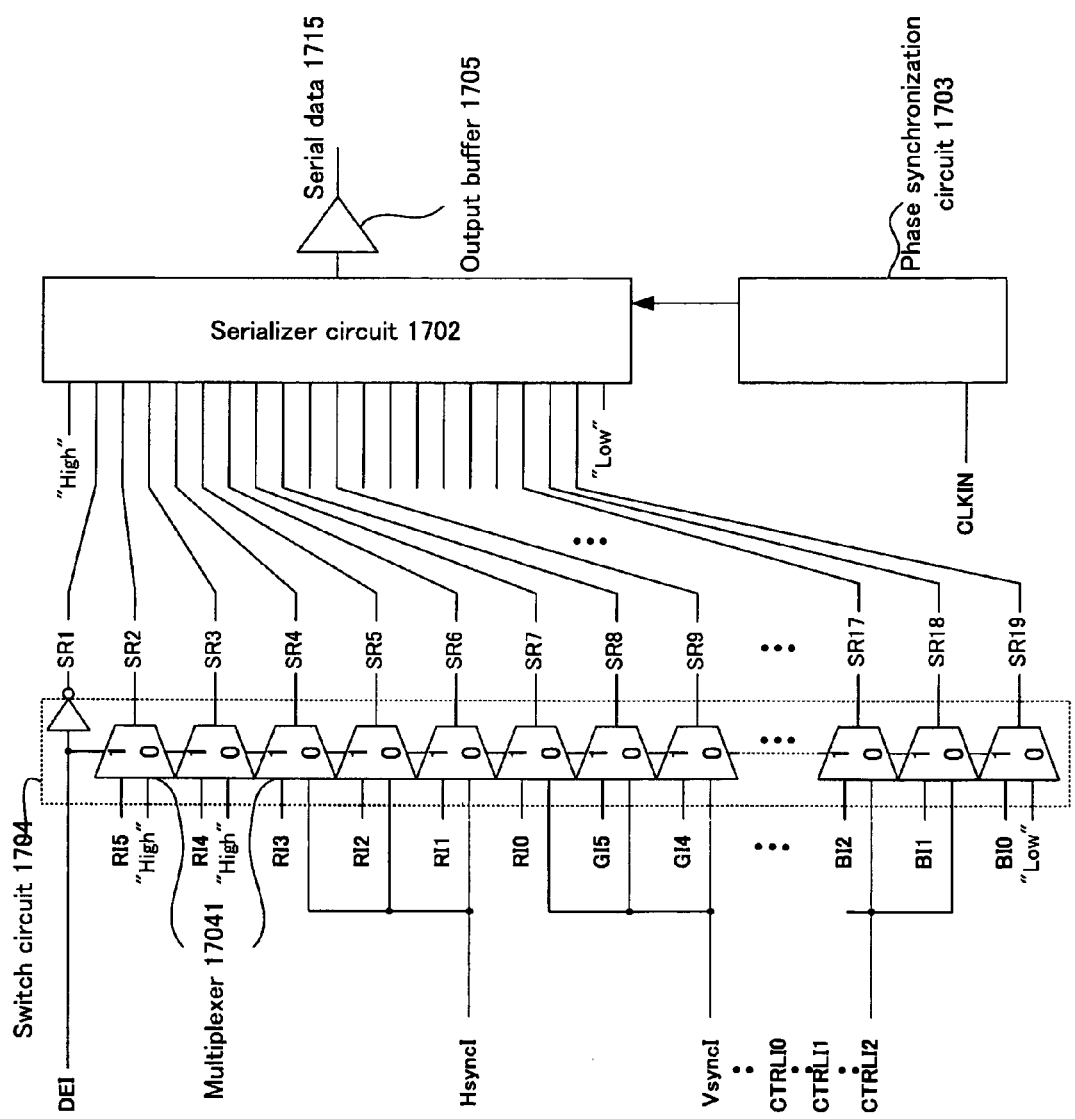
FIG. 61 is a diagram showing a transmitter unit according to one example of the present invention.

Referring to FIG. 61, FIG. 61 shows the configuration of the transmitter unit 1701 of the present example. The input color data 1711 (RI5 to RI0, GI5 to GI0, BI5 to BI0) and the input synchronization data (HsyncI, VsyncI, CTRLI0 to CTRLI2, DEI) are input to the switch circuit 1704. In the present example, the input color data 1711 (RI5 to RI0, GI5 to GI0, BI5 to BI0) are input successively to multiplexers 17041 connected in parallel with one another forming the switch circuit 1704, with "high" being input to the other inputs of the multiplexers 17041 that are receiving RI5 and RI4 of the input color data 1711 and "low" being input to the other input of the multiplexer 17041 that is receiving BI0. HsyncI is input to the other inputs of the multiplexers 17041 that are receiving RI3, RI2 and RI1, VsyncI is input to the other inputs of the multiplexers 17041 that are receiving RI0, GI5 and GI4, and CTRLI0 to CTRLI2 are input to the other input of the multiplexers 17041 that are receiving GI3, GI2 and GI1, those of the multiplexers 17041 that are receiving GI0, BI5 and BI4 and those of the multiplexers 17041 that are receiving BI3, BI2 and BI1, respectively. The switch circuit 1704 outputs the data (SR1 to SR19) to the serial circuit 1702 based on the input DEI, the input color data 1711 and the input synchronization data 1712.

Based on the input clock 1714, the phase synchronization circuit 1703 forms a plurality of clocks of different phases, and outputs them to the serializer circuit 1702.

The serializer circuit 1702 serializes the input data (SR1 to SR19) based on the plurality of clocks of different phases from the phase synchronization circuit 1703 to form the serial data 1715, and outputs the serial data 1715 to the receiver unit 1721 through the output buffer 1705.

Figure 62:
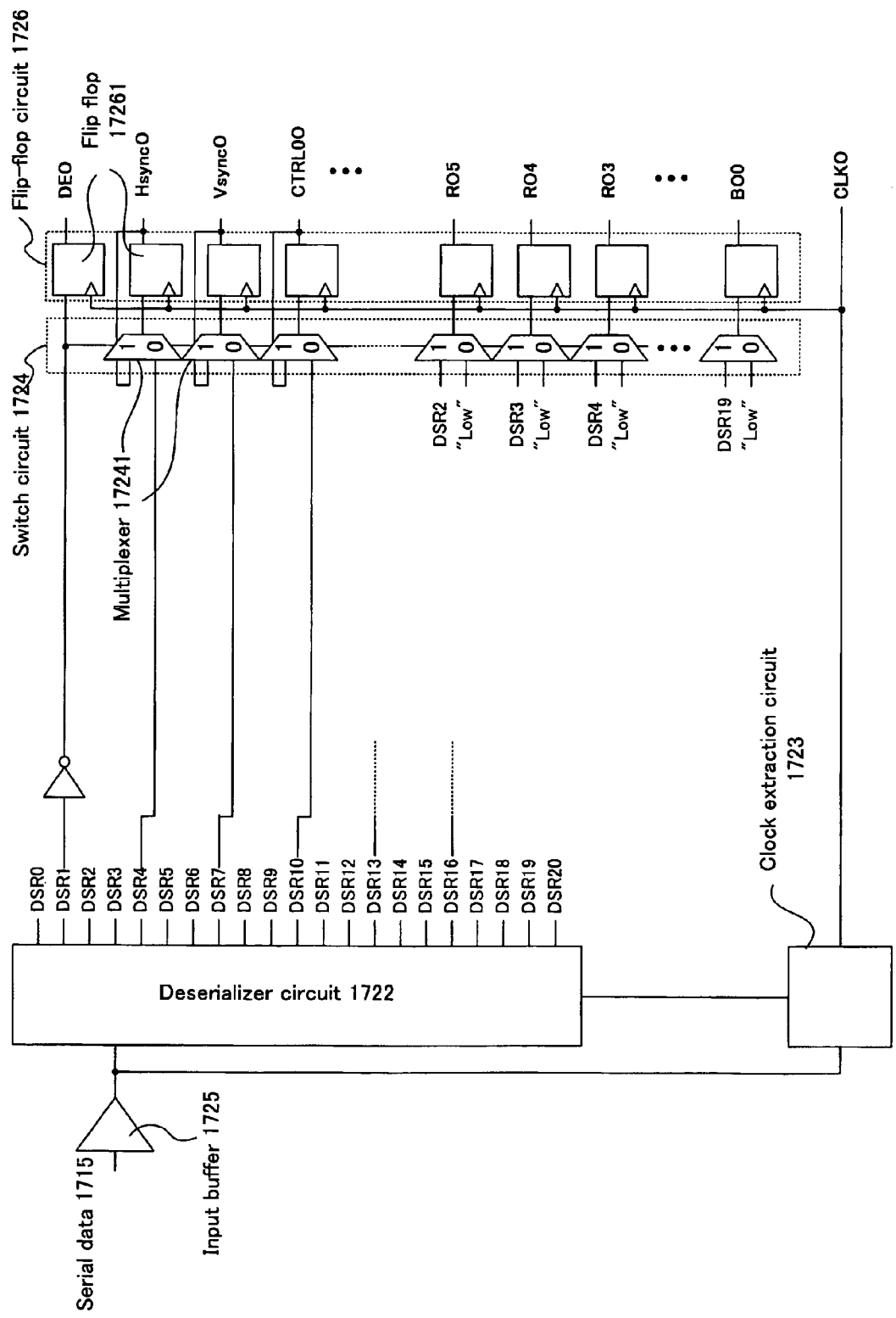
FIG. 62 is a diagram showing a receiver unit according to one example of the present invention.

FIG. 62 shows the configuration of the receiver unit 1721 of the present example. The serial data 1715 output from the transmitter unit 1701 is input to the deserializer circuit 1722 and the clock extraction circuit 1723 through the input buffer 1725. The clock extraction circuit 1723 extracts the clock from the serial data 1715 to recover the output clock 1733 and a plurality of clocks of different phases. The deserializer circuit 1722 deserializes the serial data 1715 based on the plurality of clocks of different phases recovered by the clock extraction circuit 1723, and outputs the output data (DSR0 to DSR20) to the switch circuit 1724. The switch circuit 1724 selectively outputs the data (DSR0 to DSR20) from the deserializer circuit 1722 to a flip-flop circuit 1726 including a plurality of flip-flops 17261. The flip-flop circuit 1726 outputs the output color data 1731 (RO5 to RO0, GO5 to GO0, BO5 to BO0) and the output synchronization data 1732 (HsyncO, VsyncO, CTRLO0 to CTRLO2, DEI).

Thus, the input color data 1711, the input synchronization data 1712 and the input clock 1714, which are input as parallel data, are serialized by the transmitter unit 1701 and then transmitted to the receiver unit. Then, the receiver unit deserializes the received data to recover therefrom the output color data 1731, the output synchronization data 1732 and the output clock 1734.

In the present example, the data enable guard bit (DE grd) is provided following the data enable inverted signal (DEIn), as a result of which the data enable inverted signal (DEIn), which serves as the recovery point when recovering the parallel data from the serial data 1715, is extracted with a higher precision, making it possible to reduce the possibility of sampling errors when sampling the synchronization data, and it is possible to recover the clock with a high precision. In the present example, the stop guard bit (stop grd) is provided following the synchronization data. In this way, it is possible to more accurately extract the next synchronization data, thus increasing the reliability in the transfer of the synchronization data and realizing stable data transfer.

EXAMPLE 10

Example 10 is an alternative example of a data transfer system where an encoder circuit is not used in the transmitter-side unit and a decoder circuit is not used in the receiver-side unit.

Figure 63:
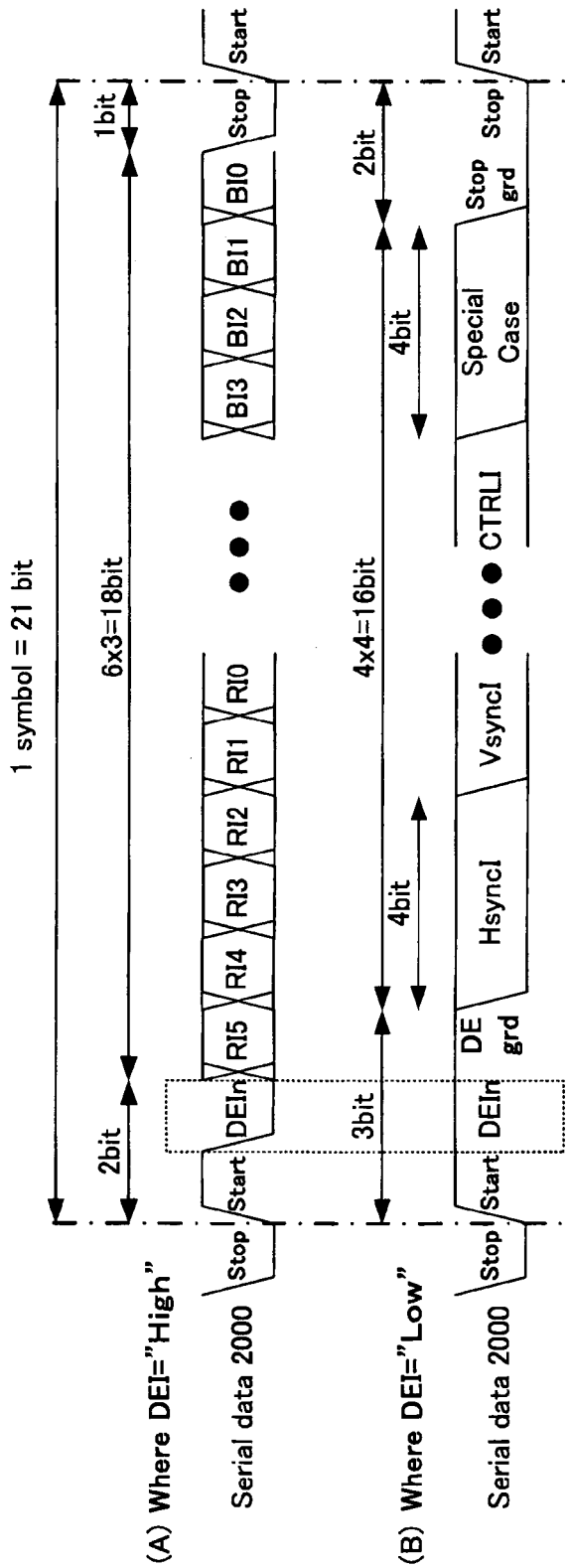
FIG. 63 is a diagram showing serial digital data according to one example of the present invention.

FIG. 63(A) and FIG. 63(B) show examples of signal waveforms of serial data 2000 obtained by serializing, in the receiver-side unit of the present example, color data (RI5 to RI0, GI5 to GI0, BI5 to BI0) having six bits for each color and synchronization data (HsyncI (input horizontal synchronization data), VsyncI (input vertical synchronization data), CTRLI (input control), DEI (input data enable)), which are input as parallel data. Note that one symbol has 21 bits in the present example.

First, while DEI (data enable)="high", i.e., in the active period, one symbol of the serial data 2000 has a data structure that is obtained by serializing the start bit (Start), the data enable inverted signal (DEIn), the color data (RI5, RI4, . . . , BI2, BI1, BI)) and the stop bit (Stop) in this order.

While DEI (data enable)="low", i.e., in the blanking period, one symbol of the serial data 2000 has a data structure obtained by serializing the start bit (Start), the data enable inverted signal (DEIn), the data enable guard bit (DE grd), HsyncI, VsyncI and CTRLI0 to CTRLI2, special case data such as system reset, the stop guard bit (Stop grd) and the stop bit (Stop) in this order.

In the present example, the data enable guard bit (DE grd) is provided following the data enable inverted signal (DEIn). With the provision of the data enable guard bit (DE grd), the data enable inverted signal (DEIn), which serves as the recovery point when recovering the parallel data from the serial data 1715, is extracted with a higher precision, making it possible to reduce the possibility of sampling errors when sampling the synchronization data, and it is possible to recover the clock with a high precision.

In the present example, the stop guard bit (stop grd) is provided following the synchronization data. In this way, it is possible to more accurately extract the next synchronization data, thus increasing the reliability in the transfer of the synchronization data and realizing stable data transfer.

EXAMPLE 11

Example 11 is one form of a clock extraction circuit that may be used in the embodiment described above and in Examples 1 to 5.

Figure 64:
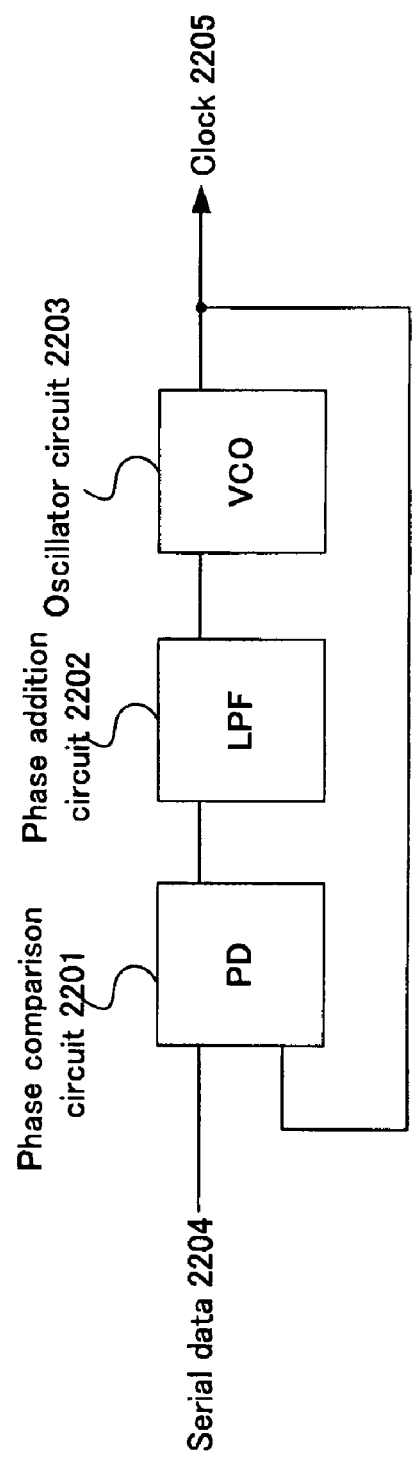
FIG. 64 is a diagram showing a clock extraction circuit according to one example of the present invention.
Figure 65:
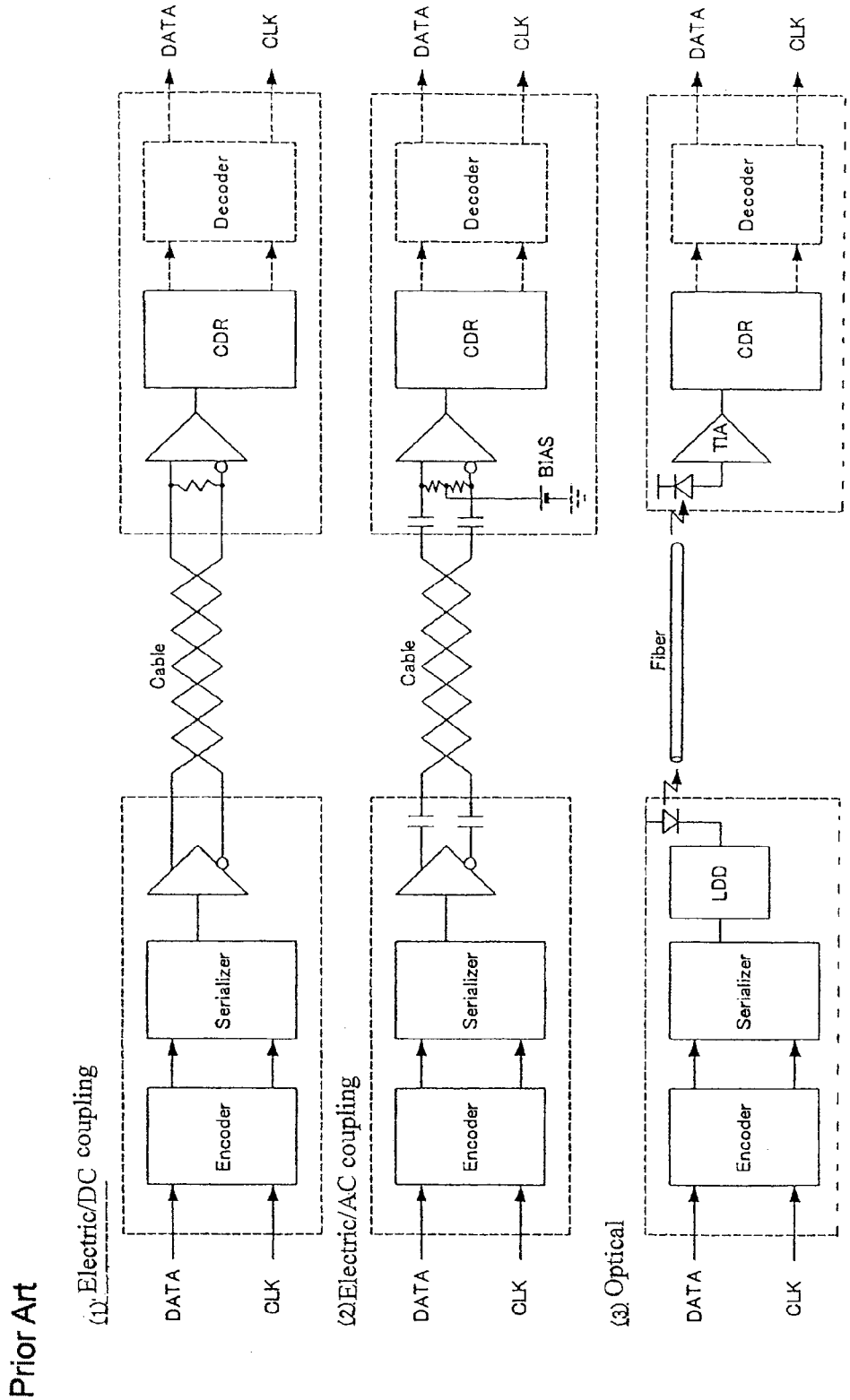
FIG. 65 is a diagram showing exemplary system configurations of serial data transfer systems.
Figure 66:
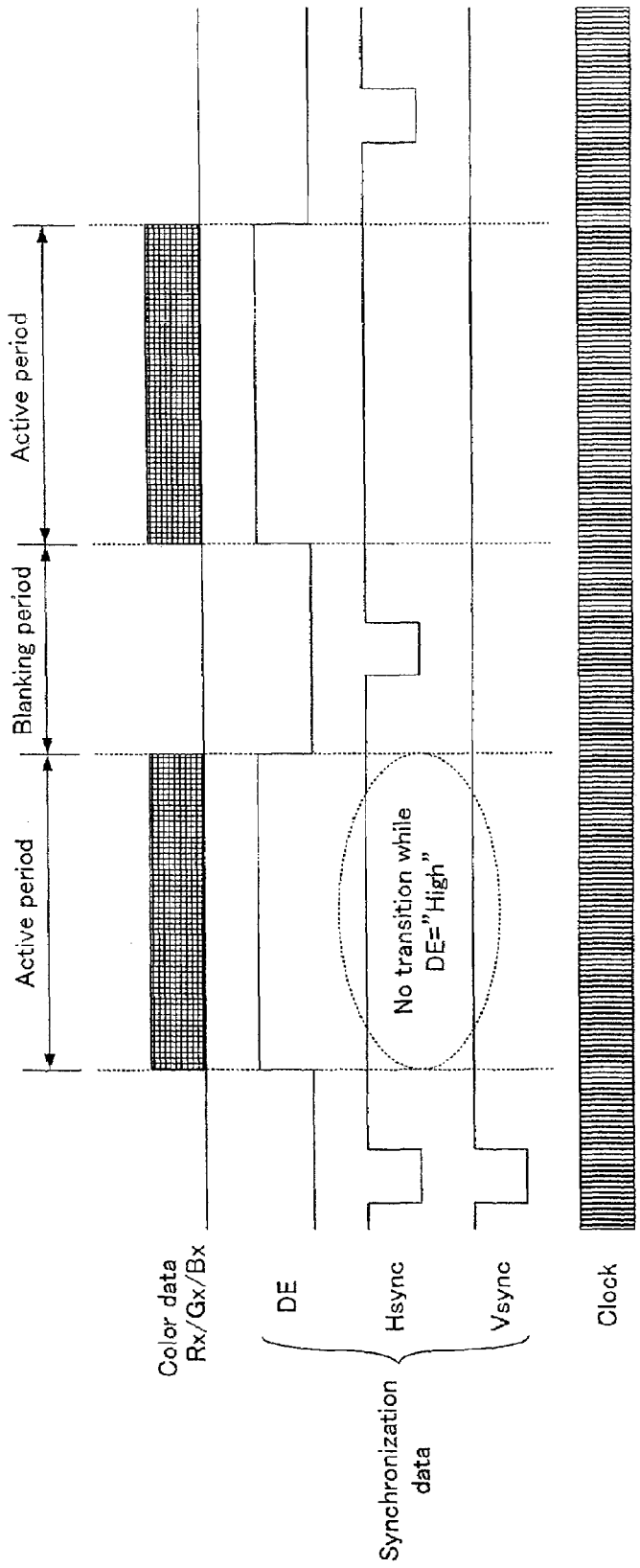
FIG. 66 is a diagram showing a structure of image data used in an active matrix liquid crystal display.
Figure 67:
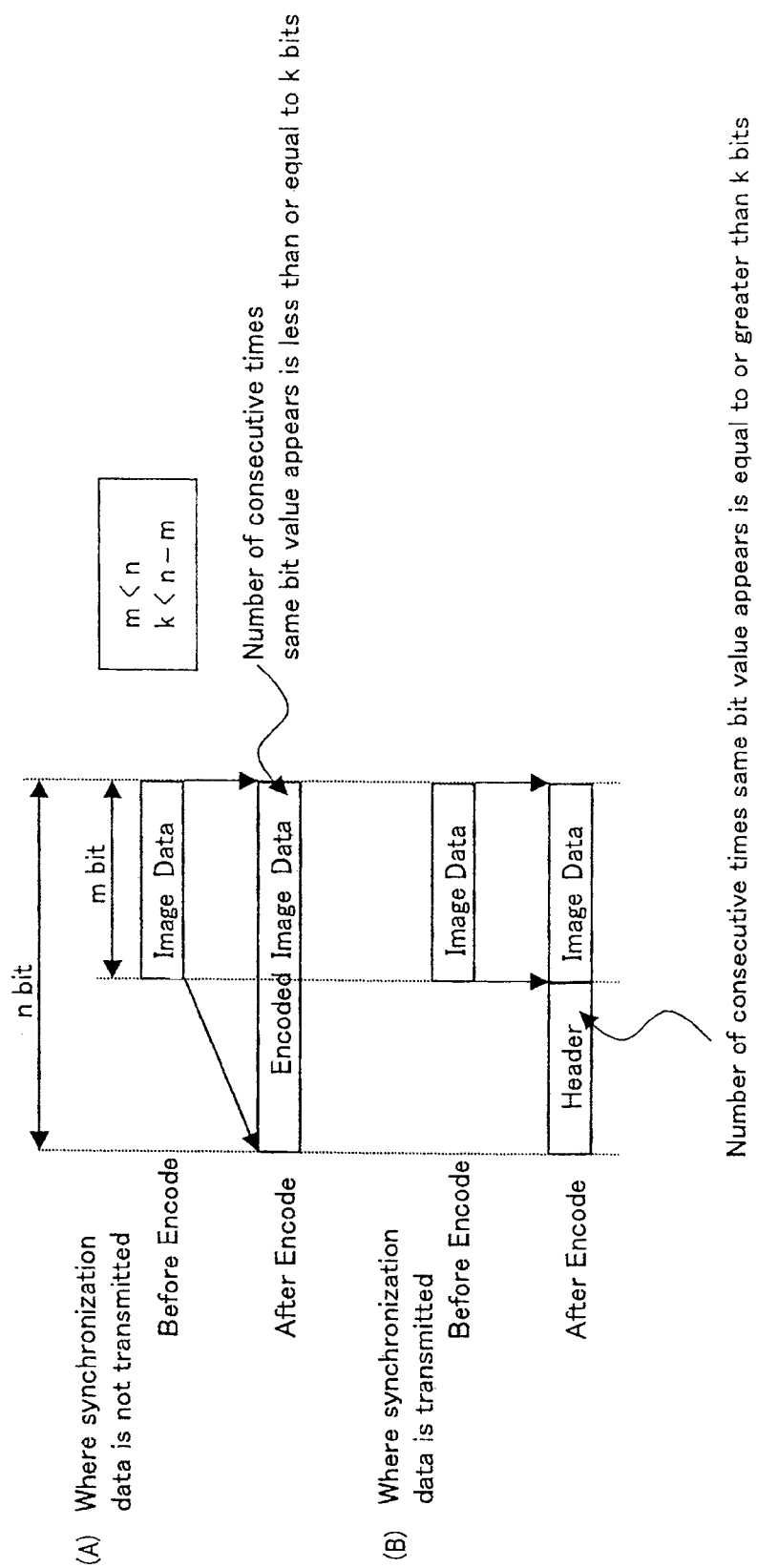
FIG. 67 is a diagram showing a conventional serial transfer of digital data.

FIG. 64 is a circuit block diagram showing the clock extraction circuit. Reference numeral 2201 denotes a phase comparison circuit (PD), reference numeral 2202 denotes a phase addition circuit (LPF), and reference numeral 2203 denotes an oscillator circuit. Serial data 2204 output from the transmitter unit and input to the receiver unit passes through the phase comparison circuit 2201, the phase addition circuit 2202 and the oscillator circuit 2203, where it is subjected to signal processing operations, and the output is fed back to the phase comparison circuit 2201.

INDUSTRIAL APPLICABILITY

The digital data transmitter circuit, the receiver circuit, the encoder, the clock extraction circuit, the digital data transfer method and the system of the present invention are applicable to any devices between which parallel input digital data needs to be transferred. Particularly, the present invention is applicable to the transfer of digital data between a personal computer and an active matrix liquid crystal display or the transfer of digital data between a car navigation device and an active matrix liquid crystal display. While the embodiment and the examples described above are directed to a case where data is transferred in one way between the transmitter-side unit and the receiver-side unit, data may be transferred in two ways. While the embodiment and the examples described above are directed to a case where serial data is transferred over a single wire, serial data may be divided into portions and transferred over a plurality of wires.

The invention claimed is:

1. A digital data transfer method for alternately and periodically transferring first information and second information respectively in a first period and in a second period, wherein:
    an amount of information of the first information per unit time in the first period is greater than an amount of information of the second information per unit time in the second period;
    the first information in the first period is transferred as serial data containing a plurality of first symbols, each first symbol being n times a minimum pulse width, and the second information in the second period is transferred as pulse-width-modulated serial data containing a plurality of second symbols;
    each of the second symbols has only one rising edge at the beginning of the second symbol; and
    the length of each of the first symbols is the same as the length of each of the second symbols.

2. A digital data transfer method according to claim 1, wherein the digital data represents image data and each of the first symbols represents one pixel data of the image data.

3. A transfer method according to claim 1, wherein the serial data is encoded so that the data is DC-balanced.

4. A transfer system for alternately and periodically transferring first information and second information respectively in a first period and in a second period, comprising:
    a second encoder for encoding the second information so that one symbol of serial data obtained by successively serializing the second information will be a pulse-width-modulated signal whose period is n times a minimum pulse width of serial data obtained by serializing the first information;
    a first encoder for encoding the first information so that one symbol of serial data obtained by successively serializing the first information will have a difference from the pulse-width-modulated signal;
    a serializer circuit for converting the encoded first information to the one symbol of serial data, converting the encoded second information to serial data being the one symbol of the pulse-width-modulated signal, and alternately and periodically serializing one-symbol serial data of the first information and one-symbol serial data of the second information;
    a channel for transferring the serialized data;
    a clock extraction circuit for extracting, from the serial data of the first information or the serial data of the second information transferred over the channel, a reference clock in these serial data;
    an information identifying circuit for identifying the serial data of the first information and the serial data of the second information from each other based on the difference between the serial data of the first information and the serial data of the second information;
    a first decoder for decoding the separated serial data of the first information into the first information in a manner corresponding to that of the first encoder; and
    a second decoder for decoding the separated serial data of the second information into the second information in a manner corresponding to that of the second encoder,
    wherein an amount of information of the first information per unit time transferred in the first period is greater than an amount of information of the second information per unit time transferred in the second period.

5. A transfer system for alternately and periodically transferring first information and second information respectively in a first period and in a second period, comprising:
    a second encoder for encoding the second information so that one symbol of serial data obtained by successively serializing the second information will be a pulse-width-modulated signal whose period is n times a minimum pulse width of serial data obtained by serializing the first information;
    a first encoder for encoding the first information so that one symbol of serial data obtained by successively serializing the first information will have a difference from the pulse-width-modulated signal;
    a serializer circuit for converting the encoded first information to the one symbol of serial digital data, converting the encoded second information to serial data being the one symbol of the pulse-width-modulated signal, and alternately and periodically serializing one-symbol serial data of the first information and one-symbol serial data of the second information;
    a channel for transferring the serialized data; and
    a clock extraction circuit for extracting, from the serial data of the first information or the serial data of the second information transferred over the channel, a reference clock in these serial data,
    the clock extraction circuit comprising:
    a phase comparison loop including a voltage control circuit, a phase comparison circuit for comparing a phase of the serial data and that of an output of a voltage-controlled oscillator circuit, and a loop filter for producing a control voltage of the voltage control circuit;
    a sampling circuit for sampling the serial data with a multiphase clock produced by the voltage-controlled oscillator circuit;
    a frequency control circuit for comparing a frequency of the one symbol of serial data with an oscillation frequency of the voltage-controlled oscillator circuit to match the oscillation frequency of the voltage-controlled oscillator circuit with the frequency of the one symbol of serial data, the frequency control circuit including an edge count determination circuit for determining the number of rising edges in a serial signal within a period of the one symbol produced by the voltage-controlled oscillator circuit to be zero, one, or a different number, and a timer for outputting a timer signal at a predetermined time interval, the timer being reset when the number of rising edges is zero or when the frequency control circuit is disabled, wherein the frequency control circuit decreases the oscillation frequency of the voltage-controlled oscillator circuit if the number of rising edges is zero and increases the frequency of the voltage-controlled oscillator circuit if the timer signal is output from the timer;
    a charge pump for receiving an output of the frequency control circuit and outputting a current pulse to the loop filter;

a clock extraction circuit including a mode switching circuit for enabling the frequency control circuit while disabling the phase comparison circuit when receiving a frequency comparison mode request signal from the phase comparison circuit, and for, when it is detected that a situation where the number of rising edges or falling edges is one in one symbol of the serial data has occurred a predetermined number of consecutive times or more, determining that the output frequency of the voltage-controlled oscillator circuit is in a capture range of the phase comparison loop, thereby disabling the frequency control circuit while enabling the phase comparison circuit;

an information identifying circuit for identifying the serial data of the first information and the serial data of the second information from each other based on the difference between the serial data of the first information and the serial data of the second information;

a first decoder for decoding the separated serial data of the first information into the first information in a manner corresponding to that of the first encoder; and a second decoder for decoding the separated serial data of the second information into the second information in a manner corresponding to that of the second encoder.

6. A transmitter circuit for alternately and periodically transferring first information and second information respectively in a first period and in a second period, comprising:

a second encoder for encoding the second information so that each symbol of serial data obtained by successively serializing the second information will be a pulse-width-modulated signal whose period is the same as each symbol of serial data obtained by serializing the first information, and that each symbol will have only one rising edge at the beginning;

a first encoder for encoding the first information so that each symbol of serial data obtained by successively serializing the first information will have a difference from the pulse-width-modulated signal and will have two or more of rising edges; and a serializer circuit for converting the encoded first information to a plurality of symbols of serial data and converting the encoded second information to serial data being a plurality of symbols of the pulse-width-modulated signal.

7. A transmitter circuit according to claim 6, wherein the transmitter circuit transmits image data and each symbol in the first period represents one pixel data of the image data.

8. A transmitter circuit according to claim 6, wherein the rising edge is replaced to falling edge.

9. A transmitter circuit for alternately and periodically transferring first information and second information respectively in a first period and in a second period, comprising:

a second encoder for encoding the second information so that one symbol of serial data obtained by successively serializing the second information will be a pulse-width-modulated signal whose period is n times a minimum pulse width of serial data obtained by serializing the first information;

a first encoder for encoding the first information so that one symbol of serial data obtained by successively serializing the first information will have a difference from the pulse-width-modulated signal; and a serializer circuit for converting the encoded first information to the one symbol of serial data and converting the encoded second information to serial data being the one symbol of the pulse-width-modulated signal, wherein:

the first encoder comprising:
a combined logic circuit having a plurality of input-output correlations; and
a determination circuit for evaluating at least the received input first information and outputting a determination signal based on the evaluation,
wherein the combined logic circuit performs an encoding operation with one of the correlations selected according to the determination signal, and adds an encode bit for identifying the selected correlation to the output.

10. A transmitter circuit according to claim 9, wherein:
the correlations include a first correlation and a second correlation;
the first correlation is such that the input and the output are equal to each other; and
the second correlation is such that the output is obtained by inverting every other 2-bit portion of the input.

11. A transmitter circuit according to claim 10, wherein the determination circuit outputs a determination signal to the combined logic circuit such that the second correlation is selected if the number of rising edges will be zero when the first information is subjected to a simple serial conversion.

12. A transmitter circuit according to claim 11, wherein the rising edge is replaced to falling edge.

13. A transmitter circuit according to claim 10, wherein if the number of rising edges will be one when the first information is subjected to a simple serial conversion and a start bit and a stop bit having different bit values are added respectively at a beginning and at an end of a conversion result, the determination circuit outputs the determination signal to control the combined logic circuit to perform an encoding operation with the second correlation.

14. A transmitter circuit according to claim 13, wherein the rising edge is replaced to falling edge.

15. A transmitter circuit according to claim 9, wherein the determination circuit outputs a determination signal to the combined logic circuit such that one of the plurality of correlations is selected with which the number of consecutive occurrences of the same bit value in the one symbol of encoded serial data is minimized.

16. A transmitter circuit according to claim 9, wherein the determination circuit outputs a determination signal to the combined logic circuit such that one of the plurality of correlations is selected for which the number of consecutive occurrences of the same bit value in the one symbol of encoded serial data is smaller than ½ the number of bits of the one symbol of serial data plus one.

17. A transmitter circuit according to claim 9, wherein the determination circuit outputs a determination signal to the combined logic circuit such that one of the plurality of correlations is selected for which a difference between a total number of occurrences of one data value in encoded data and a total number of occurrences of an opposite data value in the encoded data is minimized.

18. A transmitter circuit according to claim 9, wherein the determination circuit evaluates at least one of a transmission serial digital data clock frequency of a main information, an amount of EMI, an SN ratio or an error rate of the one symbol of serial digital data and the pulse-width-modulated signal, and outputs a determination signal according to the evaluation.

19. A receiver circuit for receiving a serially-transferred signal, comprising:
a clock extraction circuit for extracting, from serial data of the first information or serial data of the second information, a reference clock in these serial data;

an information identifying circuit for identifying the serial data of the first information and the serial data of the second information from each other based on the difference between the serial data of the first information and the serial data of the second information;

a first decoder for decoding the identified serial data of the first information into the first information in a manner corresponding to that of the first encoder; and a second decoder for decoding the separated serial data of the second information into the second information in a manner corresponding to that of the second encoder, wherein the receiver circuit receives a signal obtained by serially transferring, in an alternate and periodic manner, the serial data of the second information and the serial data of the first information, wherein the serial data of the second information is obtained by a serialization operation such that one symbol thereof is a pulse-width-modulated signal whose period is n times a minimum pulse width of one symbol of the serial data of the first information, and the serial data of the first information is obtained by a serialization operation such that one symbol thereof has a difference from the pulse-width-modulated signal.

20. A receiver circuit according to claim 19, wherein the serial data of the first information includes an encode bit for identifying an encoding mode, and the first decoder performs a decoding operation according to the encode bit.

21. A receiver circuit according to claim 19, wherein the information identifying circuit identifies the serial data of the first information and the serial data of the second information from each other based on the number of rising edges within one symbol of the serial data.

22. A receiver circuit according to claim 21, wherein the rising edge is replaced to a falling edge.

23. A receiver circuit, comprising:

a phase comparison loop including a voltage control circuit, a phase comparison circuit for comparing a phase of serial data and that of an output of a voltage-controlled oscillator circuit, and a loop filter for producing a control voltage of the voltage control circuit;

a sampling circuit for sampling the serial data with a multiphase clock produced by the voltage-controlled oscillator circuit;

a frequency control circuit for comparing a frequency of the serial data with an oscillation frequency of the voltage-controlled oscillator circuit to match the oscillation frequency of the voltage-controlled oscillator circuit with the frequency of the serial data, the frequency control circuit including an edge count determination circuit for determining the number of rising edges in serial data within a period of the one symbol produced by the voltage-controlled oscillator circuit to be zero, one, or a different number, and a timer for outputting a timer signal at a predetermined time interval, the timer being reset when the number of rising edges is zero or when the frequency control circuit is disabled, wherein the frequency control circuit decreases the oscillation frequency of the voltage-controlled oscillator circuit if the number of rising edges is zero and increases the frequency of the voltage-controlled oscillator circuit if the timer signal is output from the timer;

a charge pump for receiving an output signal of the frequency control circuit and outputting a current pulse to the loop filter; and a mode switching circuit for enabling the frequency control circuit while disabling the phase comparison circuit when a frequency comparison mode request signal is received from the phase comparison circuit, and for, when it is detected that a situation where the number of rising edges is one has occurred a predetermined number of consecutive times or more, determining that the output frequency of the voltage-controlled oscillator circuit is in a capture range of the phase comparison loop, thereby disabling the frequency control circuit while enabling the phase comparison circuit.

24. A receiver circuit according to claim 23, wherein the edge count determination circuit determines that the number of edges is zero based on a logical product between an output indicating that a result of counting the number of rising edges in the sampled signal is zero and an output indicating that there is no rising edge based on a result of direct determination from the serial data.

25. A receiver circuit according to claim 23, wherein the frequency control circuit places a higher priority on decreasing the oscillation frequency of the voltage-controlled oscillator circuit than on increasing the oscillation frequency of the voltage-controlled oscillator circuit.

26. A receiver circuit according to claim 23, wherein the charge pump is such that a total amount of charge to be charged when an up signal is received from the frequency control circuit is greater than a total amount of charge to be discharged when a down signal is received from the frequency control circuit.

27. A clock extraction circuit for extracting a clock from a serially-transferred signal, wherein the serially-transferred signal is a signal obtained by serially transferring, in an alternate and periodic manner, one symbol of serial digital data obtained by encoding first information and a pulse-width-modulated signal, wherein the pulse-width-modulated signal is obtained by encoding second information so that the encoded data has a difference from the one symbol of serial digital data and by performing pulse width modulation with a period that is n times a pulse width of digital data forming the one symbol of serial digital data so that there is only one rising edge or falling edge within the one symbol, with the rising edge or the falling edge being located at a specified position from a frame edge of the one symbol, the clock extraction circuit comprising:

a voltage-controlled oscillator;

a phase comparator for outputting a phase difference signal according to a phase difference between an input data string and an output signal from the voltage-controlled oscillator;

a frequency comparator for outputting a frequency difference signal according to a frequency difference between the input data string and an output signal from the voltage-controlled oscillator; and a mode switching circuit for selecting the phase difference signal or the frequency difference signal, the frequency difference comparator comprising:

an edge count determination circuit for determining that the number of input data edges is zero or one in one symbol period of the output signal from the voltage-controlled oscillator and outputting an edge count determination signal according to the determination result;

a timer for outputting a timer signal at a predetermined time interval, the timer being reset when the number of edges is zero and the phase difference signal is selected; and a frequency control circuit for controlling an oscillation frequency of the voltage-controlled oscillator based on the edge count determination signal and the timer signal, wherein:

the predetermined time interval of the timer is longer than a time interval at which the subordinate information is transferred;

the frequency control circuit decreases the oscillation frequency of the voltage controlled oscillator if the number of edges is zero, and increases the oscillation frequency of the voltage-controlled oscillator if the timer signal is output;

the mode switching circuit selects the phase difference signal if a determination result that the number of edges is one is obtained a predetermined number of consecutive times; and the oscillation frequency of the voltage-controlled oscillator is controlled based on the phase difference signal or the frequency difference signal selected by the mode switching circuit.

28. A clock extraction circuit according to claim 27, comprising a frequency comparison/fine adjustment circuit, wherein the frequency comparison/fine adjustment circuit calculates an amount of frequency shift between a frequency of an oscillation signal of the oscillator and a frequency based on a period of the rising edge within the one frame, according to an amount of change, from one symbol to another, of a position of the rising edge within one symbol, and outputting a control signal according to the amount of frequency shift to the voltage-controlled oscillator.

29. A clock extraction circuit according to claim 28, wherein the frequency comparison/fine adjustment circuit includes an estimation circuit for estimating a start bit and a stop bit in the one symbol, and derives an amount of frequency shift between the frequency of the oscillation signal of the voltage-controlled oscillator and the frequency based on the period of the rising edge within one symbol, according to an amount of change from one symbol to another in the start bit and the stop bit, and outputting a control signal according to the amount of frequency shift to the voltage-controlled oscillator.

30. A clock extraction circuit according to claim 27, wherein:

the clock extraction circuit includes a sampler circuit for sampling input data and outputting sampled data;

the edge count determination circuit includes an edge detection circuit for detecting presence/absence of an edge in the input data string and outputting edge presence/absence information signal; and the edge count determination circuit determines the number of edges based on the sampled data and the edge presence/absence information signal.

* * * * *